(12) United States Patent
Takahashi et al.

(10) Patent No.: US 8,159,873 B2
(45) Date of Patent: Apr. 17, 2012

(54) SEMICONDUCTOR INTEGRATED CIRCUIT

(75) Inventors: Mitsue Takahashi, Tsukuba (JP);
Shigeki Sakai, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 37 days.

(21) Appl. No.: 12/513,750

(22) PCT Filed: Oct. 29, 2007

(86) PCT No.: PCT/JP2007/071010
§ 371 (c)(1),
(2), (4) Date: Dec. 22, 2009

(87) PCT Pub. No.: WO2008/056559
PCT Pub. Date: May 15, 2008

(65) Prior Publication Data
US 2011/0038201 A1     Feb. 17, 2011

(30) Foreign Application Priority Data
Nov. 7, 2006   (JP) .................................. 2006-301931

(51) Int. Cl.
*G11C 11/34*     (2006.01)
(52) U.S. Cl. ......................................................... 365/182
(58) Field of Classification Search .................... 365/154
See application file for complete search history.

(56) References Cited

U.S. PATENT DOCUMENTS

| | | | |
|---|---|---|---|
| 5,301,151 A | 4/1994 | Wells et al. | |
| 6,314,016 B1 | 11/2001 | Takasu | |
| 7,024,568 B2 * | 4/2006 | Maksimovic et al. | ........ 713/300 |
| 2002/0030204 A1 | 3/2002 | Hirano | |
| 2002/0163841 A1 | 11/2002 | Taura et al. | |
| 2004/0212014 A1 * | 10/2004 | Fujito et al. | ................... 257/355 |

(Continued)

FOREIGN PATENT DOCUMENTS

JP    5-250881    9/1993
(Continued)

*Primary Examiner* — Hoai V Ho
*Assistant Examiner* — Anthan Tran
(74) *Attorney, Agent, or Firm* — Oblon, Spivak, McClelland, Maier & Neustadt, L.L.P.

(57) ABSTRACT

There is provided a semiconductor integrated circuit including a state detection enhancement circuit which includes an input terminal and an output terminal and has a function of generating an electric potential of a magnitude capable of performing nonvolatile memory writing into a nonvolatile memory circuit based on an electric potential input to the input terminal and outputting the electric potential of the magnitude to the output terminal, and the nonvolatile memory circuit has a nonvolatile memory function and an input terminal of the nonvolatile memory circuit is connected to the output of the state detection enhancement circuit. The state detection enhancement circuit is a positive or negative logical state detection enhancement circuit which includes a control signal terminal and a switch circuit which is turned on or off by a control signal applied to the control signal terminal, and has a function of either applying an output potential of the same logical state as or an inverse logical state of an input potential applied to the input terminal to the output terminal or completely breaking off a correlation between the input potential and the output potential when the switch circuit is in an OFF state, and has a function of applying an output potential which has the same logical state as or an inverse logical state of the input potential and has a larger highest-lowest potential range including a possible highest-lowest potential range of the input potential to the output terminal when the switch is in an ON state.

55 Claims, 46 Drawing Sheets

U.S. PATENT DOCUMENTS

| | | | |
|---|---|---|---|
| 2009/0004803 A1* | 1/2009 | Mehrotra et al. | 438/290 |
| 2009/0027947 A1* | 1/2009 | Takeda | 365/156 |

FOREIGN PATENT DOCUMENTS

| | | |
|---|---|---|
| JP | 6 236694 | 8/1994 |
| JP | 10 84274 | 3/1998 |
| JP | 2000 77986 | 3/2000 |
| JP | 2000-77986 | 3/2000 |
| JP | 2000-323671 | 11/2000 |
| JP | 2001-110192 | 4/2001 |
| JP | 2001 160296 | 6/2001 |
| JP | 2001 351393 | 12/2001 |
| JP | 2003 77283 | 3/2003 |
| JP | 2004 128590 | 4/2004 |
| JP | 2004 153446 | 5/2004 |
| JP | 2006-303293 | 11/2006 |
| WO | 2006 115075 | 11/2006 |

* cited by examiner

FIG. 2(c) ELECTRIC CURRENT BETWEEN DRAIN TERMINAL AND SOURCE TERMINAL (LOGARITHM EXPRESSION)

ELECTRIC POTENTIAL DIFFERENCE BETWEEN GATE TERMINAL AND N-TYPE SUBSTRATE TERMINAL

NEGATIVE LOGICAL STATE DETECTION ENHANCEMENT CIRCUIT NA

POSITIVE LOGICAL STATE DETECTION ENHANCEMENT CIRCUIT B OR NEGATIVE LOGICAL STATE DETECTION ENHANCEMENT CIRCUIT NB

WL k : k-TH WORD LINE
SL k : k-TH NONVOLATILE SELECTION LINE
DL m : m-TH DATA LINE
/DM m : COMPLEMENTARY LINE OF DLm

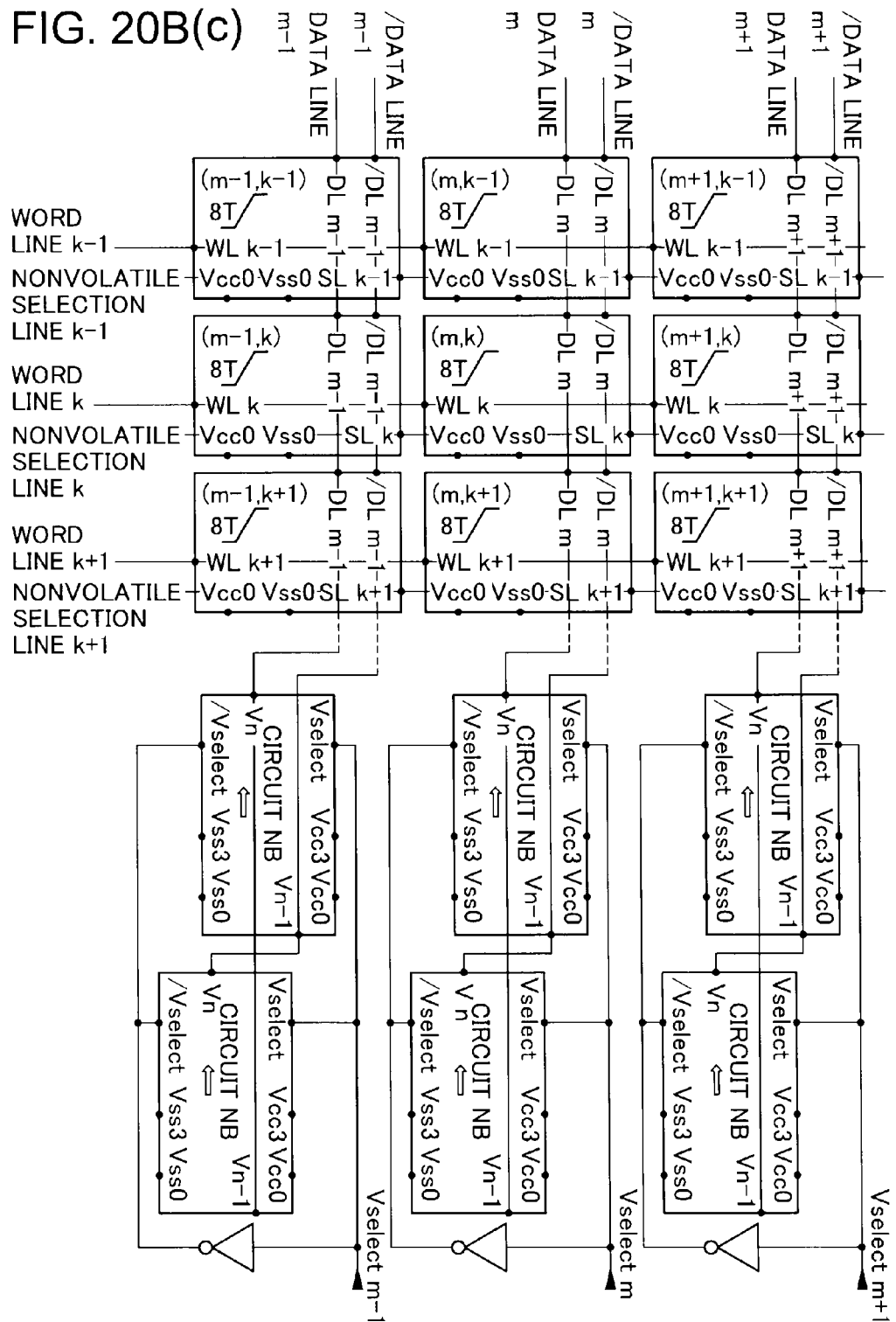

WL k : k-TH WORD LINE
SL k : k-TH NONVOLATILE SELECTION LINE
DL m : m-TH DATA LINE
/DM m : COMPLEMENTARY LINE OF DLm

WL k : k-TH WORD LINE
SL k : k-TH NONVOLATILE SELECTION LINE
DL m : m-TH DATA LINE
/DM m : COMPLEMENTARY LINE OF DLm

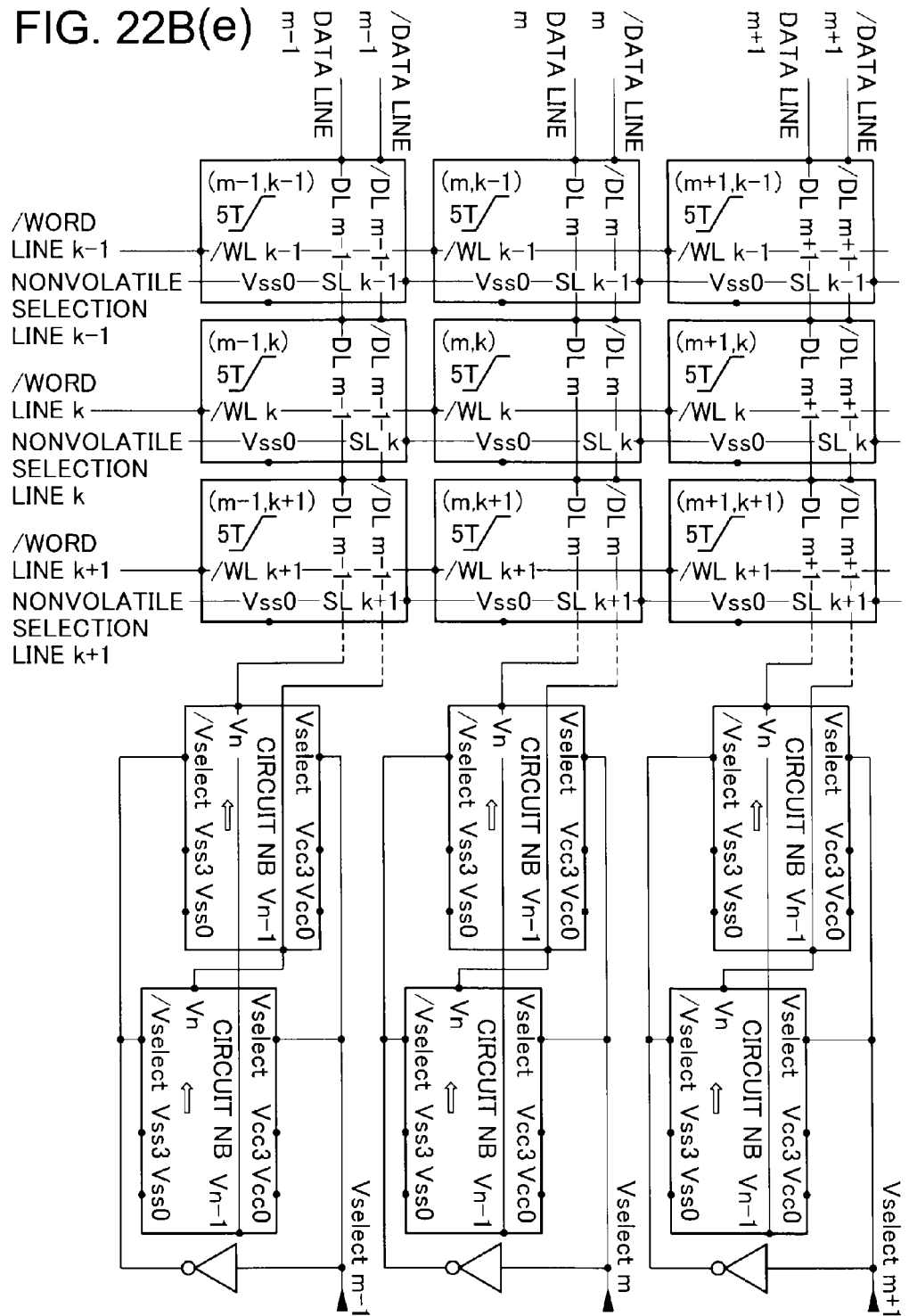

WL k : k-TH WORD LINE
DL m : m-TH DATA LINE
/DM m : COMPLEMENTARY LINE OF DLm

N-CHANNEL NONVOLATILE MEMORY FIELD-EFFECT TRANSISTOR IN WHICH GATE INSULATING STRUCTURE HAS MEMORY HOLDING FUNCTION

P-CHANNEL NONVOLATILE MEMORY FIELD-EFFECT TRANSISTOR IN WHICH GATE INSULATING STRUCTURE HAS MEMORY HOLDING FUNCTION

WL k : k-TH WORD LINE
DLa m : m-TH a DATA LINE
/DMb m : m-TH b DATA LINE

SEMICONDUCTOR INTEGRATED CIRCUIT

TECHNICAL FIELD

The present invention relates to a semiconductor integrated circuit, and more particularly, to a semiconductor integrated circuit which includes either or both of a memory circuit and an operation circuit having a nonvolatile memory field-effect transistor in which a gate insulating structure has a memory holding function. For example, the present invention relates to a semiconductor integrated circuit such as a universal memory, an embedded memory, a central processing unit (CPU), a microprocessor unit (MCU), a micro controller unit (MCU), a microcomputer, an embedded processor, and a universal processor.

BACKGROUND ART

The following semiconductor devices are known as semiconductor devices whose circuits are composed by nonvolatile memory field-effect transistors. Here, "nonvolatile" means that information representing an on-off state of a field-effect transistor does not disappear even when a power source potential becomes zero.

As a first conventional art, a nonvolatile memory cell array configured by arranging a plurality of memory cells of a six-transistor type SRAM, lengthwise and crosswise in a form of a matrix has been suggested: each of the memory cells is constituted by a combination of a complementary inverter latch circuit which includes a total of four field-effect transistors of two n-channel field-effect transistors and two p-channel field-effect transistors in which a ferroelectric layer with a memory holding function is disposed in a gate insulating structure, and two field-effect transistors in which a gate insulating structure does not have a memory holding function of data writing and reading added thereto (for example, see Patent Document 1).

As a second conventional art, a device in which a complementary inverter circuit which includes two field-effect transistors of an n-channel type and a p-channel type in which a ferroelectric layer with a memory holding function is disposed in a gate insulating structure is arranged, and an electric potential of a certain critical node point is stored and held in the complementary inverter circuit in advance during operation of the circuit so that data can be restored rapidly when electric power is abruptly turned off has been suggested (for example, Patent Document 2).

As a third conventional art, a nonvolatile memory sequence circuit which is a latch circuit or a flip-flop circuit which includes a complementary inverter circuit constituted by two field-effect transistors of an n-channel type and a p-channel type in which a ferroelectric layer with a memory holding function is disposed in a gate insulating structure has been suggested (for example, Patent Document 3).

As a fourth conventional art, a nonvolatile memory cell array in which, in order to avoid erroneous writing and reading, using a pair of an n-channel field-effect transistor in which a ferroelectric layer with a memory holding function is disposed in a gate insulating structure and a diode device as a unit of a memory cell, the memory cells are arranged lengthwise and crosswise in the form of a matrix, and a well is separated in a direction perpendicular to a word line, so that a substrate potential can be obtained independently for each column has been suggested (for example, Patent Document 4).

First, problems of the first to third conventional arts will be described below.

The first to third conventional arts attempt to perform nonvolatile memory writing into the complementary circuit in which both the n-channel field-effect transistor and the p-channel field-effect transistor in which the ferroelectric layer is disposed in the gate insulating structure are used in such a way that a connection between gate terminals of the field-effect transistors of the two types is used as an input terminal, and a connection between drain terminals thereof is used an output terminal. In the first to third conventional arts, when memory writing into the complementary circuit is performed, if an input to the gate terminal has a high electric potential (H), an electric potential difference between the gate terminal and the source terminal of the p-channel field-effect transistor of the two field-effect transistors which constitute the complementary circuit becomes 0; while if an input to the gate terminal has high electric potential (H) has a low electric potential (L), an electric potential difference between the gate terminal and the source terminal of the n-channel field-effect transistor becomes 0 V. In a complementary circuit in which a connection between gate terminals of the two field-effect transistors of the n-channel type and the p-channel type, which are not limited to the field-effect transistor in which the ferroelectric layer is disposed in the gate insulating layer, is used as an input terminal, and a connection between drain terminals thereof is used an output terminal, in order to try to improve the efficiency of circuit design, for example, to greatly decrease the number of power source potentials necessary for operation and to decrease the number of power source potential generating circuits and the number of power source wirings, the operation of the complementary circuit is performed in a state in which a source terminal and a substrate terminal of the p-channel field-effect transistor have the same electric potential and a source terminal and a substrate terminal of the n-channel field-effect transistor have the same electric potential. However, in the field-effect transistor in which the ferroelectric layer is disposed in the gate insulating structure, the electric potential of 0 V between the gate terminal and the substrate terminal is too insufficient to perform a proper nonvolatile memory holding operation. Therefore, in the first to third conventional arts, either to accept an insufficient nonvolatile memory state by having a substrate terminal of the n or p-channel field-effect transistor comprising the ferroelectric layer disposed in the gate insulating structure having the same electric potential as a source terminal thereof or to increase the number of power source potentials in order to control an electric potential of the substrate terminal independently of the source terminal has to be selected. In the former case, reliability of the nonvolatile memory state deteriorates, and in the later case, there is a problem in that not only the number of power source potentials is increased, but also there is a problem in that circuit design is inefficient, and the circuit area size increases since it is necessary to prepare a separate well in order to divide a well potential of a circuit which performs a nonvolatile memory operation and a well potential of a circuit which does not perform a nonvolatile memory operation.

The former case will be described in further detail using a case in that a circuit performing a nonvolatile memory operation, that is, a main stage circuit, is a NOT logic circuit shown in FIGS. 3(a) and 3(b) in which two nonvolatile memory field-effect transistors of an n-channel type (FIG. 1) and a p-channel type (FIG. 2) are constituted in a complementary form.

Here, a high potential power source is Vcc1, and a low potential power source is Vss1. Therefore, in FIG. 3(b), Vcc=Vcc1, and Vss=Vss1. When an output of a preceding stage is High, that is, Vcc1, Vcc1 is applied to a gate terminal of the main stage, that is, A2 of FIG. 3(b). At this time, the n-channel nonvolatile memory field-effect transistor n-Tr2 of the main stage circuit is in a state A of FIG. 4(a), and the p-channel nonvolatile memory field-effect transistor p-Tr2 of the main stage circuit is in a state A' of FIG. 4(b). That is, an electric potential difference Vcc1−Vss1 between a gate terminal and a p-type substrate terminal which has an absolute value large sufficiently to write a nonvolatile ON state is applied to n-Tr2, so that an electric current Ids1Na between a gate terminal and a source terminal which has a sufficiently large absolute value flows, while an electric potential difference of Vcc1−Vss1=0 V between a gate and an n-type substrate terminal is applied to p-Tr2, and it does not become a sufficient OFF state and so an electric current Ids1Pb between a drain terminal and a source terminal of FIG. 4(b) flows.

In the next memory holding state, that is, in a state in which both a power source potential of the preceding stage and a power source potential of the main stage become zero, a state B of FIG. 4(a), that is, a channel resistance corresponding to an electric current Ids1Nb between the drain terminal and the source terminal is stored and held in n-Tr2. Meanwhile, the state A' of FIG. 4(b), that is, a channel resistance corresponding to an electric current Ids1Pb between the drain terminal and the source terminal is stored and held in p-Tr2.

Next, when power source potentials Vcc1 and Vss1 of the main stage circuit are restored, that is, when the memory holding state is released, an output terminal B2 of the main stage circuit of FIG. 3(b) outputs any intermediate potential between Vcc1 and Vss1. In the case of Ids1Nb>Ids1Pb, an intermediate potential slightly inclining toward Vss1 is output, so that, of two values of High and Low, a right logical state Low can be barely output to B2, but in the case of Ids1Nb<Ids1Pb, an intermediate potential slightly inclining toward Vcc1 is output, so that a wrong logic state High is output to B2.

Similarly, when an output of the preceding stage is Low, that is, Vss1, Vss1 is input to the gate terminal A2 of the main stage of FIG. 3(b). At this time, n-Tr2 is in the state B of FIG. 4(a), and p-Tr2 is in the state B' of FIG. 4(b). An electric potential difference Vss1−Vcc1 between the gate terminal and the n-type substrate terminal which has an absolute value sufficiently large to write a nonvolatile ON state is applied to p-Tr2, so that an electric current Ids1Pa between the drain terminal and the source terminal which has a sufficiently large absolute value flows, while an electric potential difference of Vss1−Vss1=0 V between the gate terminal and the p-type substrate terminal is applied to n-Tr2, and it does not become a sufficient OFF state, so that an electric current Ids1Nb between the drain terminal and the source terminal of FIG. 4(a) flows.

In the next memory holding state, that is, in a state in which both a power source potential of the preceding stage and a power source potential of the main stage become zero, the state B of FIG. 4(a), that is, a channel resistance corresponding to an electric current Ids1Nb between the drain terminal and the source terminal is stored and held in n-Tr2. Meanwhile, the state A' of FIG. 4(b), that is, a channel resistance corresponding to an electric current Ids1Pb between the drain terminal and the source terminal is stored and held in p-Tr2.

Next, when the power source potentials Vcc1 and Vss1 of the main stage circuit are restored, that is, when the memory holding state is released, the output terminal B2 of the main stage circuit outputs any intermediate potential between Vcc1 and Vss1. In the case of Ids1Nb<Ids1Pb, an intermediate potential slightly inclining toward Vcc1 is output, so that, out of two values of High and Low, a right logical state High can be barely output to B2, but in the case of Ids1Nb>Ids1Pb, an intermediate potential slightly inclining toward Vss1 is output, so that a wrong logic state Low is output to B2. Since the relationship of magnitude of Ids1Nb and Ids1Pb is previously determined according to device characteristics of n-Tr2 and p-Tr2, either of a state in which n-Tr2 is turned on and p-Tr2 is turned off and a state in which n-Tr2 is turned off and p-Tr2 is turned on is wrongly read.

For the foregoing reasons, in the first to third conventional arts, any one of logical states High and Low cannot be properly retained in the output terminal of the complementary nonvolatile memory circuit and thus cannot be read again.

Next, a problem of the fourth conventional art will be described.

In the fourth conventional art, it is difficult to prevent erroneous writing for cells other than a memory cell of a selected crossing point. Random access is commonly performed by selecting one word line which electrically connects gate terminals of nonvolatile memory field-effect transistors which constitute memory cells disposed on the same column of a memory array and one well potential line which electrically connects substrate terminals of nonvolatile memory field-effect transistors disposed on the same row of a direction perpendicular to the word line. When nonvolatilely writing data in a memory cell which includes a nonvolatile memory field-effect transistor, a high electric potential needs to be sufficiently applied between a gate terminal and a substrate terminal of the field-effect transistor. However, in the fourth conventional art, since a high electric potential is equally applied to cells connected to the same word line or cells connected to the same well potential line, in order to prevent erroneous writing for cells other than a memory cell of a selected crossing point, an electric potential which mitigates an electric potential difference between a gate terminal and a substrate terminal of a nonvolatile memory field-effect transistor of a non-selected cell is appropriately applied to all word lines other than a selected word line or all well potential lines other than a selected well potential line. However, when a memory window of a nonvolatile memory field-effect transistor which constitutes a memory cell is not sufficiently large, this method is difficult to perform nonvolatile memory writing for a selected cell while preventing erroneous writing for a non-selected cell.

Patent Document 1: Japanese Patent Application Laid-Open No. 5-250881

Patent Document 2: Japanese Patent Application Laid-Open No. 2000-323671

Patent Document 3: Japanese Patent Application Laid-Open No. 2000-77986

Patent Document 4: Japanese Patent Application Laid-Open No. 2001-110192

DISCLOSURE OF THE INVENTION

Problem which the Invention Tries to Solve

The present invention is devised to resolve the problems of the first to fourth conventional arts. That is, the problems of the first to third conventional arts are resolved by providing a device which is capable of operating a complementary nonvolatile memory circuit constituted by a nonvolatile memory field-effect transistor in which a gate insulating structure has a memory holding function in a state in which each of substrate terminals and a source terminal of the field-effect transistor have the same electric potential, and nonvolatilely storing and reading two logical states of High and Low in the output terminal properly. Also, in the case in which a memory array is configured by using a nonvolatile memory field-effect transistor as a memory cell, the problem of the fourth conventional art is resolved by providing a memory array which has an additional circuit which is capable of preventing erroneous writing the deselected cells by connecting a word line to a gate terminal of an access transistor which is formed to select a cell without connecting a word line directly to a gate terminal of a field-effect transistor and efficiently applying a high electric potential necessary for nonvolatile memory writing between a gate terminal and a substrate terminal of a field-effect transistor of a selected cell.

Further, the conventional circuit comprising either a n-channel field-effect transistor or a p-channel field-effect transistor in which a ferroelectric layer was disposed in a gate insulating structure was also utilized exclusively for a non-volatile memory function. Therefore, a non-memory or a memory circuit which is utilized exclusively for temporal memory and loses the data stored therein when electric power is turned off and a nonvolatile memory circuit had to be provided with separate transistors used for respective purposes. Consequently, the conventional circuit caused the number of transistors to be increased.

Means for Solving the Problems

In order to resolve the above problems, there is provided a semiconductor integrated circuit which includes a state detection enhancement circuit which includes an input terminal and an output terminal and has a function of generating an electric potential of a magnitude capable of performing nonvolatile memory writing into a nonvolatile memory circuit based on an electric potential input to the input terminal and outputting the electric potential of the magnitude to the output terminal, and the nonvolatile memory circuit which has a nonvolatile memory function and is connected to the output of the state detection enhancement circuit.

Preferably, the state detection enhancement circuit is a positive logical state detection enhancement circuit which includes a control signal terminal and a switch circuit which is turned on or off by a control signal applied to the control signal terminal, and has a function of either applying an output potential of the same logical state as an input potential applied to the input terminal to the output terminal or completely breaking off a correlation between the input potential and the output potential when the switch circuit is in an OFF state, and applying an output potential which has the same logical state as the input potential and has a larger highest-lowest potential range including a possible highest-lowest potential range of the input potential to the output terminal when the switch is in an ON state.

Preferably, the state detection enhancement circuit is a negative logical state detection enhancement circuit which comprises a control signal terminal and a switch circuit which is turned on or off by a control signal applied to the control signal terminal, and has a function of either applying an output potential of an inverse logical state of an input potential applied to the input terminal to the output terminal or completely breaking off a correlation between the input potential and the output potential when the switch circuit is in an OFF state, and applying an output potential which has an inverse logical state of the input potential and has a larger highest-lowest potential range including a possible highest-lowest potential range of the input potential to the output terminal when the switch is in an ON state.

Preferably, the nonvolatile memory circuit is constituted by nonvolatile memory field-effect transistors all or some of which have a memory holding function in a gate insulating structure.

Effects of the Invention

According to the present invention, gate insulating layers of field-effect transistors which constitute a nonvolatile memory circuit, a temporal memory circuit which does not have a nonvolatile memory function, and an operation circuit can be manufactured by the same or similar manufacturing process, and after manufactured, a memory circuit and an operation circuit can be electrically switched to a non-memory state, a temporal memory state or a nonvolatile memory state. Therefore, the number of manufacturing processes in which the gate insulating layers are individually formed can be reduced compared to the conventional art. According to the present invention, a layout area necessary for securing an arrangement space to mount field-effect transistors having gate insulating layers made of different materials on a single semiconductor substrate can be reduced.

In a circuit area which is in a standby state in which there is no new input from the outside of the circuit and no computation processing is performed inside the circuit, according to the conventional art, in order to retain data of a temporal memory circuit even in the standby state, since a power source potential of the temporal memory circuit can not set to be zero, electric power is consumed by a static leakage current, while according to the present invention, since the temporal memory circuit can be also used as a nonvolatile memory circuit, a power source potential can become zero while holding data of the temporal memory circuit in the standby state, thereby reducing power consumption caused by the leakage current.

According the conventional circuit having a nonvolatile memory circuit area therein or circuit connected with a nonvolatile memory circuit there inside, necessary data was often evacuated to either an internal nonvolatile memory circuit area or an external nonvolatile memory circuit connected through wirings in order to hold data of the temporal memory circuit even in the standby state and then a power source potential of the temporal memory circuit was set to be zero to evoke the standby state, while according to the present invention, since a power source potential can become zero while holding data of the temporal memory circuit in the standby state, charge and discharge of RC impedance consisting of electrical resistance and electrical capacitance of the wirings according to the evacuation of data of the temporal memory circuit is not required, so that power consumption is reduced.

Also, an operation circuit is commonly constituted by combination of a plurality of simple operation element circuits. In a circuit having a temporal memory circuit which stores an interim computation result in either or both of an input terminal and an output terminal of the simple operation element circuit, according to the conventional art, the standby state is not evoked until all computations inside the circuit are completed even though a new input from the outside of the circuit is stopped, while, according to the present invention, since the temporal memory circuit for storing an interim computation result is used as a nonvolatile memory circuit as it is, all power source potentials of the operation circuit can become zero while holding an interim computation result, and a computation can be resumed from the held interim state without restarting a computation from the beginning by restoring a power source potential when the standby state is released, that is, when operation is resumed. Therefore, when a new input from the outside of the circuit is stopped, the standby state can be evoked without waiting for completion of a computation.

According to the present invention, since the non-memory state, the temporal state and the nonvolatile memory state of the circuit can be electrically switched, if circuit areas which can be simultaneously switched to the standby state are designed to be capable of being individually supplied with the power source potential, the power source potential can become zero flexibly according to a partial function or load of the circuit, so that power consumption can be reduced.

According to the present invention, a circuit constituted by a field-effect transistor of an n-channel type or a p-channel type in which a ferroelectric layer is disposed in a gate insulating structure can be employed in both a non-memory or temporal memory circuit which loses data when electric power is turned off and a nonvolatile memory circuit. Therefore, when a nonvolatile memory function is added to a non-memory or temporal memory circuit which loses data when electric power is turned off, even though a control circuit is added, the number of transistors does not greatly increase.

BRIEF DESCRIPTION OF THE DRAWINGS

FIGS. 2(a), 2(b) and 2(c) illustrate a device structure, a circuit symbol and a relationship of an electric current between a drain terminal and a source terminal and an electric potential difference between a gate terminal and an n-type substrate terminal of a p-channel nonvolatile memory field-effect transistor p-Tr2 in which a gate insulating structure has a memory holding function, respectively;

FIG. 20B(c) illustrates an embodiment in which a gate loop type memory array in which one cell has eight transistors has a nonvolatile memory function according to the present invention;

FIG. 22B(e) illustrates an embodiment in which a gate loop type memory array in which one cell has five transistors has a nonvolatile memory function according to the present invention;

BEST MODE FOR CARRYING OUT THE INVENTION

An important point in a semiconductor integrated circuit according to the present invention is that an additional circuit is provided between an input terminal (an electric potential Vn) of a nonvolatile memory circuit (a main stage circuit) having a nonvolatile memory field-effect transistor in which a gate insulating structure has a memory holding function and an output terminal (an electric potential Vn−1) of a circuit (a preceding stage circuit) which generates an original signal of a signal applied to the input terminal, and the following function is imparted to the additional circuit.

Figure 5:
FIG. 5 illustrates a scheme of the present invention.

That is, a function of generating an electric potential Vn with which nonvolatile memory writing into the main stage circuit can be performed based on the electric potential Vn−1 is imparted to the addition circuit. A scheme of the present invention using the additional circuit having the function, that is, a state detection enhancement circuit, is illustrated in FIG. 5.

The function includes the following two main functions.

One of the two main functions is a function of detecting which one of a high electric potential High and a low electric potential Low the electric potential Vn−1 corresponds to, and generating Vn which is higher than Vn−1 when Vn−1 immediately before nonvolatile memory writing is High or Vn which is lower than Vn−1 when Vn−1 immediately before nonvolatile memory writing is Low when nonvolatile memory writing into the main stage circuit is performed. The state detection enhancement circuit having this function is hereinafter referred to as a positive logical state detection enhancement circuit.

The other of the two main functions is a function of detecting which one of a high electric potential High and a low electric potential Low the electric potential Vn−1 corresponds to, and generating Vn which is lower than Vn−1 of Low when Vn−1 immediately before nonvolatile memory writing is High or Vn which is higher than Vn−1 of High when Vn−1 immediately before nonvolatile memory writing is Low when nonvolatile memory writing into the main stage circuit is performed. The state detection enhancement circuit having this function is hereinafter referred to as a negative logical state detection enhancement circuit.

Embodiments of the present invention using the positive logical state detection enhancement circuit will be described with reference to FIGS. 6A(a), 6B(c), 6B(d), and 6C(e), and embodiments of the present invention using the negative logical state detection enhancement circuit will be described with reference to FIGS. 6A(b), 6B(c), 6B(d), and 6C(e).

An embodiment of the present invention using a positive logical state detection enhancement circuit A will be described below with reference to FIG. 6A(a). The positive logical state detection enhancement circuit A detects a logical state High or Low of an output Vn−1 of a preceding stage circuit, applies power source potentials Vcc0 and Vss0 to the preceding stage circuit regardless of the logical state of Vn−1 when a non-memory operation is performed, and switches a power source potential of the preceding stage circuit from Vcc0 to Vcc3 when Vn−1 is High or the power source potential of the preceding stage circuit from Vss0 to Vss3 when Vn−1 is Low, respectively, through a circuit 1 of the state detection enhancement circuit A when nonvolatile memory writing is performed. Accordingly, the positive logical state detection enhancement circuit A has a function of applying an electric potential of higher High or lower Low in the same logical state as Vn−1 to the input Vn of the main stage circuit.

An embodiment of the present invention using a negative logical state detection enhancement circuit NA will be described below with reference to FIG. 6A(b). The negative logical state detection enhancement circuit NA includes a NOT logic circuit stage therein, detects a logical state High or Low of an output Vn−1 of a preceding stage circuit, applies electric potentials Vcc0 and Vss0 of an inverse logical state of the detected logical state to an input Vn of a main stage circuit when a non-memory operation is performed, and switches a power source potential of the NOT logic circuit stage from Vcc0 to Vcc3 when Vn immediately before the beginning of nonvolatile memory writing is High or the power source potential of the NOT logic circuit stage from Vss0 to Vss3 when Vn immediately before the beginning of nonvolatile memory writing is Low, respectively, through a circuit 2 of the state detection enhancement circuit NA when nonvolatile memory writing is performed. Accordingly, the negative logical state detection enhancement circuit NA has a function of applying an electric potential of higher High or lower Low in the inverse logical state of Vn−1 to the input Vn of the main stage circuit.

An embodiment of the present invention using a positive logical state detection enhancement circuit B will be described below with reference to FIG. 6B(c). The positive logical state detection enhancement circuit B has a function of detecting a logical state High or Low of an output Vn−1 of a preceding stage circuit, transferring an electric potential of the same logical state as Vn−1 to an input Vn of a main stage circuit through a circuit path of a part of a circuit 3 of the state detection enhancement circuit B which has Vcc0 and Vss0 as power source potentials when a non-memory operation is performed, and disconnecting a connection between the output of the preceding stage circuit and the input of the main stage circuit and then applying an electric potential of higher High or lower Low in the same logical state as Vn−1 to the input Vn of the main stage circuit through a circuit path of a different part of the circuit 3 which has Vcc3 and Vss3 as power source potentials when nonvolatile memory writing is performed.

Similarly, an embodiment of the present invention using a negative logical state detection enhancement circuit NB will be described below with reference to FIG. 6B (c). The negative logical state detection enhancement circuit NB has a function of detecting a logical state High or Low of an output Vn−1 of a preceding stage circuit, transferring an electric potential of an inverse logical state of Vn−1 to an input Vn of a main stage circuit through a circuit path of a part of a circuit 3 of the state detection enhancement circuit NB which has Vcc0 and Vss0 as power source potentials when a non-memory operation is performed, and disconnecting a connection between the output of the preceding stage circuit and the input of the main stage circuit and then applying an electric potential of higher High or lower Low in the inverse logical state of Vn−1 to the input Vn of the main stage circuit through a circuit path of a different part of the circuit 3 which has Vcc3 and Vss3 as power source potentials when nonvolatile memory writing is performed.

An embodiment of the present invention using a positive logical state detection enhancement circuit C will be described below with reference to FIG. 6B(d). The positive logical state detection enhancement circuit C has a function of inputting an output of a preceding stage circuit to a circuit 4 thereof to detect a logical state High or Low of Vn−1, transferring an output potential of the same logical state as Vn−1 which is generated through the circuit 4 which has Vcc0 and Vss0 as power source potentials to an input Vn of a main stage circuit when a non-memory operation is performed, and switching the power source potentials of the circuit 4 from Vcc0 to Vcc3 and from Vss0 to Vss3, respectively, to apply an output potential of higher High or lower Low in the same logical state as Vn−1 which is generated through the circuit 4 which has Vcc3 and Vss3 as the power source potentials to the input Vn of the main stage circuit when nonvolatile memory writing is performed.

An embodiment of the present invention using a negative logical state detection enhancement circuit NC will be described below with reference to FIG. 6B(d). The negative logical state detection enhancement circuit NC has a function of inputting an output of a preceding stage circuit to a circuit 4 thereof to detect a logical state High or Low of Vn−1, transferring an output potential of an inverse logical state of Vn−1 which is generated through the circuit 4 which has Vcc0 and Vss0 as power source potentials to an input Vn of a main stage circuit when a non-memory operation is performed, and switching the power source potentials of the circuit 4 from Vcc0 to Vcc3 and from Vss0 to Vss3, respectively, to apply the output potential of higher High or lower Low in the inverse logical state of Vn−1 which is generated through the circuit 4 which has Vcc3 and Vss3 as the power source potentials to the input Vn of the main stage circuit when nonvolatile memory writing is performed.

An embodiment of the present invention using a positive logical state detection enhancement circuit D will be described below with reference to FIG. 6C(e). The positive logical state detection enhancement circuit D has a function of detecting a logical state High or Low of an output Vn−1 of a preceding stage circuit as an input potential, inputting Vn−1 to a circuit 5 thereof which has power source potentials Vcc3 and Vss3 and applying an output potential of higher High or lower Low in the same logical state as Vn−1 which is generated through the circuit 5 to an input Vn of a main stage circuit only when nonvolatile memory writing into a main stage circuit is performed. When nonvolatile memory writing into the main stage circuit is not performed, Vn−1 is not input to the circuit 5.

An embodiment of the present invention using a negative logical state detection enhancement circuit ND will be described below with reference to FIG. 6C(e). The negative logical state detection enhancement circuit ND has a function of detecting a logical state High or Low of an output Vn−1 of a preceding stage circuit as an input potential, inputting Vn−1 to a circuit 5 thereof which has power source potentials Vcc3 and Vss3 and applying an output potential of higher High or lower Low in the inverse logical state of Vn−1 which is generated through the circuit 5 to an input Vn of a main stage circuit only when nonvolatile memory writing into the main stage circuit is performed. When nonvolatile memory writing into the main stage circuit is not performed, Vn−1 is not input to the circuit 5.

The two types of operations of the main stage circuit, that is, a non-memory operation and a nonvolatile memory operation, will be described below. In order to describe in further detail, the same complementary NOT logic circuit as that illustrated in FIGS. 3(*a*) and 3(*b*) which is constituted by one n-channel nonvolatile memory field-effect transistor and one p-channel nonvolatile memory field-effect transistor is used as an example of the main stage circuit, but the main stage circuit is not limited thereto and may be any circuit constituted by either one or both of an n-channel nonvolatile memory field-effect transistor and a p-channel nonvolatile memory field-effect transistor in which a gate insulating structure has a memory holding function. It is assumed that an electric potential of a high potential power source Vcc of the main stage circuit is Vcc0, and an electric potential of a low potential power source Vss thereof is Vss0.

Figure 3A:
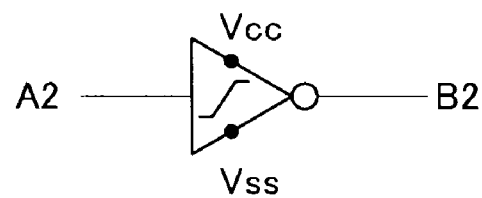
FIGS. 3(a) and 3(b) illustrate a circuit symbol and an equivalent circuit diagram representing a connection of each terminal of a complementary NOT logic circuit which is constituted by two nonvolatile memory field-effect transistors of an n-channel type and a p-channel type in which a gate insulating structure has a memory holding function, respectively.
Figure 3B:
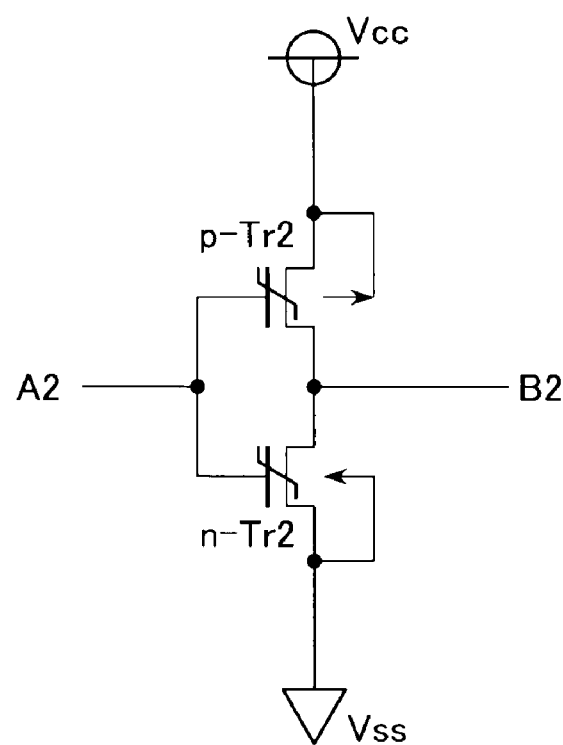
Figure 4A:
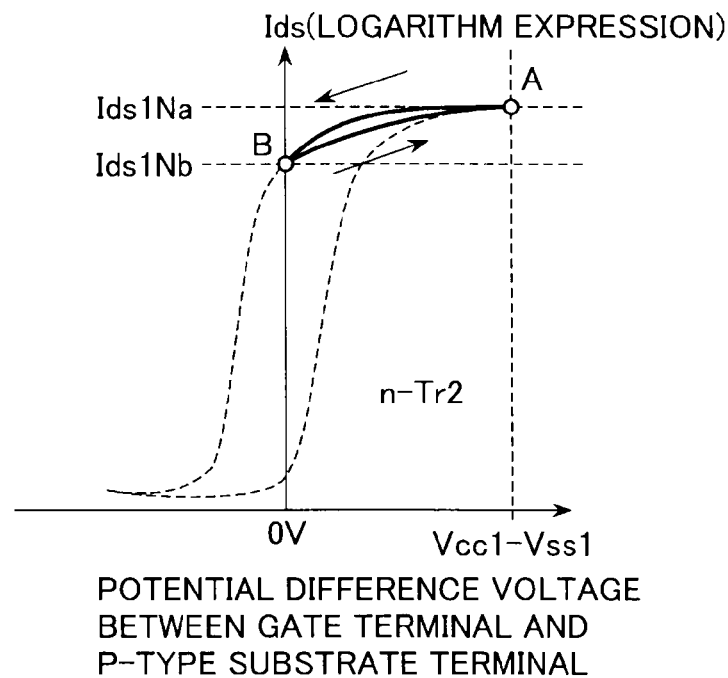
FIGS. 4(a) and 4(b) illustrate relationships of an electric current between a drain terminal and a source terminal and an electric potential difference between a gate terminal and an n- or p-type substrate terminal of n-Tr2 and p-Tr2, respectively, (when a complementary NOT logic circuit constituted by an n-channel nonvolatile memory field-effect transistor n-Tr2 and a p-channel nonvolatile field-effect transistor p-Tr2 in which a gate insulating structure has a memory holding function is used as a main stage circuit, a high voltage side power source voltage of a preceding stage circuit is Vcc1 which is equal to that of the main stage circuit, and a low voltage side power source voltage of the preceding stage circuit is Vcc1 which is equal to that of the main stage circuit)
Figure 4B:
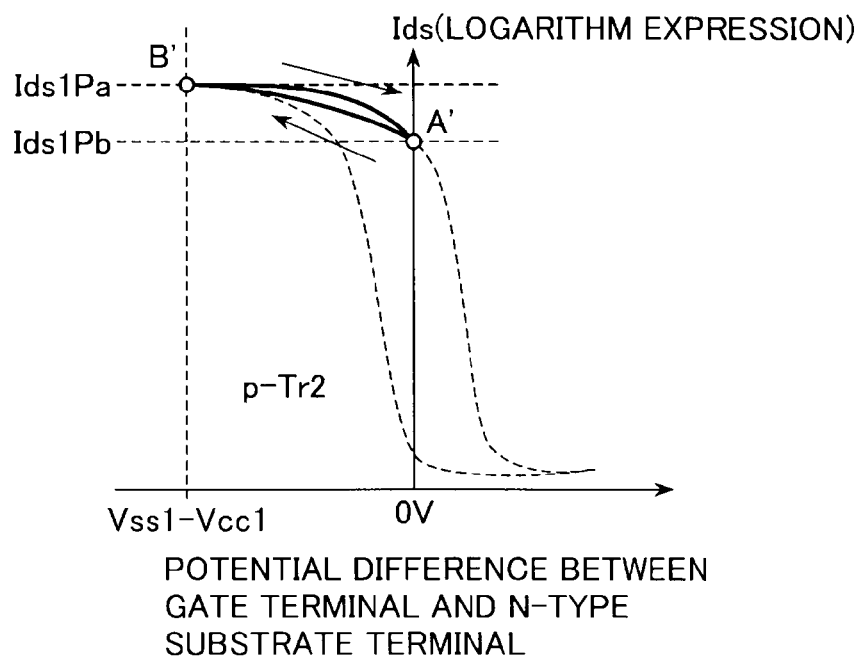

An electric potential applied to the gate terminal of the main stage circuit corresponding to A2 of FIG. 3(a) is an output potential of the positive or negative logical state detection enhancement circuit. An electric potential of the high potential power source of the state detection enhancement circuit is Vcc0 and Vcc3 or Vcc3, and electric potential of the low potential power source of the state detection enhancement circuit is Vss0 and Vss3 or Vss3.

When a non-memory operation is performed in the main stage circuit, if the output potential of the preceding stage circuit is Low and the state detection enhancement circuit is of the negative logical type or if the output potential of the preceding stage circuit is High and the state detection enhancement circuit is of the positive logical type, the same electric potential as Vcc0 is applied to the gate terminal of the main stage circuit. Similarly, if the output potential of the preceding stage circuit is Low and the state detection enhancement circuit is of the positive logical type or if the output potential of the preceding stage circuit is High and the state detection enhancement circuit is of the negative logical type, the same electric potential as Vss0 is applied to the gate terminal of the main stage circuit.

The same electric potential as Vcc0 and the same electric potential as Vss0 may be as low electric potentials as Vcc0 or Vss0 which does not cause nonvolatile memory writing into the main stage circuit depending on a circuit configuration of the state detection enhancement circuit, or an output of the preceding stage circuit may be blocked inside the state detection enhancement circuit, so that an electric potential may not be output to the gate terminal of the main stage circuit. Hereinafter, for simplicity, it is assumed that Vcc0 or Vss0 is applied to the gate terminal of the main stage circuit.

Figure 7A:
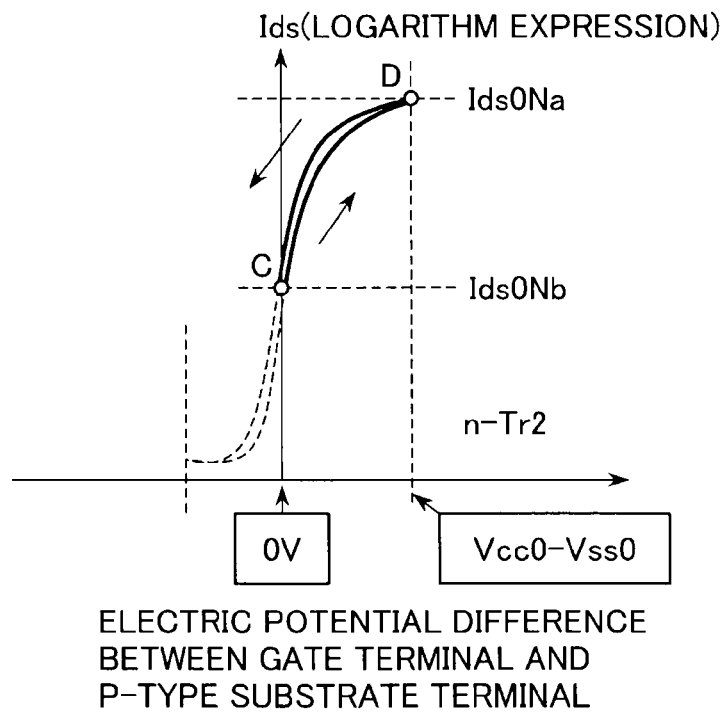
FIGS. 7(a) and 7(b) illustrate relationships of an electric current Ids between a drain terminal and a source terminal and an electric potential difference between a gate terminal and a substrate terminal of n-Tr2 and p-Tr2 when a non-memory operation is performed, respectively.
Figure 7B:
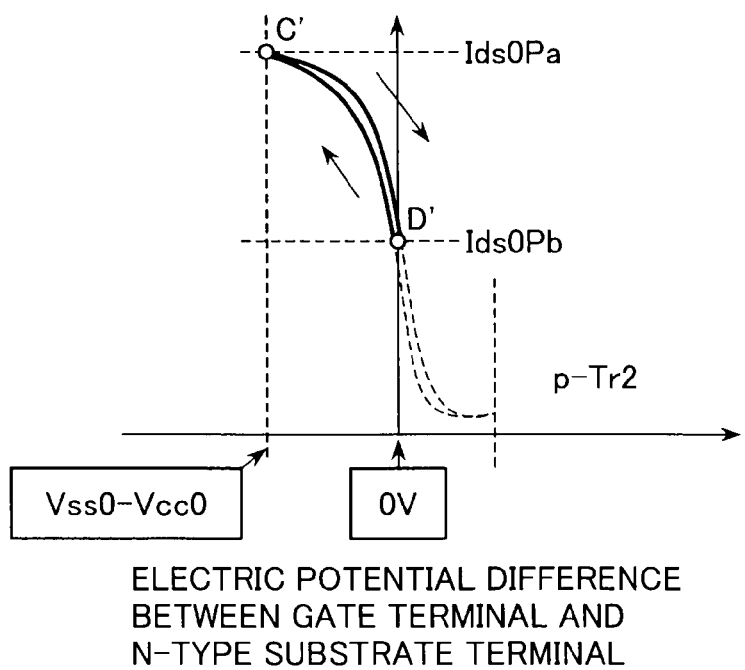

When Vcc0 is applied to the gate terminal of the main stage circuit, the n-channel nonvolatile memory field-effect transistor n-Tr2 of the main stage circuit is in a state D of FIG. 7(a), and the p-channel nonvolatile memory field-effect transistor p-Tr2 of the main stage circuit is in a state D' of FIG. 7(b). That is, an electric potential difference Vcc0−Vss0 between the gate terminal and the p-type substrate terminal which is not large enough to write a nonvolatile ON state is applied to n-Tr2, so that an electric current Ids0Na between the drain terminal and the source terminal which is enough to identify an ON state in a non-memory state flows, while an electric potential difference Vcc0−Vss0=0 V between the gate terminal and the n-type substrate terminal which is not large enough to write a nonvolatile OFF state is applied to p-Tr2, so that an electric current Ids0Pb between the drain terminal and the source terminal which is enough to identify an OFF state in a non-memory state flows.

Next, when both the power source potential of the preceding stage and the power source potential of the main stage become zero, n-Tr2 becomes a state C of FIG. 7(a), and p-Tr2 becomes the state D' of FIG. 7(b), so that it is difficult to identify an ON state and an OFF state of n-Tr2 and p-Tr2.

Next, even though the power source potentials Vcc0 and Vss0 of the main stage circuit are restored, since curves of FIGS. 7(a) and 7(b) have a small hysteresis or does not have a hysteresis at all, a logical state occurring before the power source potential of the main stage becomes zero is not reproduced.

Similarly, when Vss0 is applied to the gate terminal of the main stage circuit, the n-channel nonvolatile memory field-effect transistor n-Tr2 of the main stage circuit is in the state C of FIG. 7(a), and the p-channel nonvolatile memory field-effect transistor p-Tr2 of the main stage circuit is in a state C' of FIG. 7(b). That is, an electric potential difference Vss0−Vss0=0 V between the gate terminal and the p-type substrate terminal which is not small enough to write a nonvolatile OFF state is applied to n-Tr2, so that an electric current Ids0Nb between the drain terminal and the source terminal which is enough to identify an OFF state in a non-memory state flows, while an electric potential difference Vss0−Vcc0 between the gate terminal and the n-type substrate terminal which is not small enough to write a nonvolatile ON state is applied to p-Tr2, so that an electric current Ids0Pa between the drain terminal and the source terminal which is enough to identify an ON state in a non-memory state flows.

Next, when both the power source potential of the preceding stage and the power source potential of the main stage becomes zero, n-Tr2 becomes the state C of FIG. 7(a), and p-Tr2 becomes the state D' of FIG. 7(b), so that it is difficult to identify an ON state and an OFF state of n-Tr2 and p-Tr2.

Next, even though the power source potentials Vcc0 and Vss0 of the main stage circuit are restored, since curves of FIGS. 7(a) and 7(b) have a small hysteresis or does not have a hysteresis at all, a logical state occurring before the power source potential of the main stage becomes zero is not reproduced. The reason that curves of FIGS. 7(a) and 7(b) have a small hysteresis or does not have a hysteresis at all is because both a potential range of an electric potential difference between the gate terminal and the p-type substrate terminal of n-Tr2 and a potential range of an electric potential difference between the gate terminal and the n-type substrate terminal of p-Tr2 are smaller than a potential range necessary to draw a large hysteresis.

When nonvolatile memory writing into the main stage circuit is performed, if the output potential of the preceding stage circuit is Low and the state detection enhancement circuit is of the negative logical type or if the output potential of the preceding stage circuit is High and the state detection enhancement circuit is of the positive logical type, the same electric potential as Vss3 is applied to the gate terminal of the main stage circuit. Similarly, if the output potential of the preceding stage circuit is Low and the state detection enhancement circuit is of the positive logical type or if an output potential of the preceding stage circuit is High and the state detection enhancement circuit is of the negative logical type, the same electric potential as Vss3 is applied to the gate terminal of the main stage circuit.

The same electric potential as Vcc3 and the same electric potential as Vss3 may be as high electric potentials as Vcc3 which can sufficiently cause nonvolatile memory writing into the main stage circuit or as low electric potentials as Vss3 which can sufficiently cause nonvolatile memory writing into the main stage circuit, depending on a circuit configuration of the state detection enhancement circuit. Hereinafter, for simplicity, it is assumed that Vcc3 or Vss3 is applied to the gate terminal of the main stage circuit.

Figure 8A:
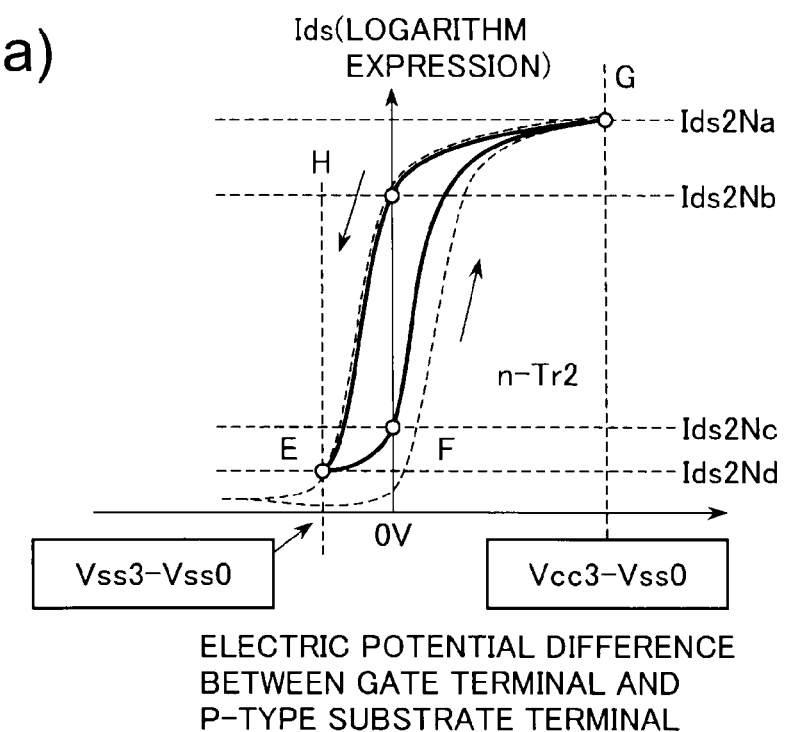
FIGS. 8(a) and 8(b) illustrate relationships of an electric current Ids between a drain terminal and a source terminal and an electric potential difference between a gate terminal and a substrate terminal of n-Tr2 and p-Tr2 when a nonvolatile memory operation is performed, respectively.
Figure 8B:
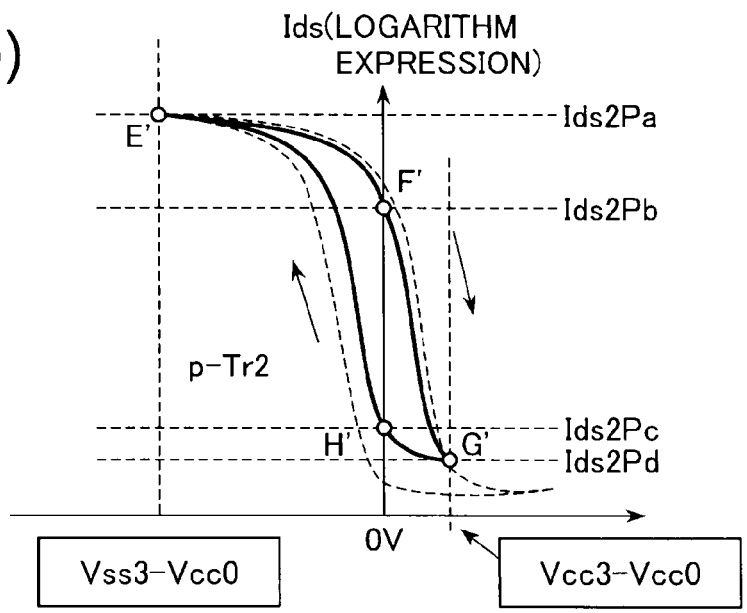

When Vcc3 is applied to the gate terminal of the main stage circuit, the n-channel nonvolatile memory field-effect transistor n-Tr2 of the main stage circuit is in a state G of FIG. 8(a), and the p-channel nonvolatile memory field-effect transistor p-Tr2 of the main stage circuit is in a state G' of FIG. 8(b). That is, an electric potential difference Vcc3−Vss0 between the gate terminal and the p-type substrate terminal which is large enough to write a nonvolatile ON state is applied to n-Tr2, so that an electric current Ids2Na between the drain terminal and the source terminal which represents an ON state flows, while an electric potential difference Vcc3−Vcc0 between the gate terminal and the n-type substrate terminal which is large enough to write a nonvolatile OFF state is applied to p-Tr2, so that an electric current Ids2Pd between the drain terminal and the source terminal which represents an ON state flows.

Next, when both the power source potential of the preceding stage and the power source potential of the main stage become zero, n-Tr2 shifts to a state H of FIG. 8(a) and retains low channel resistance corresponding to an electric current Ids2Nb between the drain terminal and the source terminal which represents an ON state, and p-Tr2 shifts to a state H' of FIG. 8(b) and retains high channel resistance corresponding to an electric current Ids2Pc between the drain terminal and the source terminal which represents an OFF state.

Next, when the power source potentials Vcc0 and Vss0 of the main stage circuit are restored, even though an input potential is not applied to the main stage circuit again, electric potentials from Vcc0 to Vss0 are divided according to a ratio between the low channel resistance of n-Tr2 and the high channel resistance of p-Tr2, and an electric potential which is low enough to identify a logical state as Low is output to the output terminal B2 of the main stage.

Similarly, when Vss3 is applied to the gate terminal of the main stage circuit, the n-channel nonvolatile memory field-effect transistor n-Tr2 of the main stage circuit is in a state E of FIG. 8(a), and the p-channel nonvolatile memory field-effect transistor p-Tr2 of the main stage circuit is in a state E' of FIG. 8(b). That is, an electric potential difference Vss3−Vss0 between the gate terminal and the p-type substrate terminal which is small enough to write a nonvolatile OFF state is applied to n-Tr2, so that an electric current Ids2Nd between the drain terminal and the source terminal which represents an OFF state flows, while an electric potential difference Vss3−Vcc0 between the gate terminal and the n-type substrate terminal which is small enough to write a nonvolatile ON state is applied to p-Tr2, so that an electric current Ids2Pa between the drain terminal and the source terminal which represents an ON state flows.

Next, when both the power source potential of the preceding stage and the power source potential of the main stage become zero, n-Tr2 shifts to a state F of FIG. 8(a) and retains high channel resistance corresponding to an electric current Ids2Nc between the drain terminal and the source terminal which represents an ON state, and p-Tr2 shifts to a state F' of FIG. 8(b) and retains low channel resistance corresponding to an electric current Ids2Pb between the drain terminal and the source terminal which represents an OFF state.

Next, when the power source potentials Vcc0 and Vss0 of the main stage circuit are restored, electric potentials from Vcc0 to Vss0 are divided according to a ratio between the high channel resistance of n-Tr2 and the low channel resistance of p-Tr2, and an electric potential which is high enough to identify a logical state as High is output to the output terminal B2 of the main stage.

As described above, the main stage circuit draws the hysteresis curves in which an electric current Ids between the drain terminal and the source terminal is sufficiently large relative to an electric potential between the gate terminal and the substrate terminal as illustrated in FIGS. 8(a) and 8(b) and thus can perform a nonvolatile memory operation. The reason that curves of FIGS. 8(a) and 8(b) draw a sufficiently large hysteresis is because both a potential range of an electric potential difference between the gate terminal and the p-type substrate terminal of n-Tr2 and a potential range of an electric potential difference between the gate terminal and the n-type substrate terminal of p-Tr2 are potential ranges enough to draw a large hysteresis.

The relationships of magnitude of an electric potential difference 0 V or Vcc0−Vss0 between the gate terminal and the p-type substrate terminal of n-Tr2 when a non-memory operation is performed, an electric potential difference Vss3−Vss0 or Vcc3−Vss0 between the gate terminal and the p-type substrate terminal of n-Tr2 when nonvolatile memory writing is performed, an electric potential difference 0 V or Vss0−Vcc0 between the gate terminal and the n-type substrate terminal of p-Tr2 when a non-memory is performed, and an electric potential difference Vss3−Vcc0 or Vcc3−Vcc0 between the gate terminal and the n-type substrate terminal of p-Tr2 when nonvolatile memory writing is performed is Vss3−Vss0<0 V<Vcc0−Vss0<Vcc3−Vss0, Vss3−Vcc0<Vss0−Vcc0<0 V<Vcc3−Vcc0, and |Vcc0−Vss0|<|Vss3−Vss0|, |Vcc3−Vcc0|.

A threshold value of n-Tr2 is appropriately adjusted so that Ids0Na, Ids2Na and Ids2Nb can become large enough to determine that n-Tr2 is in an ON state, and Ids0Nb, Ids2Nc and Ids2Nd can become small enough to determine that n-Tr2 is in an OFF state.

A threshold value of p-Tr2 is appropriately adjusted so that Ids0Pa, Ids2Pa and Ids2Pb can become large enough to determine that p-Tr2 is in an ON state, and Ids0Pb, Ids2Pc and Ids2Pd can become small enough to determine that p-Tr2 is in an OFF state.

One method for appropriately adjusting the threshold values of n-Tr2 and p-Tr2 includes, for example, changing all or some of materials of layers which constitute a stacked structure of n-Tr2 or p-Tr2, that is, an upper gate electrode layer, a gate insulating structure layer (which may have a single layer structure or a multi-layer structure) having a memory holding function, and a semiconductor layer. Another method for appropriately adjusting the threshold values of n-Tr2 and p-Tr2 includes, for example, interfusing an impurity element into all or some of the layers which constitute the stacked structure of n-Tr2 or p-Tr2 to change physical characteristics. As the impurity element, a non-metallic element such as N, P and B may be used, but a metallic element may be also used.

Figure 1A:
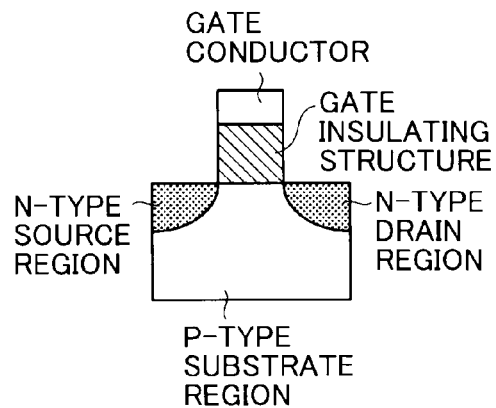
FIGS. 1(a), 1(b) and 1(c) illustrate a device structure, a circuit symbol and a relationship of an electric current between a drain terminal and a source terminal and an electric potential difference between a gate terminal and a p-type substrate terminal of an n-channel nonvolatile memory field-effect transistor n-Tr2 in which a gate insulating structure has a memory holding function, respectively.
Figure 1B:
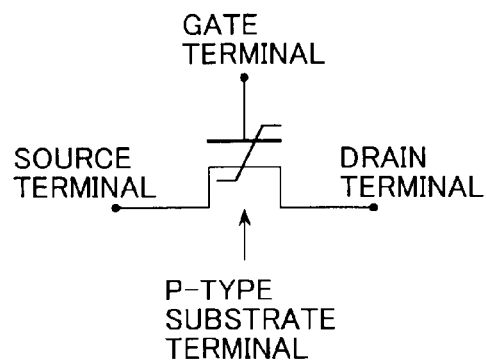
Figure 1C:
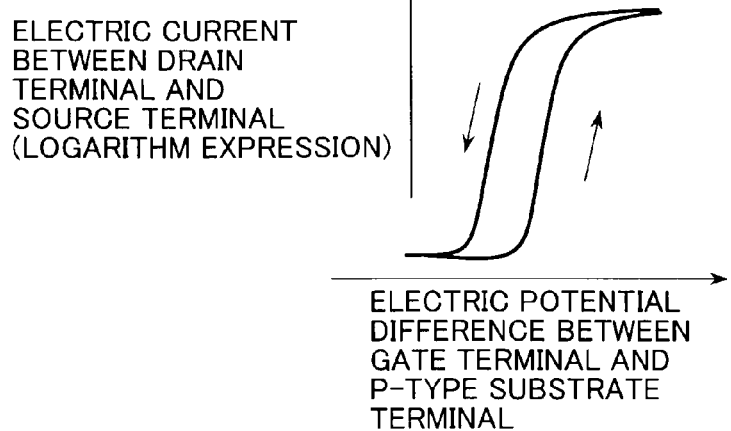
Figure 2A:
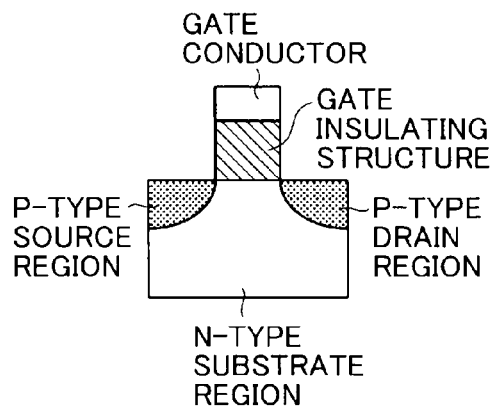
Figure 2B:
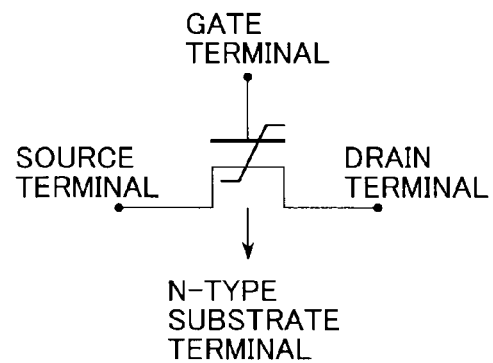
Figure 2B:
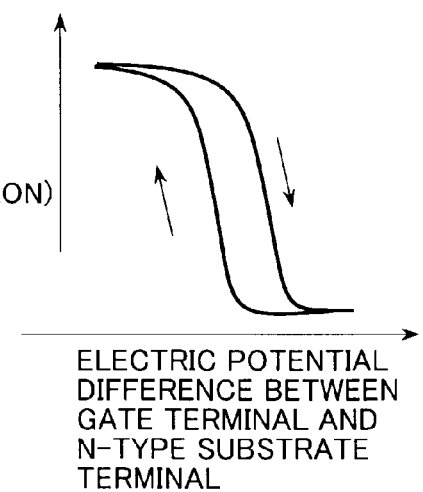

In order to concretely implement the present invention, a ferroelectric gate FET may be advantageously used as a nonvolatile memory field-effect transistor in which a gate insulating structure has a memory holding function, but the present invention is not intended to limit the transistor to a ferroelectric gate FET. The nonvolatile memory field-effect transistor of the present invention includes any n-channel field-effect transistor in which a curve representing a relationship of an electric current between the drain terminal and the source terminal and an electric potential difference between the gate terminal and the p-type substrate terminal when an electric potential difference between the gate terminal and the p-type substrate terminal rises is different from that when an electric potential difference between the gate terminal and the p-type substrate terminal falls as shown in FIG. 1(c), or any p-channel field-effect transistor in which a curve representing a relationship between an electric current between the drain terminal and the source terminal and an electric potential difference between the gate terminal and the n-type substrate terminal when an electric potential difference between the gate terminal and the n-type substrate terminal rises is different from that when an electric potential difference between the gate terminal and the n-type substrate terminal falls as shown in FIG. 2(c). That is, the nonvolatile memory field-effect transistor of the present invention is a field-effect transistor which nonvolatilely stores channel resistances different in magnitude according to the magnitudes including rising and falling or positive and negative polarities of the electric potential between the gate terminal and the substrate terminal.

As an example of the nonvolatile memory field-effect transistor, in the case of a field-effect transistor in which a gate insulating layer has a stack of either ferroelectric layers or any one combination of a ferroelectric layer, a metallic layer, and an insulating layer, that is, in which a ferroelectric is included in a gate insulating structure, channel resistances different in magnitude according to a magnitude of the electric potential difference between the gate terminal and the substrate terminal is nonvolatilely stored by relating two different electric polarization directions of a ferroelectric layer to a magnitude of the electric potential difference between the gate terminal and the substrate terminal and storing them, and changing a surface potential of a semiconductor layer according to different electric polarization directions.

As another example, in the case of a field-effect transistor in which the gate insulating structure has a stack of either ferromagnetic layers or any one combination of a ferromagnetic layer, a paramagnetic layer, and an anti-ferromagnetic layer, that is, in which a ferromagnetic layer is included in the gate insulating structure, channel resistances different in magnitude according to a magnitude of the electric potential difference between the gate terminal and the substrate terminal is nonvolatilely stored by relating two different magnetic polarization directions of a ferromagnetic layer to a magnitude of the electric potential difference between the gate terminal and the substrate terminal and storing them, and changing a surface potential of a semiconductor layer according to different magnetic polarization directions.

As still another example, in the case of a field-effect transistor in which the gate insulating structure has a stack of an insulating layer, a charge trap insulating layer and an insulating layer or an insulating layer, a metallic layer and an insulating layer, that is, in which a stacked structure forming a well-type potential is included in the gate insulating structure, channel resistances different in magnitude according to a magnitude of the electric potential difference between the gate terminal and the substrate terminal is nonvolatilely stored by relating two states of electric charge trapping into the well-type potential and electric charge discharging from the well-type potential to a magnitude of the electric potential difference between the gate terminal and the substrate terminal and storing them, and changing a surface potential of a semiconductor layer according to the two states.

In order to implement the present invention, the positive or negative logical state detection enhancement circuit is connected to the input terminal of the main stage circuit. Embodiments (FIG. 6A(a), FIGS. 6B(c) and 6B(d) and FIG. 6C(e)) of the present invention using four kinds of the positive logical state detection enhancement circuits according to different operation principles and embodiments (FIG. 6A(b), FIGS. 6B(c) and 6B(d) and FIG. 6C (e)) of the present invention using four kinds of the negative logical state detection enhancement circuits will be described below in detail focusing on operation principles and concrete circuit examples.

Four direct current (DC) power source potentials Vss3, Vss0, Vcc0, and Vcc3 or two DC power source potentials Vcc3 and Vss3 are externally supplied to the state detection enhancement circuit, and electric potentials of signals V select and /V select which are in a complementary relationship to each other or an electric potential of one of the two signals are supplied as control signals for switching the circuit to a non-memory operation or a temporal memory operation and a nonvolatile memory operation. The power source potentials are in a relationship of magnitude of Vss3<Vss0<Vcc0<Vcc3, and can be set to 0 V in the standby state. As a power source of the main stage circuit, a high potential power source which is lower than Vcc3 and a low voltage power source which is higher than Vss3 are preferably used, and, in a most simple manner, Vcc0 and Vss0 may be used. V select and /V select are in a complementary relationship, and when any one of V select and V/selection is externally applied, the other may be internally generated. For example, a NOT logic circuit may be provided inside a circuit, and an output obtained by inputting V select to the NOT logic circuit may be used as /V select. The main stage circuit is constituted by nonvolatile memory field-effect transistors of either or both of an n-channel type and a p-channel type in which a gate insulating structure has a memory holding function. Circuits other than the main stage circuit may be constituted by nonvolatile field-effect transistors in which a gate insulating structure has a memory holding function, but the circuits may also be constituted by typical field-effect transistors which do not have a memory holding function in a gate insulating structure and perform only a non-memory operation. In the case of the n-channel field-effect transistor which constitutes the main stage circuit and has a memory holding function in a gate insulating structure, when an electric potential equal to or more than 0 V and equal to or less than Vcc0–Vss0 is applied between the gate terminal and the p-type substrate terminal, a channel resistance changes to the extent that an ON and an OFF can be identified, but sufficient nonvolatile memory writing cannot be performed by using it. In the case of the p-channel field-effect transistor which constitutes the main stage circuit and has a memory holding function in a gate insulating structure, when an electric potential equal to or more than Vss0–Vcc0 and equal to or less than 0 V is applied between the gate terminal and the n-type substrate terminal, a channel resistance changes to the extent that an ON and an OFF can be identified, but sufficient nonvolatile memory writing cannot be performed by using it.

Figure 6A:
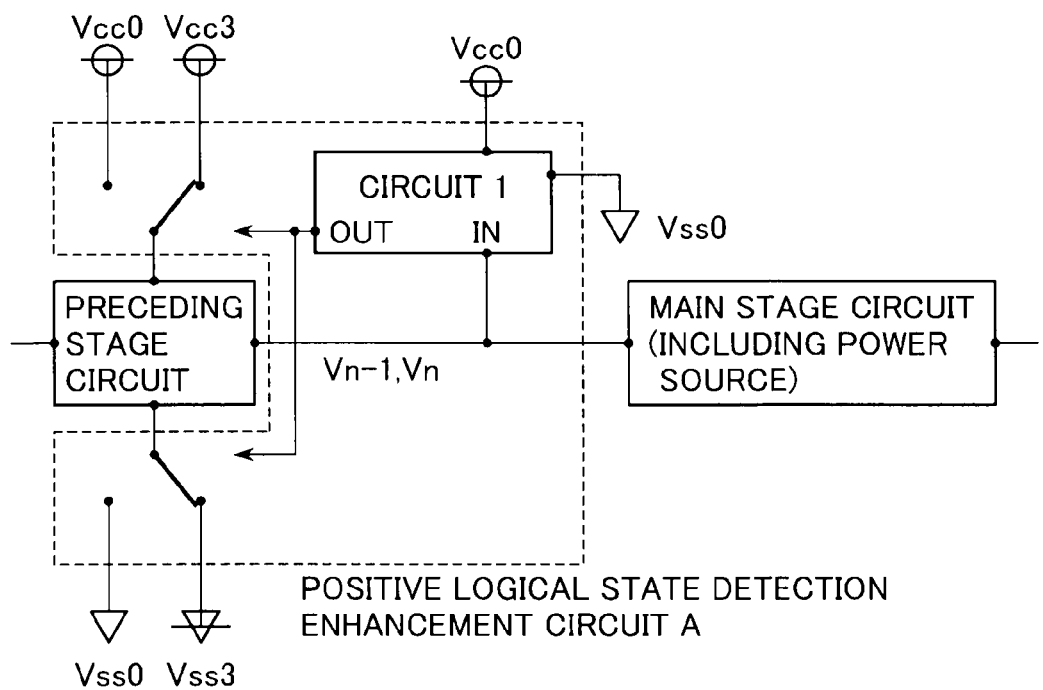
FIGS. 6A(a) and 6A(b) illustrate embodiments of the present invention.
Figure 6A:
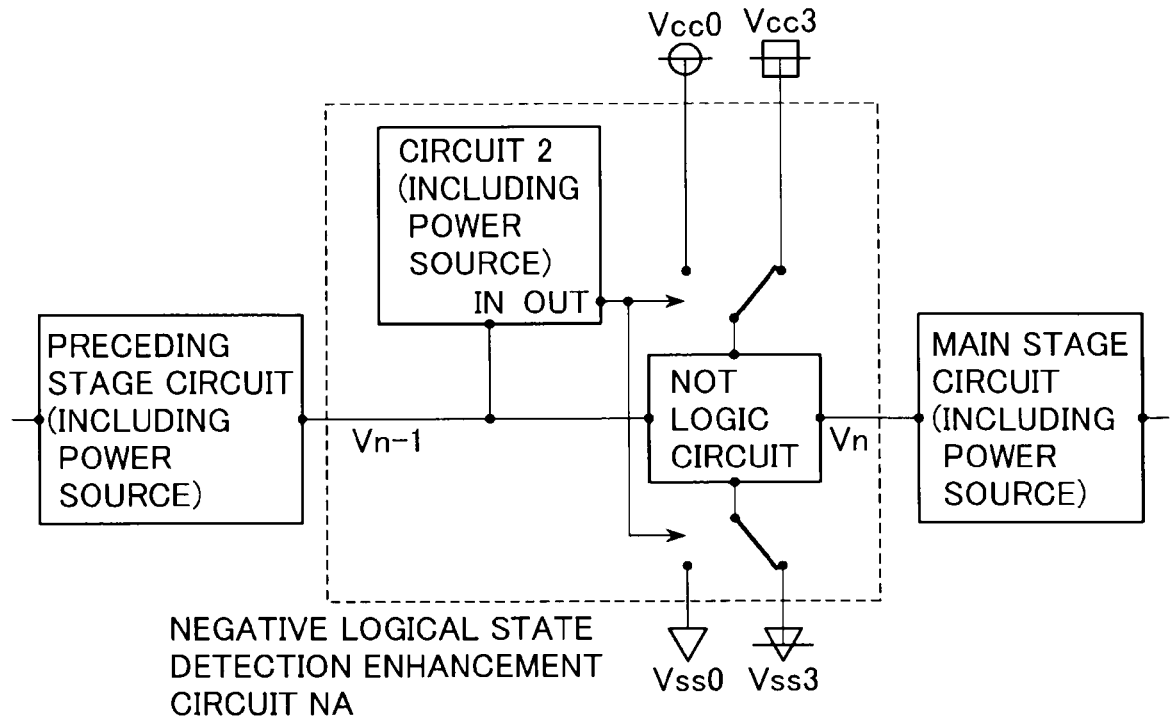
Figure 9A:
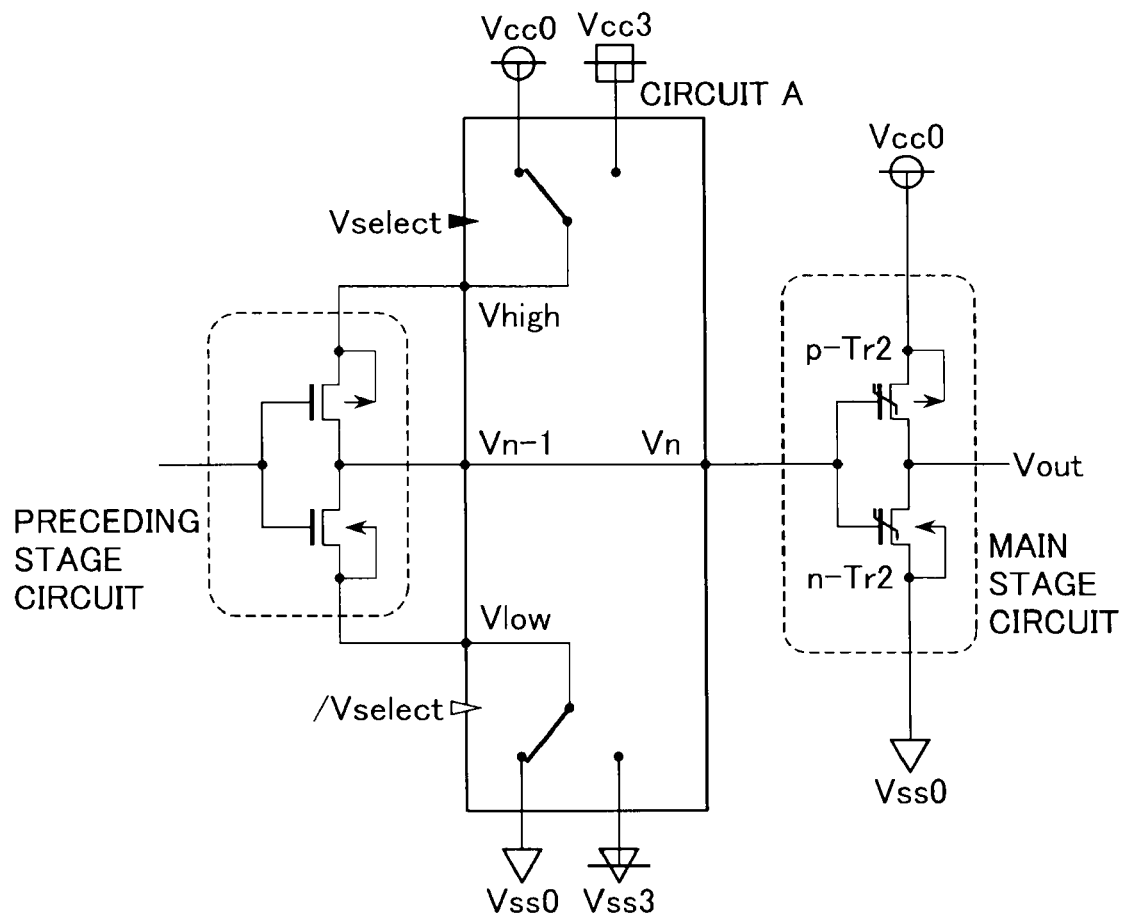
FIGS. 9A(a) and 9A(b) illustrate one embodiment of the present invention when Vn−1 and Vn have the same logical state and a symbol of a circuit A, respectively.
Figure 9A:
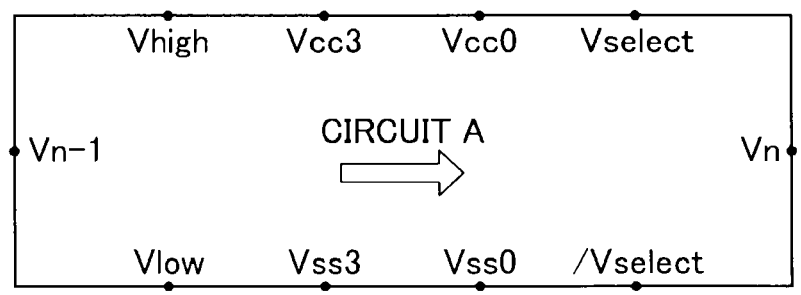

FIG. 9A(a) illustrates an operation principle of one embodiment (FIG. 6A(a)) of the present invention. The feature is that nonvolatile memory writing into a nonvolatile memory circuit can be performed with a high degree of certainty by switching a power source potential of the preceding stage circuit through the positive logical state detection enhancement circuit A using a control signal in a state in which an output terminal of the preceding stage circuit is connected to an input terminal of the main stage circuit. Here, for simplicity, both the preceding stage circuit and the main stage circuit include a NOT logic circuit constituted by complementary field-effect transistors but may include any other logical circuit instead of a NOT logic circuit.

Figure 10A:
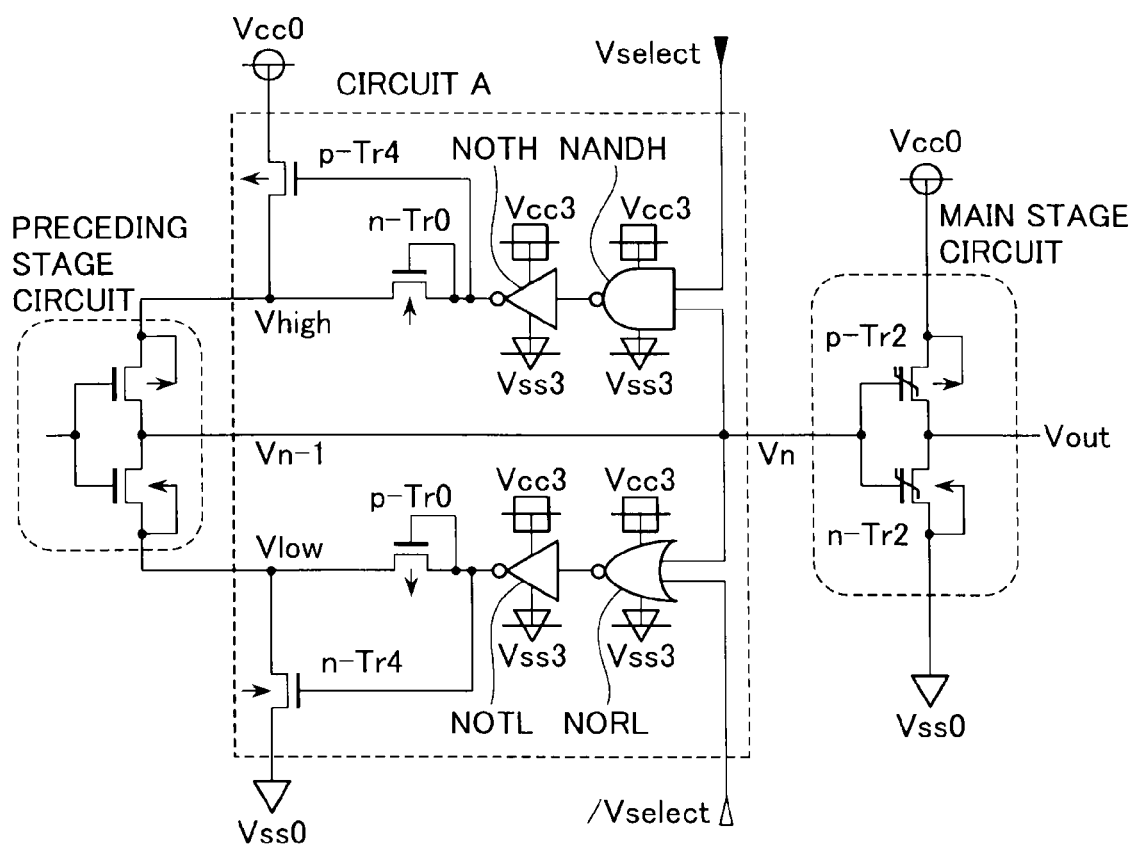
FIGS. 10(a) and 10(b) illustrate one embodiment of a concrete circuit of FIG. 9(a) and one embodiment of a concrete circuit of FIG. 9(c), respectively.

FIG. 10A(a) illustrates one embodiment of a concrete circuit of FIG. 9A(a). NOTH and NOTL denote one-input NOT logic circuits, NANDH denotes a two-input NAND logical circuit, and NORL denotes a two-input NOR logical circuit. A low potential side power source of NOTH may be Vss0 instead of Vss3. A high potential side power source of the circuit NOTL may be Vcc0 instead of Vcc3. If an ON or OFF state which can be sufficiently identified can be applied to NOTH and NOTL of the next stage, power sources of NANDH and NORL may be Vcc0 and Vss0 instead of Ncc3 and Vss3. A combination (n-Tr4, /V select) of n-Tr4 and a gate input /V select thereof and a combination (p-Tr4, V select) of p-Tr4 and V select may be replaced with each other or a combination of n-channel and p-channel field-effect transistors may be replaced with a transmission gate which is opened or closed by complementary signal inputs.

Operation of the circuit of FIG. 10(a) will be described below.

When V select is Low, that is, when /V select is High, since both n-Tr0 and p-Tr0 are turned off and both n-Tr4 and p-Tr4 are turned on regardless of whether the logical state of Vn−1 is High or Low, an output Vn−1 of the preceding stage circuit is an electric potential Vcc0 or Vss0 which is determined by an input logical state of the preceding stage circuit and is also equal to Vn. Since an electric potential equal to or more than 0 V and equal to or less than Vcc0−Vss0 is applied between the gate terminal and the p-type substrate terminal of n-Tr2 of the main stage circuit, a channel resistance changes to the extent that an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an OFF and an ON can be identified, but sufficient nonvolatile memory writing cannot be performed using it. That is, the main stage circuit also handles a data non-memory computation operation like the preceding stage circuit.

When V select changes to High, that is, when /V select changes to Low, both n-Tr0 and p-Tr0 are turned on, both n-Tr4 and p-Tr4 are turned off, an electric potential which is higher than Vcc0 is applied to a node point V high of a high potential power source side of the preceding stage circuit even though an electric potential change corresponding to a threshold potential of n-Tr0 is considered, and an electric potential which is lower than Vss0 is applied to the node point V low of a low potential power source side of the preceding stage circuit even though an electric potential change corresponding to a threshold potential of p-Tr0 is considered. At this time, an electric potential of the node point V high becomes closer to Vcc3 as a threshold value of n-Tr0 is closer to 0 V, and an electric potential of a node point V low becomes closer to Vss3 as a threshold value of p-Tr0 is closer to 0 V. Hereinafter, for simplicity, it is assumed that threshold values of n-Tr0 and p-Tr0 are 0 V. A threshold value may be adjusted according to a condition change of a manufacturing process of a transistor. If a logical state of Vn is High immediately before V select becomes High, since Vn rises from Vcc0 to Vcc3 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Similarly, if a logical state of Vn is Low immediately before V select becomes High, since Vn falls from Vss0 to Vss3 by changing V select to High, the electric potential difference between the gate terminal and the p-type substrate terminal of n-Tr2 of the main stage circuit becomes Vss3−Vss0, so that a nonvolatile OFF state is sufficiently written, and the electric potential difference between the gate terminal and the n-type substrate terminal of p-Tr2 becomes Vss3−Vcc0, so that a nonvolatile ON state is sufficiently written. Therefore, the main stage circuit nonvolatilely stores the same logical state as that occurring immediately before V select changes to High.

Next, all power source potentials become zero. Even though all power source potentials become zero, a unit of memory to which one of n-Tr2 and p-Tr2 of the main stage circuit is turned on or which one of n-Tr2 and p-Tr2 of the main stage circuit is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials Vcc0, Vss0, Vcc3, and Vss3 to the positive logical state detection enhancement circuit A.

Figure 6B:
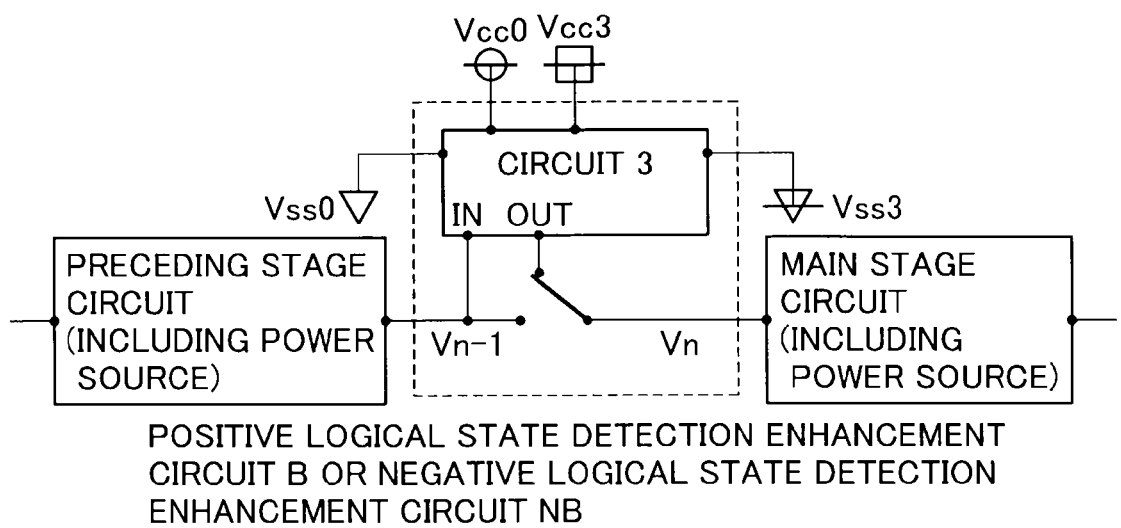
FIGS. 6B(c) and 6B(d) illustrate embodiments of the present invention.
Figure 6B:
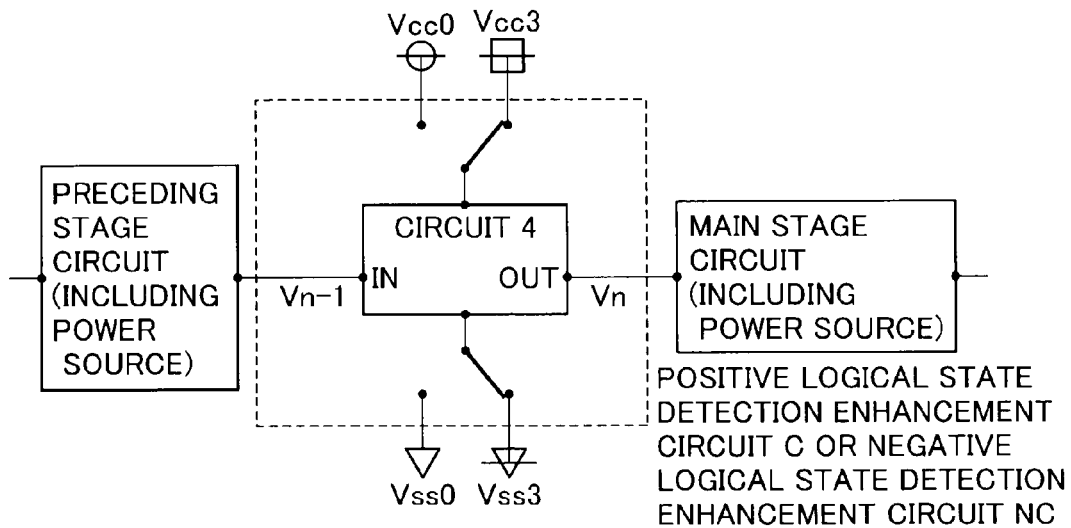
Figure 9B:
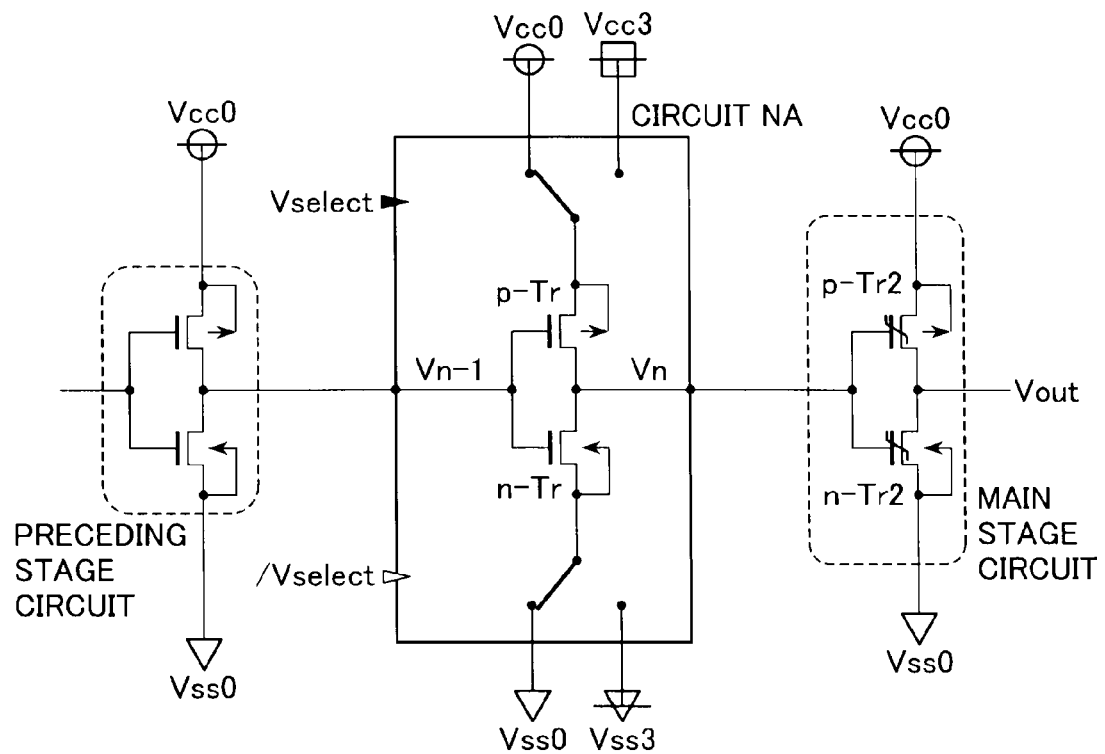
FIGS. 9B(c) and 9B(d) illustrate one embodiment of the present invention when Vn−1 and Vn have logical states opposite to each other and a symbol of a circuit NA, respectively.
Figure 9B:
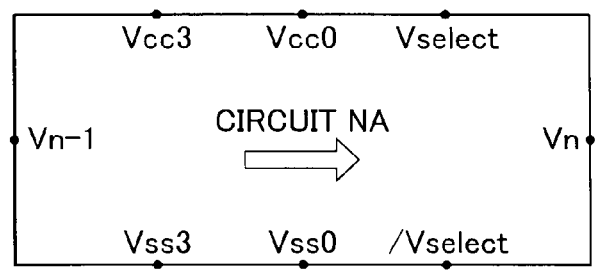

FIG. 9B(c) illustrates an operation principle of one embodiment (FIG. 6B(b)) of the present invention. The feature is that a NOT logic circuit is disposed between an output terminal of the preceding stage circuit and an input terminal of the main stage circuit, and nonvolatile memory writing into a nonvolatile memory circuit can be performed with a high degree of certainty by switching a power source potential of the NOT logic circuit through the negative logical state detection enhancement circuit NA which switches a power source potential of the NOT logic circuit using a control signal. Here, for simplicity, both the preceding stage circuit and the main stage circuit include a NOT logic circuit constituted by complementary field-effect transistors but may include any other logical circuit instead of a NOT logic circuit.

Figure 10B:
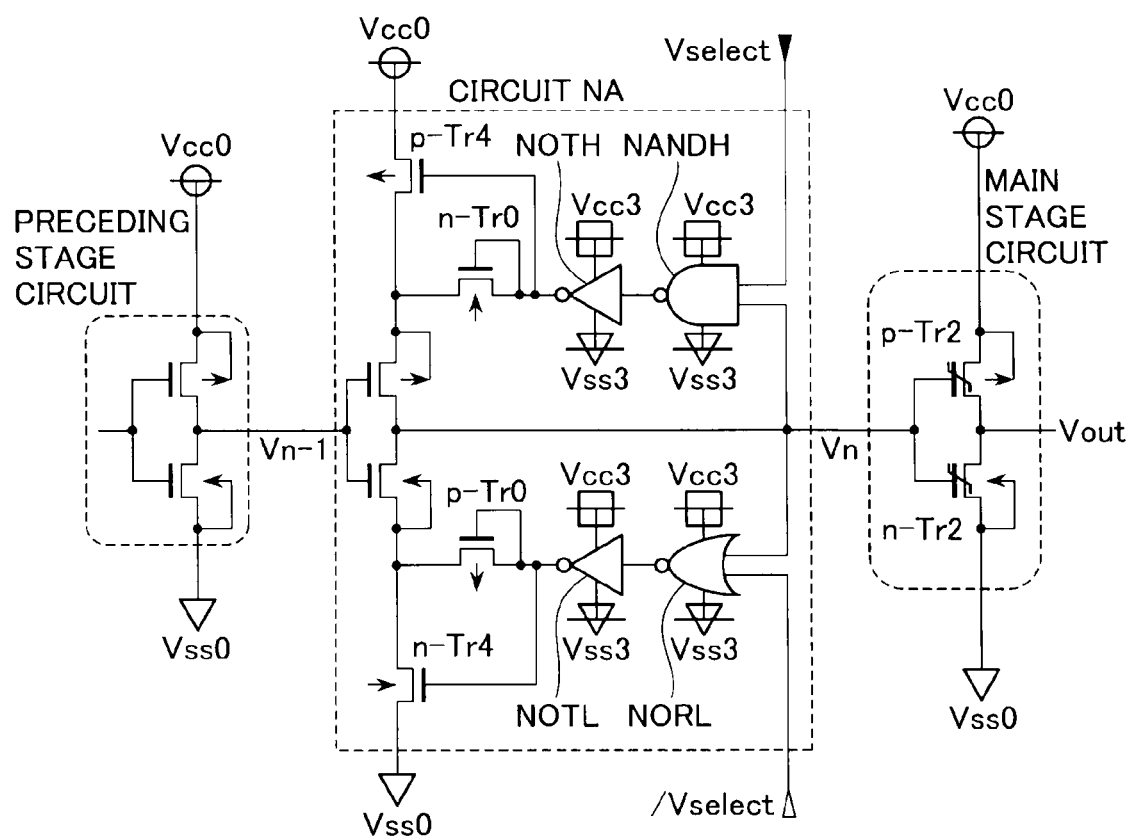

FIG. 10B(b) illustrates one embodiment of a concrete circuit of FIG. 9B(b). NOTH and NOTL denote one-input NOT logic circuits, NANDH denotes a two-input NAND logical circuit, and NORL denotes a two-input NOR logical circuit. A lower potential side power source of NOTH may be Vss0 instead of Vss3. A high potential side power source of the circuit NOTL may be Vcc0 instead of Vcc3. If an ON or OFF state which can be sufficiently identified can be applied to NOTH and NOTL of the next stage, power sources of NANDH and NORL may be Vcc0 and Vss0 instead of Ncc3 and Vss3. A combination (n-Tr4, /V select) of n-Tr4 and a gate input /V select thereof and a combination (p-Tr4, V select) of p-Tr4 and V select may be replaced with each other or a combination of n-channel and p-channel field-effect transistors may be replaced with a transmission gate which is opened or closed by complementary signal inputs.

Operation of the circuit of FIG. 10(b) will be described below.

When V select is Low, that is, when /V select is High, even though a logical state of Vn−1 is High or Low, since both n-Tr0 and p-Tr0 are turned off and both n-Tr4 and p-Tr4 are turned on, Vn is an electric potential Vcc0 or Vss0 of an inverse logical state of an output Vn−1 of the preceding stage circuit. Since an electric potential equal to or more than 0 V and equal to or less than Vcc0−Vss0 is applied between the gate terminal and the p-type substrate terminal of n-Tr2 of the main stage circuit, a channel resistance changes to the extent which an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an OFF and an ON can be identified, but sufficient nonvolatile memory writing cannot be performed using it. That is, the main stage circuit also handles a data non-memory computation operation like the preceding stage circuit.

When V select changes to High, that is, when /V select changes to Low, both n-Tr0 and p-Tr0 are turned on, both n-Tr4 and p-Tr4 are turned off, an electric potential which is higher than Vcc0 is applied to a source terminal of the p-channel field-effect transistor which constitutes the NOT logic circuit which generates an output of the negative logical state detection enhancement circuit NA even though an electric potential change corresponding to a threshold potential of n-Tr0 is considered, and an electric potential which is lower than Vss0 is applied to a source terminal of the n-channel field-effect transistor which constitutes the NOT logic circuit even though an electric potential change corresponding to a threshold potential of p-Tr0 is considered. At this time, an electric potential of the source terminal of the p-channel field-effect transistor which constitutes the NOT logic circuit becomes closer to Vcc3 as a threshold value of n-Tr0 is closer to 0 V, and an electric potential of the source terminal of the n-channel field-effect transistor which constitutes the NOT logic circuit becomes closer to Vss3 as a threshold value of p-Tr0 is closer to 0 V. Hereinafter, for simplicity, it is assumed that threshold values of n-Tr0 and p-Tr0 are 0 V. A threshold value may be adjusted according to a condition change of a manufacturing process of a transistor. If a logical state of Vn is High immediately before V select becomes High, since Vn rises from Vcc0 to Vcc3 by changing V select to High, an electric potential difference between the gate terminal and the p-type substrate terminal of n-Tr2 of the main stage circuit becomes Vcc3−Vss0, so that a nonvolatile ON state can be sufficiently written, and an electric potential difference between the gate terminal and the n-type substrate terminal of p-Tr2 becomes Vcc3−Vcc0, so that a nonvolatile OFF state can be sufficiently written. Similarly, if a logical state of Vn is Low immediately before V select becomes High, since Vn falls from Vss0 to Vss3 by changing V select to High, an electric potential difference between the gate terminal and the p-type substrate terminal of n-Tr2 of the main stage circuit becomes Vss3−Vss0, so that a nonvolatile OFF state can be sufficiently written, and an electric potential difference between the gate terminal and the n-type substrate terminal of p-Tr2 becomes Vss3−Vcc0, so that a nonvolatile ON state can be sufficiently written. Therefore, the main stage circuit nonvolatilely stores the same logical state as that occurring immediately before V select changes to High.

Next, all power source potentials become zero. Even though all power source potentials become zero, a unit of memory in which one of n-Tr2 and p-Tr2 is turned on or which one of n-Tr2 and p-Tr2 is turned off is retained as a height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, as a result, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc0, Vss0, Vcc3, and Vss3) to the negative logical state detection enhancement circuit NA.

Figure 11A:
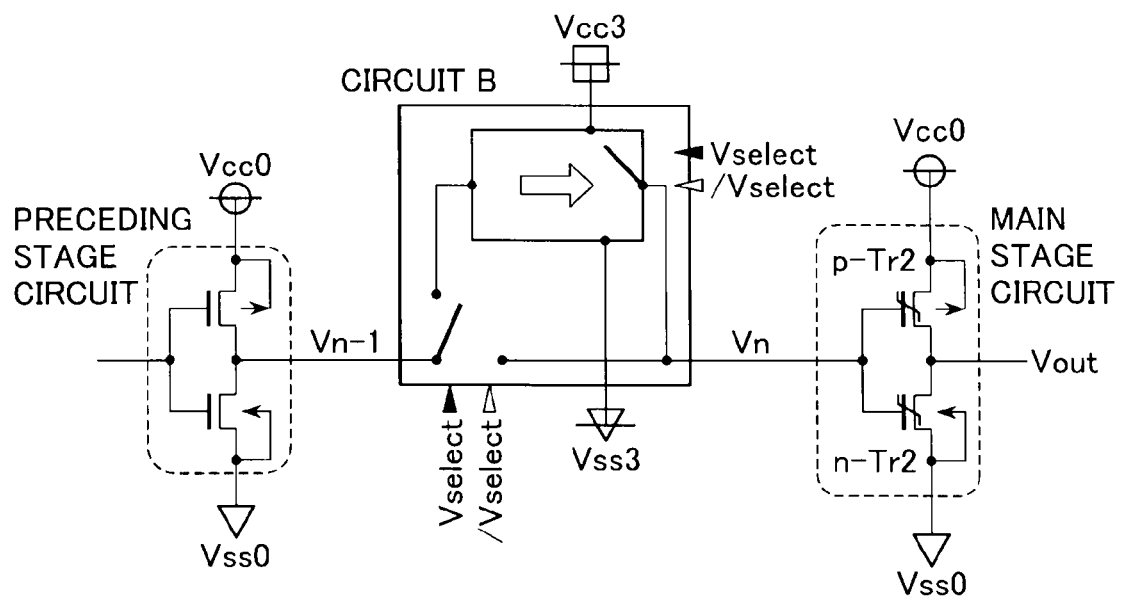
FIGS. 11(a) and 11(b) illustrate one embodiment of the present invention when Vn−1 and Vn have the same logical state and a symbol of a circuit B, respectively.
Figure 11B:
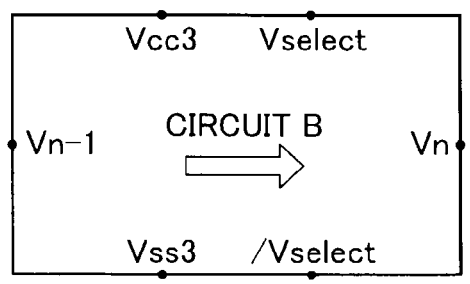

FIG. 11(a) illustrates one operation principle of one embodiment (FIG. 6B(c)) of the present invention. The feature is that nonvolatile memory writing into a nonvolatile memory circuit can be performed with a high degree of certainty by disconnecting a connection between an output terminal of the preceding stage circuit and an input terminal of the main stage circuit using a control signal, and, instead, by inputting an output potential of the preceding stage circuit to the positive logical state detection enhancement circuit B and applying an electric potential generated by the positive logical state detection enhancement circuit B to the input terminal of the main stage circuit. Here, for simplicity, both the preceding stage circuit and the main stage circuit include a NOT logic circuit constituted by complementary field-effect transistors but may include any other logical circuit instead of a NOT logic circuit.

Figure 12A:
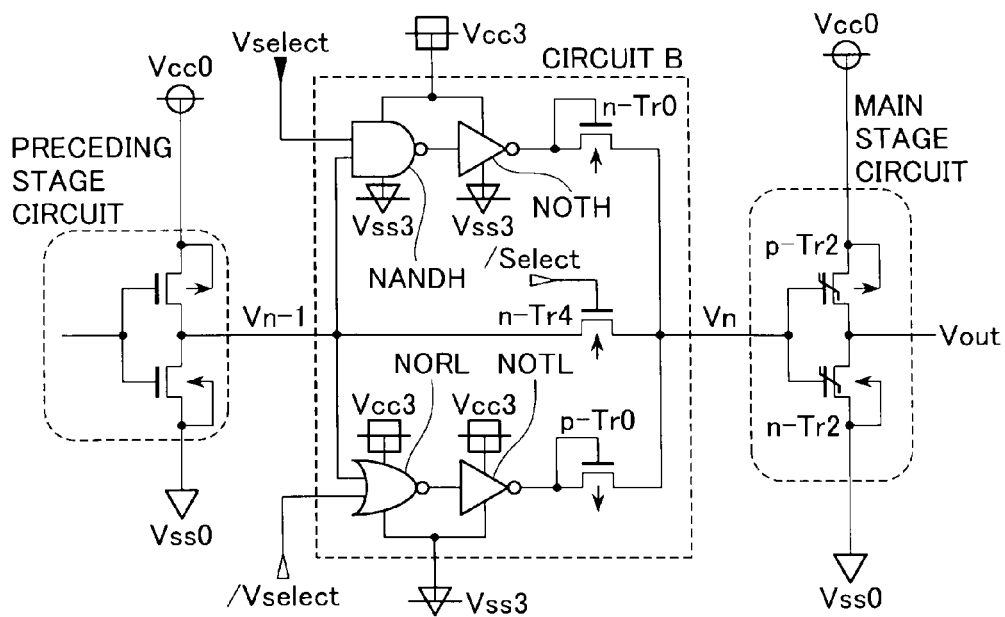
FIGS. 12(a) and 12(b) illustrate one embodiment of a concrete circuit of FIG. 11(a) and one embodiment of a concrete circuit of FIG. 11(c), respectively.

Operation of a circuit of FIG. 12(a) which is one embodiment of a concrete circuit of FIG. 11(a) will be described below. NOTH and NOTL denote one-input NOT logic circuits, NANDH denotes a two-input NAND logical circuit, and NORL denotes a two-input NOR logical circuit. A low potential side power source of NOTH may be Vss0 instead of Vss3. A high potential side power source of the circuit NOTL may be Vcc0 instead of Vcc3. If an ON or OFF state which can be sufficiently identified can be applied to NOTH and NOTL of the next stage, power sources of NANDH and NORL may be Vcc0 and Vss0 instead of Ncc3 and Vss3. A combination (n-Tr4, /V select) of n-Tr4 and a gate input /V select thereof may be replaced with a combination (p-Tr4, V select) of p-Tr4 and V select or may be replaced with a transmission gate formed by a combination of n-channel and p-channel field-effect transistors which are opened or closed by complementary signal inputs.

When V select is Low, that is, when /V select is High, since both n-Tr0 and p-Tr0 are turned off and both n-Tr4 and p-Tr4 are turned on whether the logical state of Vn−1 is High or Low, Vn is equal to an output Vn−1 of the preceding stage circuit. Since an electric potential equal to or more than 0 V and equal to or less than Vcc0−Vss0 is applied between the gate terminal and the p-type substrate terminal of n-Tr2 of the main stage circuit, a channel resistance changes to the extent that an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an OFF and an ON can be identified, but sufficient nonvolatile memory writing cannot be performed using it. That is, the main stage circuit also handles a data non-memory computation operation like the preceding stage circuit.

When V select changes to High, that is, when /V select changes to Low, n-Tr4 is turned off. When Vn−1 is High, n-Tr0 is turned on, so that an electric potential which is higher than Vcc0 is applied to Vn even though an electric potential change corresponding to a threshold potential of n-Tr0 is considered, and when Vn−1 is Low, p-Tr0 is turned on, so that an electric potential which is lower than Vss0 is applied to Vn even though an electric potential change corresponding to a threshold potential of p-Tr0 is considered. At this time, the electric potential which is higher Vcc0 becomes closer to Vcc3 as a threshold value of n-Tr0 is closer to 0 V, and the electric potential which is lower than Vss0 becomes closer to Vss3 as a threshold value of p-Tr0 is closer to 0 V. Hereinafter, for simplicity, it is assumed that threshold values of n-Tr0 and p-Tr0 are 0 V. A threshold value may be adjusted according to a condition change of a manufacturing process of a transistor. If a logical state of Vn−1 is High immediately before V select becomes High, since Vn rises from Vcc0 to Vcc3 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Similarly, if a logical state of Vn−1 is Low immediately before V select becomes High, since Vn falls from Vss0 to Vss3 by changing V select to High, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written. Therefore, the main stage circuit nonvolatilely stores the same logical state as that occurring immediately before V select changes to High.

Next, all power source potentials become zero. Even though all power source potentials become zero, a unit of memory to which one of n-Tr2 and p-Tr2 is turned on or which one of n-Tr2 and p-Tr2 is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials Vcc3 and Vss3 to the positive logical state detection enhancement circuit B.

Figure 11C:
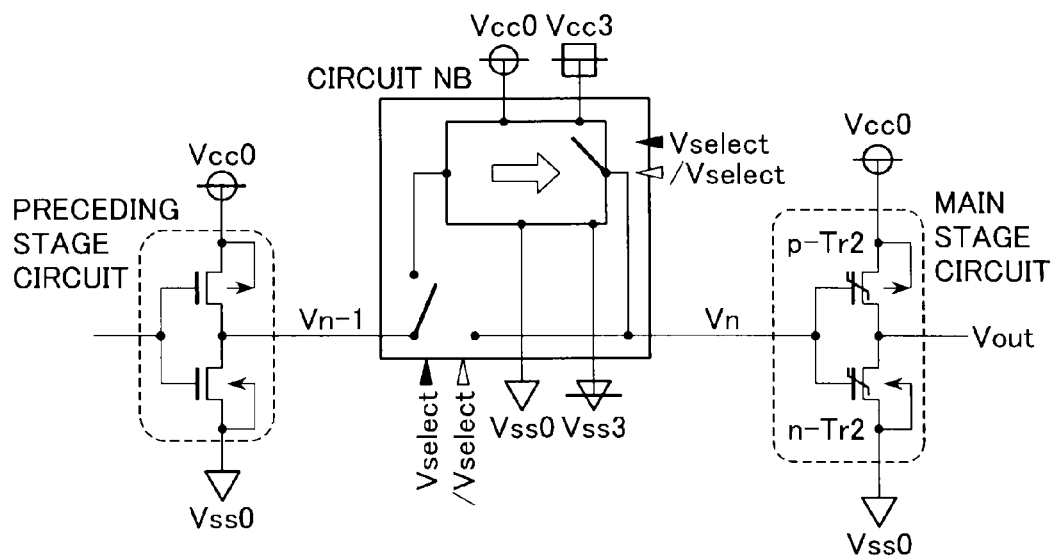
FIGS. 11(c) and 11(d) illustrate one embodiment of the present invention when Vn−1 and Vn have logical states opposite to each other and a symbol of a circuit NB, respectively.
Figure 11D:
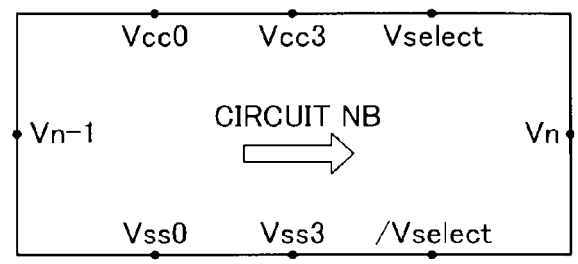

FIG. 11(c) illustrates another operation principle of one embodiment (FIG. 6B(c)) of the present invention. The feature is that nonvolatile memory writing into a nonvolatile memory circuit can be performed with a high degree of certainty by disconnecting a connection between an output terminal of the preceding stage circuit and an input terminal of the main stage circuit using a control signal and, instead, inputting an output potential of the preceding stage circuit to the negative logical state detection enhancement circuit NB and applying an electric potential generated by the negative logical state detection enhancement circuit NB to the input terminal of the main stage circuit. Here, for simplicity, both the preceding stage circuit and the main stage circuit include a NOT logic circuit constituted by complementary field-effect transistors but may include any other logical circuit instead of a NOT logic circuit.

Figure 12B:
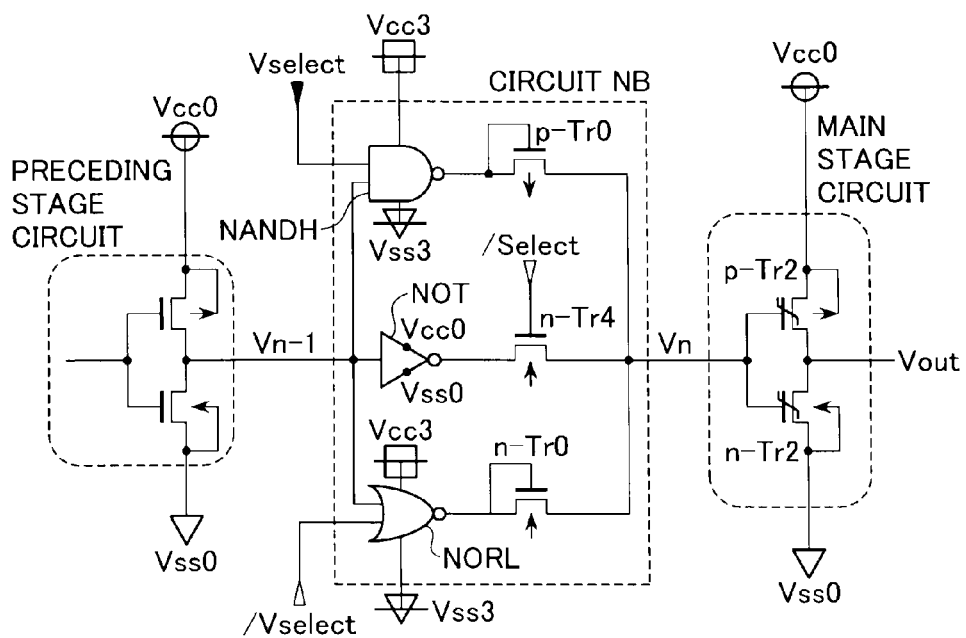

Operation of a circuit of FIG. 12(b) which is one embodiment of a concrete circuit of FIG. 11(c) will be described below. NOT denotes a one-input NOT logic circuit, NANDH denotes a two-input NAND logical circuit, and NORL denotes a two-input NOR logical circuit. A high potential power source of NANDH may be Vcc0 instead of Vcc3. A low potential power source of NORL may be Vss0 instead of Vss3. A combination (n-Tr4, /V select) of n-Tr4 and a gate input /V select thereof may be replaced with a combination (p-Tr4, V select) of p-Tr4 and V select or may be replaced with a transmission gate which is formed by a combination of n-channel and p-channel field-effect transistors and is opened or closed by complementary signal inputs.

When V select is Low, that is, when /V select is High, since both n-Tr0 and p-Tr0 are turned off and n-Tr4 is turned on whether the logical state of Vn−1 is High or Low, Vn is Vcc0 or Vss0 of an inverse logical state of an output Vn−1 of the preceding stage circuit. Since an electric potential equal to or more than 0 V and equal to or less than Vcc0−Vss0 is applied between the gate terminal and the p-type substrate terminal of n-Tr2 of the main stage circuit, a channel resistance changes to the extent that an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an ON and an OFF can be identified, but sufficient nonvolatile memory writing cannot be performed using it. That is, the main stage circuit also handles a data non-memory computation operation like the preceding stage circuit.

When V select changes to High, that is, when /V select changes to Low, n-Tr4 is turned off. When Vn−1 is High, p-Tr0 is turned on, so that an electric potential which is lower than Vss0 is applied to Vn even though an electric potential change corresponding to a threshold potential of p-Tr0 is considered, and when Vn−1 is Low, n-Tr0 is turned on, so that an electric potential which is higher than Vcc0 is applied to Vn even though an electric potential change corresponding to a threshold potential of n-Tr0 is considered. At this time, the electric potential which is lower than Vss0 becomes closer to Vss3 as a threshold value of p-Tr0 is closer to 0 V, and the electric potential which is higher Vcc0 becomes closer to Vcc3 as a threshold value of n-Tr0 is closer to 0 V. Hereinafter, for simplicity, it is assumed that threshold values of n-Tr0 and p-Tr0 are 0 V. A threshold value may be adjusted according to a condition change of a manufacturing process of a transistor. If a logical state of Vn−1 is High immediately before V select becomes High, since Vn falls from Vss0 to Vss3 by changing V select to High, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written. Similarly, if a logical state of Vn−1 is Low immediately before V select becomes High, since Vn rises from Vcc0 to Vcc3 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Therefore, the main stage circuit nonvolatilely stores the same logical state as that occurring immediately before V select changes to High.

Next, all power source potentials become zero. Even though all power source potentials become zero, a unit of memory to which one of n-Tr2 and p-Tr2 of the main stage circuit is turned on or which one of n-Tr2 and p-Tr2 of the main stage circuit is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials Vcc0, Vss0, Vcc3, and Vss3 to the negative logical state detection enhancement circuit NB.

Figure 13A:
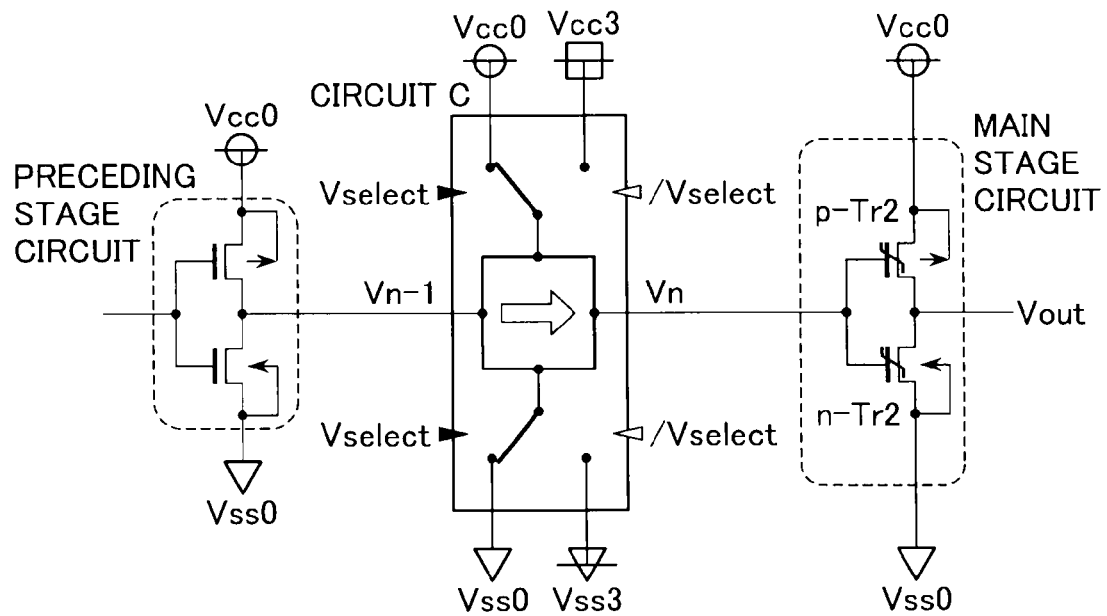
FIGS. 13(a) and 13(b) illustrate one embodiment of the present invention when Vn−1 and Vn have the same logical state and a symbol of a circuit C, respectively.
Figure 13B:
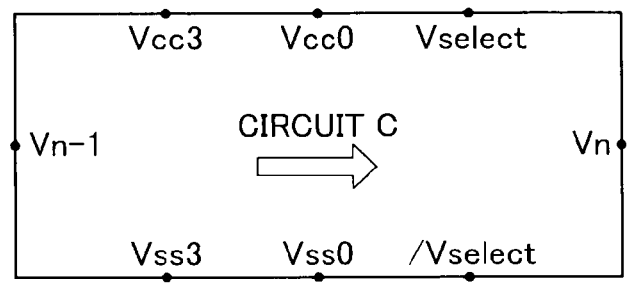

FIG. 13(a) illustrates one operation principle of one embodiment (FIG. 6B(d)) of the present invention. The feature is that an output potential of the preceding stage circuit always passes through the positive logical state detection enhancement circuit C, an output potential of the positive logical state detection enhancement circuit C is applied to an input terminal of the main stage circuit, and nonvolatile memory writing into a nonvolatile memory circuit can be performed with a high degree of certainty by switching a power source potential of the positive logical state detection enhancement circuit C using a control signal to change an electric potential generated by the positive logical state detection enhancement circuit C. Here, for simplicity, both the preceding stage circuit and the main stage circuit include a NOT logic circuit constituted by complementary field-effect transistors but may include any other logical circuit instead of a NOT logic circuit.

Figure 14A:
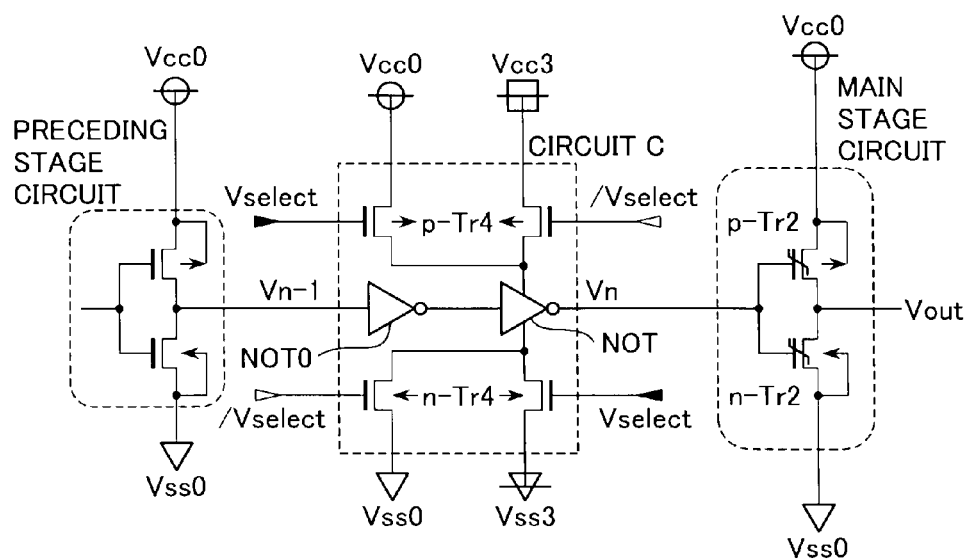
FIGS. 14(a) and 14(b) illustrate one embodiment of a concrete circuit of FIG. 13(a) and one embodiment of a concrete circuit of FIG. 13(c), respectively.

Operation of a circuit of FIG. 14(a) which is one embodiment of a concrete circuit of FIG. 13(a) will be described below. NOT0 and NOT denote one-input NOT logic circuits. A high potential power source and a low potential power source of NOT0 may have a magnitude enough to identify an ON and an OFF of NOT of the next stage. For a combination of n-Tr4 and p-Tr4 and a gate input thereof, (n-tr4, V select) may be replaced with (p-Tr4, /V select), and (n-tr4, /V select) may be replaced with (p-Tr4, V select), and a combination of n-channel and p-channel field-effect transistors may be replaced with a transmission gate which is opened or closed by complementary signal inputs.

When V select is Low, that is, when /V select is High, Vn is Vcc0 or Vss0 of the same logical state as the output Vn−1 of the preceding stage circuit. Since an electric potential equal to or more than 0 V and equal to or less than Vcc0−Vss0 is applied between the gate terminal and the p-type substrate terminal of n-Tr2 of the main stage circuit, a channel resistance changes to the extent that an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an OFF and an ON can be identified, but sufficient nonvolatile memory writing cannot be performed using it. That is, the main stage circuit also handles a data non-memory computation operation like the preceding stage circuit.

When V select changes to High, that is, when /V select changes to Low, an electric potential which is higher than Vcc0 is applied to Vn if Vn−1 is High, and an electric potential which is lower than Vss0 is applied to Vn if Vn−1 is Low. The electric potential which is higher than Vcc0 is equal to Vcc3 when a threshold potential of p-Tr4 is appropriately controlled, and the electric potential which is lower than Vss0 is equal to Vss3 when a threshold potential of n-Tr4 is appropriately controlled. Hereinafter, for simplicity, it is assumed that the threshold potentials of p-Tr4 and n-Tr4 are appropriately controlled, and thus in the case in which V select is High, Vcc3 is applied to Vn if Vn−1 is High, and Vss3 is applied to Vn if Vn−1 is Low. If Vn−1 is High, since Vn further rises from Vcc0 to Vcc3 by changing V select from Low to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 of the main stage circuit becomes Vcc3−Vcc0, so that a nonvolatile OFF state is sufficiently written. Similarly, if Vn−1 is Low, since Vn further falls from Vss0 to Vss3 by changing V select from Low to High, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written. Therefore, the main stage circuit nonvolatilely stores the same logical state of Low occurring immediately before V select changes to High.

Next, all power source potentials become zero. Even though all power source potentials become zero, a unit of memory to which one of n-Tr2 and p-Tr2 the main stage circuit is turned on or which one of n-Tr2 and p-Tr2 the main stage circuit is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is consequently reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc0, Vss0, Vcc3, and Vss3) to the positive logical state detection enhancement circuit C.

Figure 13C:
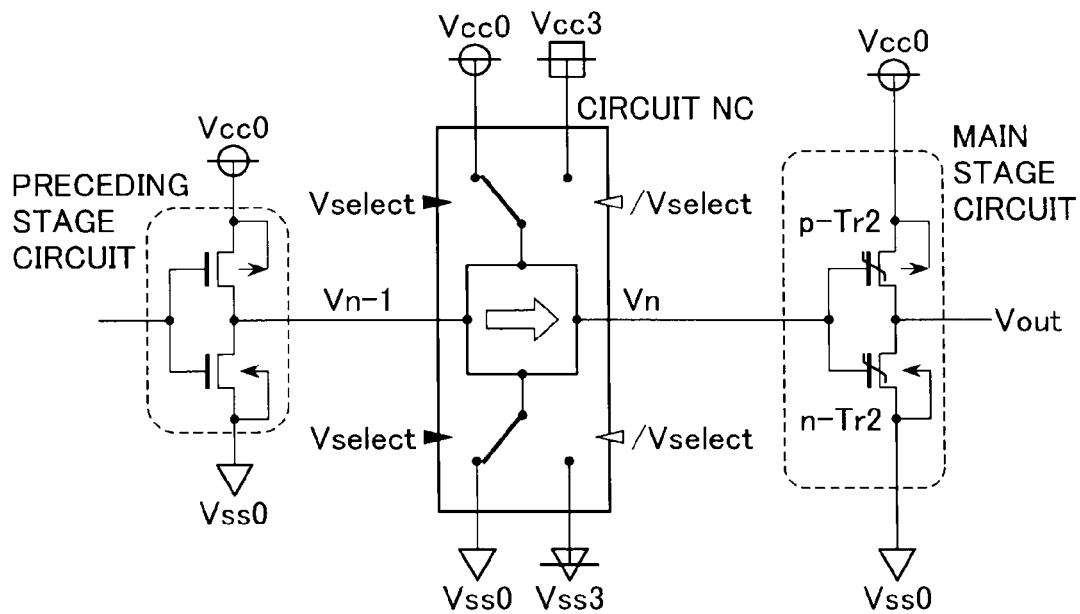
FIGS. 13(c) and 13(d) illustrate one embodiment of the present invention when Vn−1 and Vn have logical states opposite to each other and a symbol of a circuit NC, respectively.
Figure 13D:
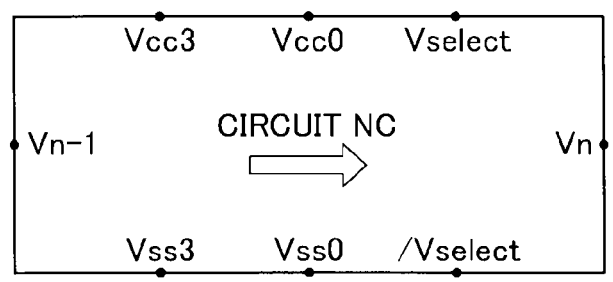

FIG. 13(c) illustrates another operation principle of one embodiment (FIG. 6B(d)) of the present invention. The feature is that an output potential of the preceding stage circuit always passes through the negative logical state detection enhancement circuit NC, an output potential of the negative logical state detection enhancement circuit NC is applied to an input terminal of the main stage circuit, and nonvolatile memory writing into a nonvolatile memory circuit can be performed with a high degree of certainty by switching a power source potential of the negative logical state detection enhancement circuit NC using a control signal to change an electric potential generated by the negative logical state detection enhancement circuit NC. Here, for simplicity, both the preceding stage circuit and the main stage circuit include a NOT logic circuit constituted by complementary field-effect transistors but may include any other logical circuit instead of a NOT logic circuit.

Figure 14B:
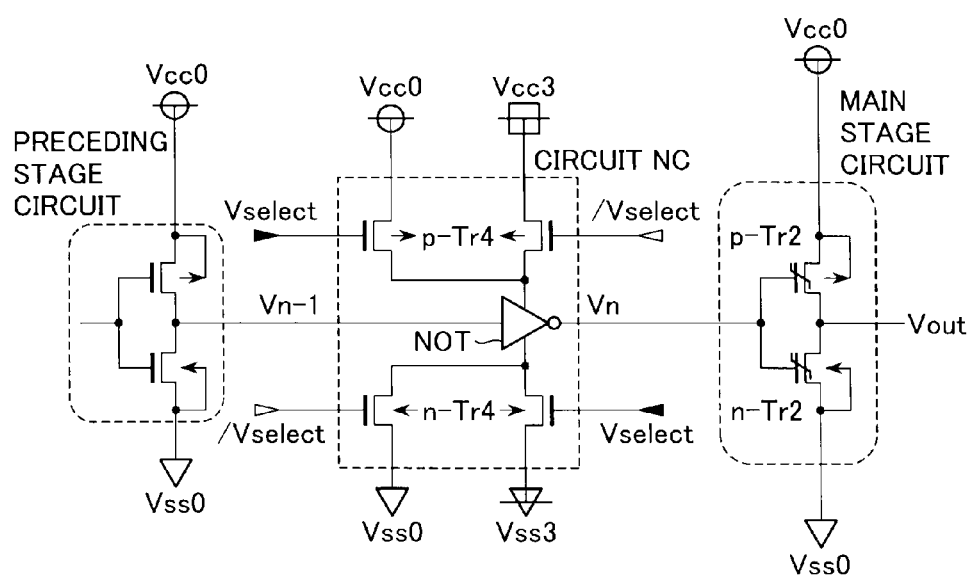

Operation of a circuit of FIG. 14(b) which is one embodiment of a concrete circuit of FIG. 13(c) will be described below. NOT denotes a one-input NOT logic circuit. For a combination of n-Tr4 and p-Tr4 and a gate input thereof, (n-tr4, V select) may be replaced with (p-Tr4, /V select), and (n-tr4, /V select) may be replaced with (p-Tr4, V select), and a combination of n-channel and p-channel field-effect transistors may be replaced with a transmission gate which is opened or closed by complementary signal inputs.

When V select is Low, that is, when /V select is High, Vn is Vcc0 or Vss0 of an inverse logical state of the output Vn−1 of the preceding stage circuit. Since an electric potential equal to or more than 0 V and equal to or less than Vcc0−Vss0 is applied between the gate terminal and the p-type substrate terminal of n-Tr2 of the main stage circuit, a channel resistance changes to the extent that an OFF and an ON can be identified, but sufficient nonvolatile memory writing cannot be performed using it. Since an electric potential equal to or more than Vss0−Vcc0 and equal to or less than 0 V is applied between the gate terminal and the n-type substrate terminal of p-Tr2, a channel resistance changes to the extent that an OFF and an ON can be identified, but sufficient nonvolatile memory writing cannot be performed using it. That is, the main stage circuit also handles a data non-memory computation operation like the preceding stage circuit.

When V select changes to High, that is, when /V select changes to Low, an electric potential which is lower than Vss0 is applied to Vn if Vn−1 is High, and an electric potential which is higher than Vcc0 is applied to Vn if Vn−1 is Low. The electric potential which is lower than Vss0 is equal to Vss3 when a threshold potential of n-Tr4 is appropriately controlled, and the electric potential which is higher than Vcc0 is equal to Vcc3 when a threshold potential of p-Tr4 is appropriately controlled. Hereinafter, for simplicity, it is assumed that the threshold potentials of p-Tr4 and n-Tr4 are appropriately controlled, and thus in the case in which V select is High, Vss3 is applied to Vn if Vn−1 is High, and Vcc3 is applied to Vn if Vn−1 is Low. If Vn−1 is High, since Vn further falls from Vss0 to Vss3 by changing V select from Low to High, that is, changing /V select from High to Low, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 of the main stage circuit becomes Vss3−Vcc0, so that a nonvolatile ON state is sufficiently written. Similarly, if Vn−1 is Low, since Vn further rises from Vcc0 to Vcc3 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Therefore, the main stage circuit nonvolatilely stores the same logical state as that occurring immediately before V select changes to High.

Next, all power source potentials become zero. Even though all power source potentials become zero, a unit of memory to which one of n-Tr2 and p-Tr2 is turned on or which one of n-Tr2 and p-Tr2 is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc0, Vss0, Vcc3, and Vss3) to the negative logical state detection enhancement circuit NC.

Figure 6C:
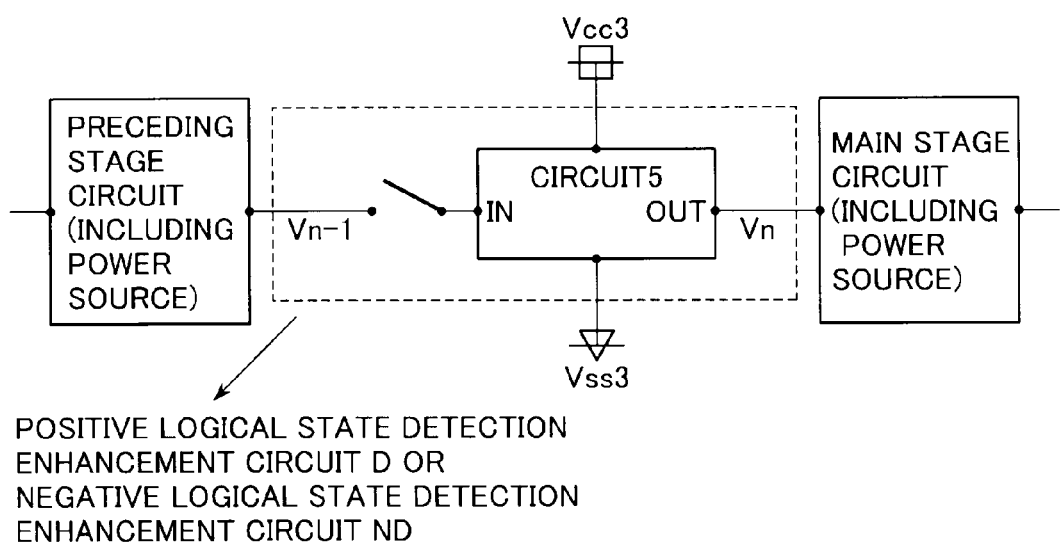
FIG. 6C(e) illustrates an embodiment of the present invention.
Figure 15A:
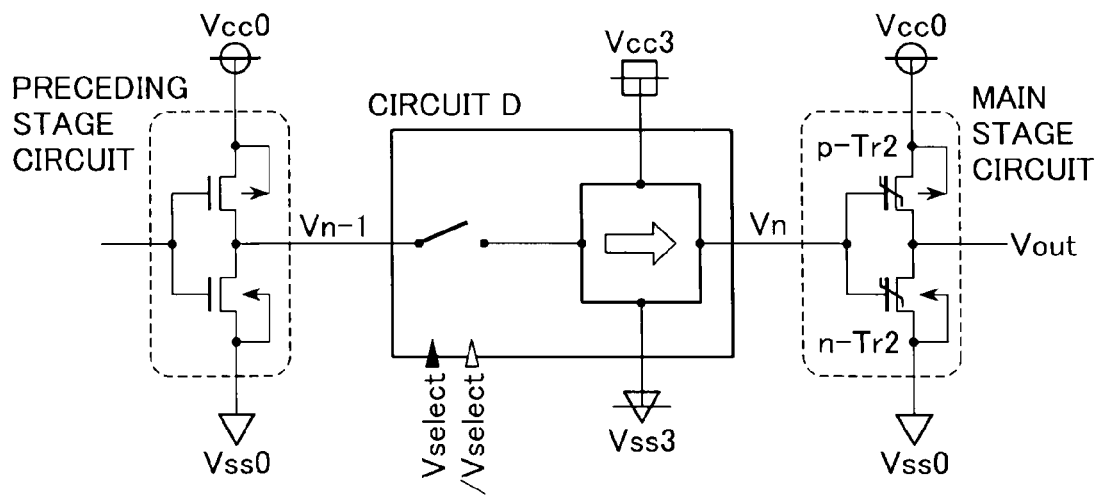
FIGS. 15(a) and 15(b) illustrate one embodiment of the present invention when Vn−1 and Vn have the same logical state and a symbol of a circuit D, respectively.
Figure 15B:
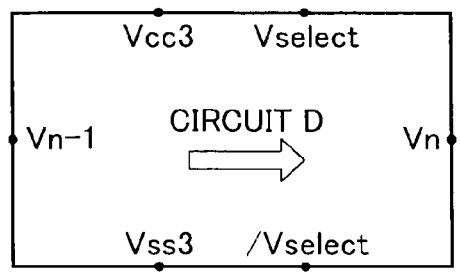

FIG. 15(a) illustrates one operation principle of one embodiment (FIG. 6C(e)) of the present invention. The feature is that when nonvolatile memory writing into the main stage circuit is not performed, even though an output potential of the preceding stage circuit is applied to the positive logical state detection enhancement circuit D, it is blocked inside the positive logical state detection enhancement circuit D and so does not have a correlation with an output potential, while when nonvolatile memory writing into the main stage circuit is selected to be performed by a control signal, an output potential of the preceding stage circuit input to the positive logical state detection enhancement circuit D is not blocked, and the positive logical state detection enhancement circuit D generates its output potential based on the output potential of the preceding stage circuit, so that nonvolatile memory writing into a nonvolatile memory circuit can be performed with a high degree of certainty. Here, for simplicity, both the preceding stage circuit and the main stage circuit include a NOT logic circuit constituted by complementary field-effect transistors but may include any other logical circuit instead of a NOT logic circuit.

Figure 16A:
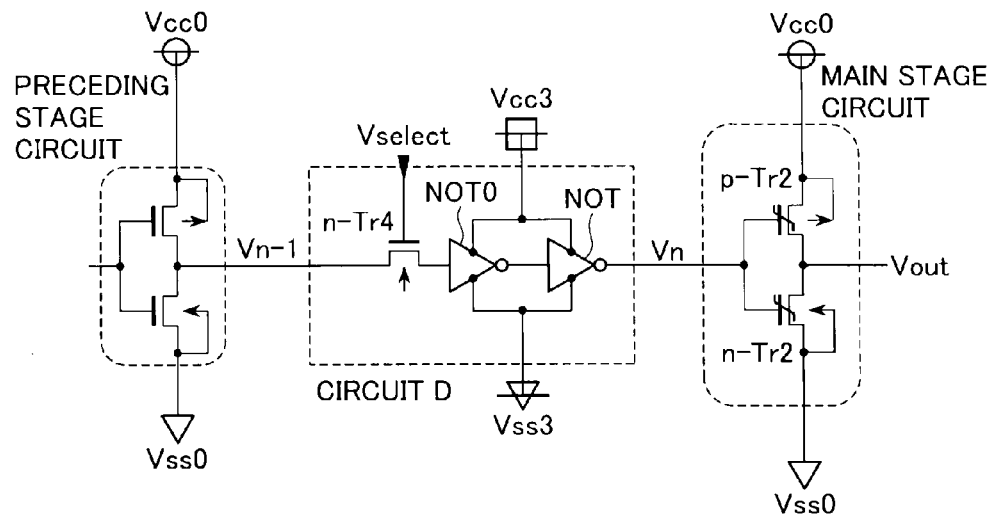
FIGS. 16A(a) and 16A(b) illustrate embodiments of a concrete circuit of FIG. 15(a)
Figure 16A:
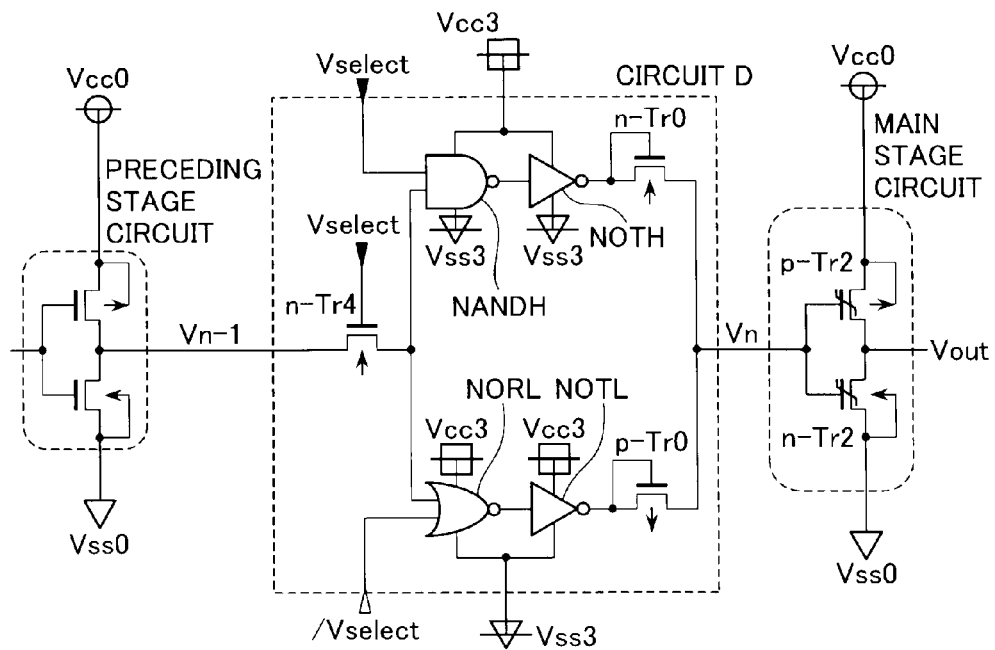

Operation of a circuit of FIG. 16A(a) which is one embodiment of a concrete circuit of FIG. 15(a) will be described below. NOT0 and NOT denote one-input NOT logic circuits. If an ON or OFF state which can be identified can be applied to NOT of the next stage, power sources of NOT0 may be Vcc0 and Vss0 instead of Ncc3 and Vss3. A combination (n-Tr4, V select) of n-Tr4 and a gate input V select thereof may be replaced with a combination (p-Tr4, /V select) of p-Tr4 and V select, and a combination of n-channel and p-channel field-effect transistors may be replaced with a transmission gate which is opened or closed by complementary signal inputs.

When V select is Low, that is, when /V select is High, since n-Tr4 is turned off whether the logical state of Vn−1 is High or Low, Vn−1 is blocked inside the positive logical state detection enhancement circuit D, so that an input potential Vn of the main stage circuit is not generated. An electric potential may be externally applied to intentionally determine Vn, and a computation may be continued by newly obtaining an output from the main stage circuit, but an operation following the main stage circuit may be temporarily stopped by making a power source voltage of the main stage circuit zero (0 V).

When V select changes to High, that is, when /V select changes to Low, n-Tr4 is turned on, so that an electric potential which is generated by the positive logical state detection enhancement circuit D based on Vn−1 is applied to Vn. Power source voltages of the main stage circuit are Vcc0 and Vss0. When Vn−1 is High, an electric potential Vcc3 which is higher than Vcc0 is applied to Vn, and an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Similarly, when Vn−1 is Low, an electric potential Vss3 which is lower than Vss0 is applied, and an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written.

Next, all power source potentials become zero. Even though all power source potentials become zero, a unit of memory to which one of n-Tr2 and p-Tr2 is turned on or which one of n-Tr2 and p-Tr2 is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc3 and Vss3) to the positive logical state detection enhancement circuit D.

Operation of a circuit of FIG. 16A(b) which is another embodiment of the concrete circuit of FIG. 15(a) will be described below.

NOTH and NOTL denote one-input NOT logic circuits, NANDH denotes a two-input NAND logical circuit, and NORL denotes a two-input NOR logical circuit. A low potential side power source of NOTH may be Vss0 instead of Vss3. A high potential side power source of the circuit NOTL may be Vcc0 instead of Vcc3. If an ON or OFF state which can be identified can be applied to NOTH and NOTL of the next stage, power sources of NANDH and NORL may be Vcc0 and Vss0 instead of Ncc3 and Vss3. A combination (n-Tr4, V select) of n-Tr4 and a gate input V select thereof may be replaced with a combination (p-Tr4, /V select) of p-Tr4 and V select, and a combination of n-channel and p-channel field-effect transistors may be replaced with a transmission gate which is opened or closed by complementary signal inputs.

When V select is Low, that is, when /V select is High, since both n-Tr0 and p-Tr0 are turned off and n-Tr4 is also turned off whether the logical state of Vn−1 is High or Low, Vn−1 is blocked inside the positive logical state detection enhancement circuit D, so that an input potential Vn of the main stage circuit is not generated. An electric potential may be externally applied to intentionally determine Vn, and a computation may be continued by newly obtaining an output from the main stage circuit, but an operation following the main stage circuit may be temporarily stopped by making a power source voltage of the main stage circuit zero (0 V).

When V select changes to High, that is, when /V select changes to Low, n-Tr4 is turned on, so that an electric potential which is generated by the positive logical state detection enhancement circuit D based on Vn−1 is applied to Vn. Power source voltages of the main stage circuit are Vcc0 and Vss0. When Vn−1 is High, n-Tr0 is turned on, so that an electric potential which is higher than Vcc0 is applied to Vn even though an electric potential change corresponding to a threshold potential of n-Tr0 is considered, and when Vn−1 is Low, p-Tr0 is turned on, so that an electric potential which is lower than Vss0 is applied to Vn even though an electric potential change corresponding to a threshold potential of p-Tr0 is considered. At this time, the electric potential which is higher than Vcc0 becomes closer to Vcc3 as a threshold value of n-Tr0 is closer to 0 V, and the electric potential which is lower than Vss0 becomes closer to Vss3 as a threshold value of p-Tr0 is closer to 0V. Hereinafter, for simplicity, it is assumed that the threshold values of n-Tr0 and p-Tr0 are 0 V. The threshold value may be adjusted according to a condition change of a manufacturing process of a transistor. If a logical state of Vn−1 occurring immediately before V select becomes High is High, since Vn becomes an electric potential Vcc3 which is higher than Vcc0 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written. Similarly, if a logical state of Vn−1 occurring immediately before V select becomes High is Low, since Vn becomes an electric potential Vss3 which is lower than Vss0 by changing V select to High, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 of the main stage circuit becomes Vss3−Vcc0, so that a nonvolatile ON state is sufficiently written.

Next, all power source potentials become zero. Even though all power source potentials become zero, a unit of memory to which one of n-Tr2 and p-Tr2 is turned on or which one of n-Tr2 and p-Tr2 is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc3 and Vss3) to the positive logical state detection enhancement circuit D.

Figure 15C:
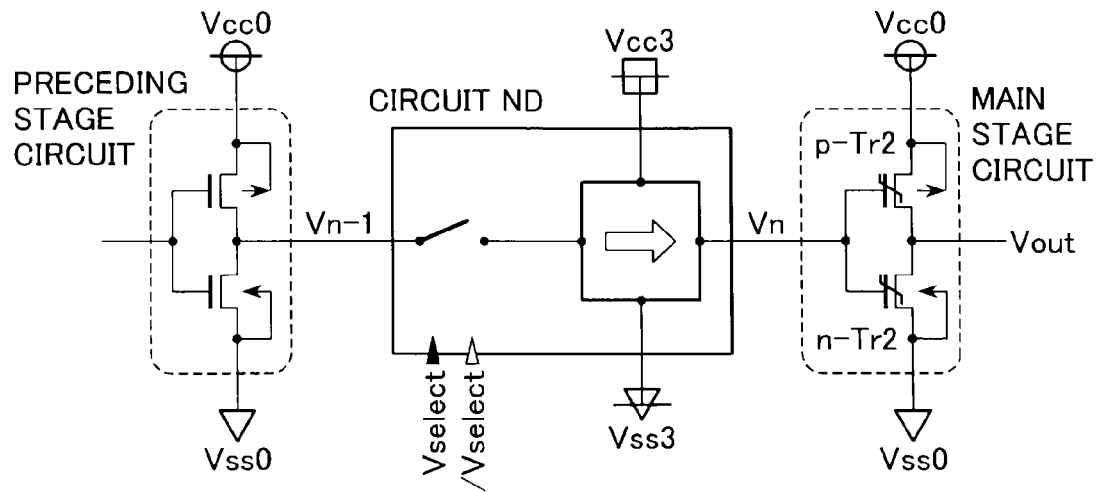
FIGS. 15(c) and 15(d) illustrate one embodiment of the present invention when Vn−1 and Vn have logical states opposite to each other and a symbol of a circuit ND, respectively.
Figure 15D:
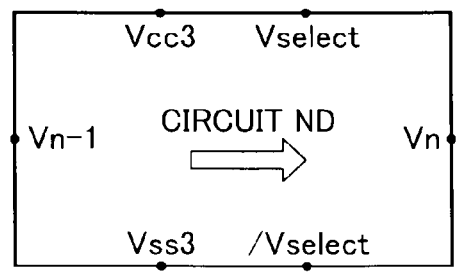

FIG. 15(c) illustrates another operation principle of one embodiment (FIG. 6C(e)) of the present invention. The feature is that when nonvolatile memory writing into the main stage circuit is not performed, even though an output potential of the preceding stage circuit is applied to the negative logical state detection enhancement circuit ND, it is blocked inside the negative logical state detection enhancement circuit ND and so does not have a correlation with an output potential, while when nonvolatile memory writing into the main stage circuit is selected to be performed by a control signal, the output potential of the preceding stage circuit input to the negative logical state detection enhancement circuit ND is not blocked, and the negative logical state detection enhancement circuit ND generates its output potential based on the output potential of the preceding stage circuit, so that nonvolatile memory writing into a nonvolatile memory circuit can be performed with a high degree of certainty. Here, for simplicity, both the preceding stage circuit and the main stage circuit include a NOT logic circuit constituted by complementary field-effect transistors but may include any other logical circuit instead of a NOT logic circuit.

Figure 16B:
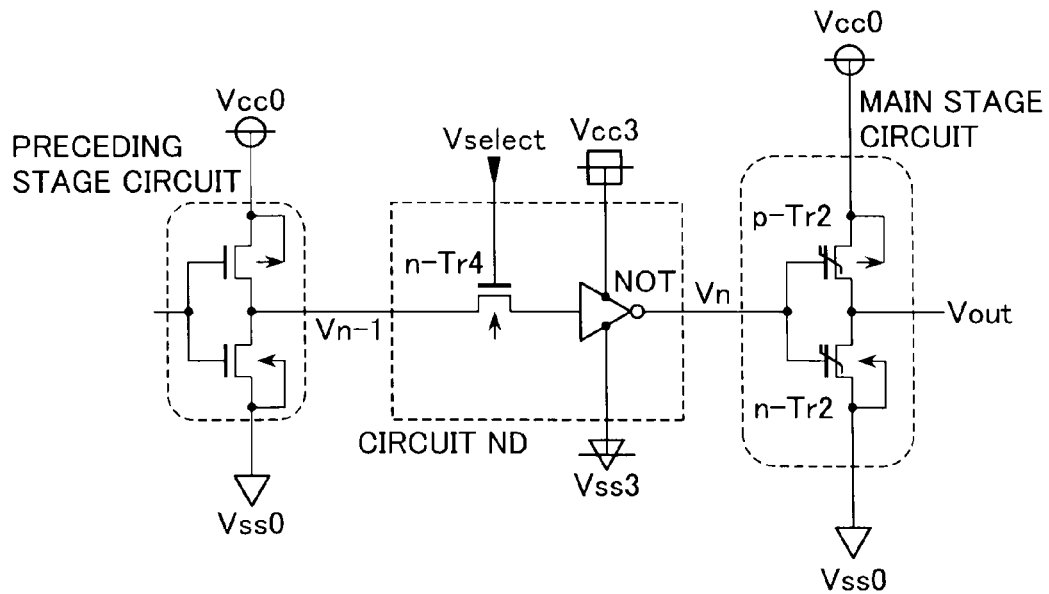
FIGS. 16B(c) and 16B(d) illustrate embodiments of a concrete circuit of FIG. 15(c)
Figure 16B:
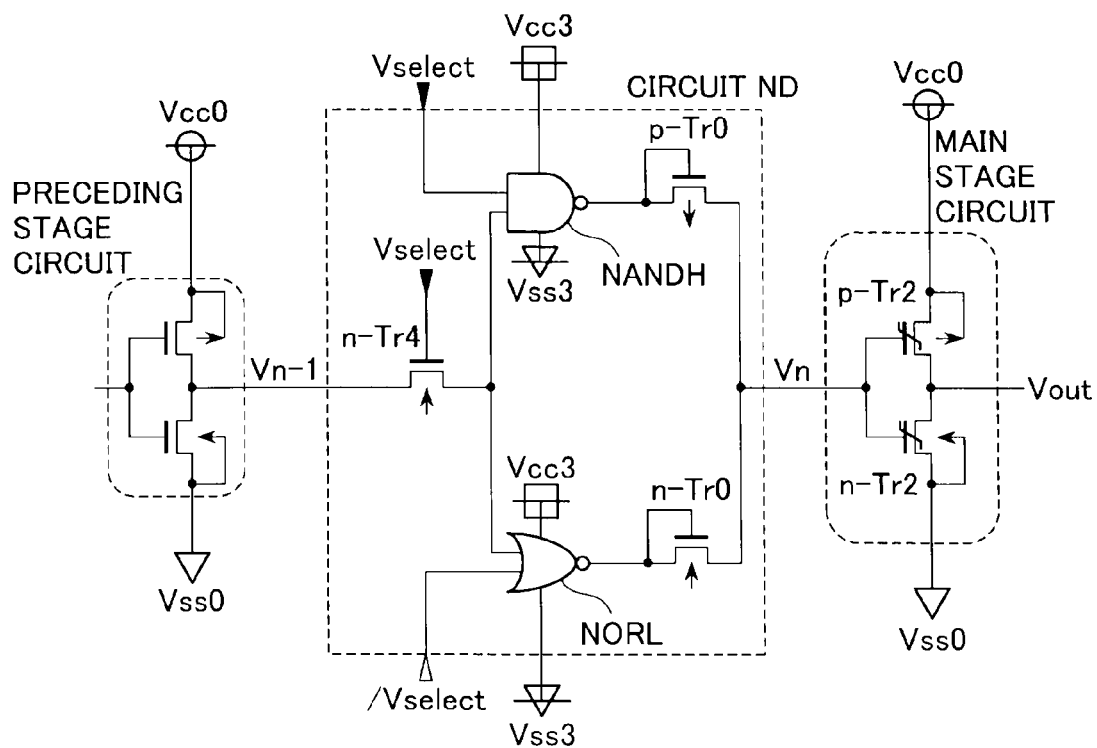

Operation of a circuit of FIG. 16B(c) which is one embodiment of a concrete circuit of FIG. 15(c) will be described below. NOT denotes a one-input NOT logic circuit. A combination (n-Tr4, V select) of n-Tr4 and a gate input V select thereof may be replaced with a combination (p-Tr4, /V select) of p-Tr4 and V select, and a combination of n-channel and p-channel field-effect transistors may be replaced with a transmission gate which is opened or closed by complementary signal inputs.

When V select is Low, that is, when /V select is High, since n-Tr4 is turned off whether the logical state of Vn−1 is High or Low, Vn−1 is blocked inside the negative logical state detection enhancement circuit ND, so that an input potential Vn of the main stage circuit is not generated. An electric potential may be externally applied to intentionally determine Vn, and a computation may be continued by newly obtaining an output from the main stage circuit, but an operation following the main stage circuit may be temporarily stopped by making a power source voltage of the main stage circuit zero (0 V).

When V select changes to High, that is, when /V select changes to Low, n-Tr4 is turned on, so that an electric potential which is generated by the negative logical state detection enhancement circuit ND based on Vn−1 is applied to Vn. Power source voltages of the main stage circuit are Vcc0 and Vss0. When Vn−1 is High, an electric potential Vss3 which is lower than Vss0 is applied to Vn, and an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written. Similarly, when Vn−1 is Low, an electric potential Vcc3 which is higher than Vcc0 is applied, and an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 becomes Vcc3−Vcc0, so that a nonvolatile OFF state is sufficiently written.

Next, all power source potentials become zero. Even though all power source potentials become zero, a unit of memory to which one of n-Tr2 and p-Tr2 of the main stage circuit is turned on or which one of n-Tr2 and p-Tr2 of the main stage circuit is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is consequently reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is not needed to supply the power source potentials (Vcc3 and Vss3) to the negative logical state detection enhancement circuit ND.

Operation of a circuit of FIG. 16B(d) which is another embodiment of the concrete circuit of FIG. 15(c) will be described below.

NANDH denotes a two-input NAND logical circuit, and NORL denotes a two-input NOR logical circuit. A high potential power source of NANDH may be Vcc0 instead of Vcc3. A low potential power source of NORL may be Vss0 instead of Vss3. A combination (n-Tr4, V select) of n-Tr4 and a gate input V select thereof may be replaced with a combination (p-Tr4, /V select) of p-Tr4 and V select, and a combination of n-channel and p-channel field-effect transistors may be replaced with a transmission gate which is opened or closed by complementary signal inputs.

When V select is Low, that is, when /V select is High, since both n-Tr0 and p-Tr0 are turned off and n-Tr4 is also turned off whether the logical state of Vn−1 is High or Low, Vn−1 is blocked inside the negative logical state detection enhancement circuit ND, so that an input potential Vn of the main stage circuit is not generated. An electric potential may be externally applied to intentionally determine Vn, and a computation may be continued by newly obtaining an output from the main stage circuit, but an operation following the main stage circuit may be temporarily stopped by making a power source voltage of the main stage circuit zero (0 V).

When V select changes to High, that is, when /V select changes to Low, n-Tr4 is turned on, so that an electric potential which is generated by the negative logical state detection enhancement circuit ND based on Vn−1 is applied to Vn. Power source voltages of the main stage circuit are Vcc0 and Vss0. When Vn−1 is High, p-Tr0 is turned on, so that an electric potential which is lower than Vss0 is applied to Vn even though an electric potential change corresponding to a threshold potential of p-Tr0 is considered, and when Vn−1 is Low, n-Tr0 is turned on, so that an electric potential which is higher than Vcc0 is applied to Vn even though an electric potential change corresponding to a threshold potential of n-Tr0 is considered. At this time, the electric potential which is lower than Vss0 becomes closer to Vss3 as a threshold value of p-Tr0 is closer to 0 V, and the electric potential which is higher than Vcc0 becomes closer to Vcc3 as a threshold value of n-Tr0 is closer to 0V. Hereinafter, for simplicity, it is assumed that the threshold values of n-Tr0 and p-Tr0 are 0 V. The threshold value may be adjusted according to a condition change of a manufacturing process of a transistor. If a logical state of Vn−1 occurring immediately before V select becomes High is High, since Vn becomes an electric potential Vss3 which is lower than Vss0 by changing V select to High, an electric potential difference between the gate terminal and the p-type substrate terminal of n-Tr2 of the main stage circuit becomes Vss3−Vss0, so that a nonvolatile OFF state is sufficiently written, and an electric potential difference between the gate terminal and the n-type substrate terminal of p-Tr2 becomes Vss3−Vcc0, so that a nonvolatile ON state is sufficiently written. Similarly, if a logical state of Vn−1 occurring immediately before V select becomes High is Low, since Vn becomes an electric potential Vcc3 which is higher than Vcc0 by changing V select to High, an electric potential difference between the gate terminal and the p-type substrate terminal of n-Tr2 of the main stage circuit becomes Vcc3−Vss0, so that a nonvolatile ON state is sufficiently written, and an electric potential difference between the gate terminal and the n-type substrate terminal of p-Tr2 of the main stage circuit becomes Vcc3−Vcc0, so that a nonvolatile OFF state is sufficiently written.

Next, all power source potentials become zero. Even though all power source potentials become zero, a unit of memory to which one of n-Tr2 and p-Tr2 of the main stage circuit is turned on or which one of n-Tr2 and p-Tr2 is turned off is retained as the height of a channel resistance.

Next, when the power source potentials Vcc0 and Vss0 of the main stage circuit are restored, since an electric potential drop of from Vcc0 to Vss0 which passes through the main stage circuit is divided according to the height of the channel resistance stored, a logical state corresponding to an ON or OFF state of n-Tr2 and p-Tr2 immediately before all power source potentials become zero is consequently reproduced, and either an electric potential which is high enough to identify a logical state as High or an electric potential which is low enough to identify a logical state as Low is output to Vout. In order to reproduce or read a unit of memory of the main stage circuit, it is not needed to input signal potentials such as an input of the preceding stage circuit, Vn−1, Vn, V select, and /V select again. It is also not needed to supply the power source potentials (Vcc3 and Vss3) to the negative logical state detection enhancement circuit ND.

According to the present invention, a sequence circuit which is not of edge trigger type with a clock can have a nonvolatile memory function. Methods for having a sequence circuit which is not of edge trigger type with a clock to have a nonvolatile memory function using the positive or negative logical state detection enhancement circuits A, NA, B, NB, C, or NC will be described below.

Figure 17A:
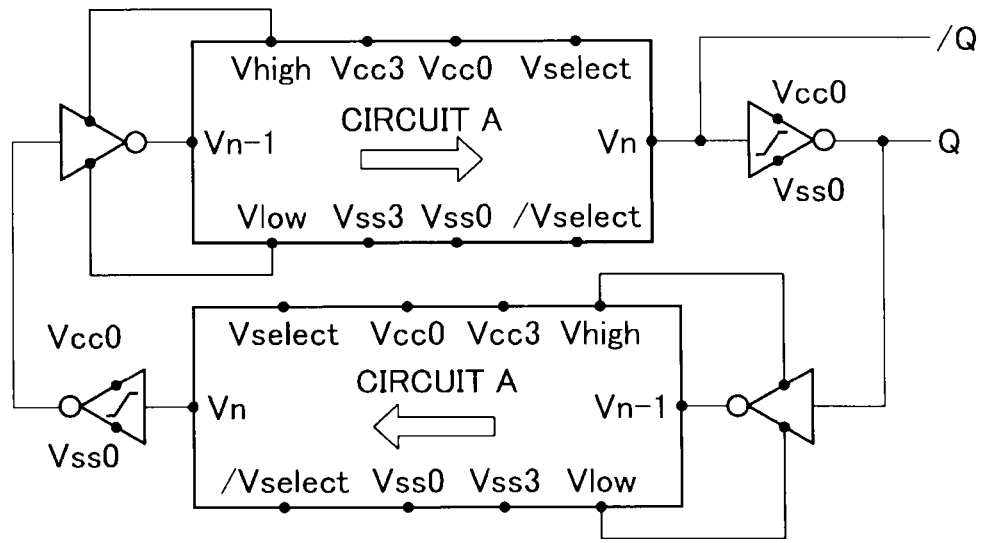
FIGS. 17(a) and 17(b) illustrate one embodiment and another embodiment of a method for having a sequence circuit which is not of edge trigger type with a clock to have a nonvolatile memory function using the circuit A, respectively.
Figure 17B:
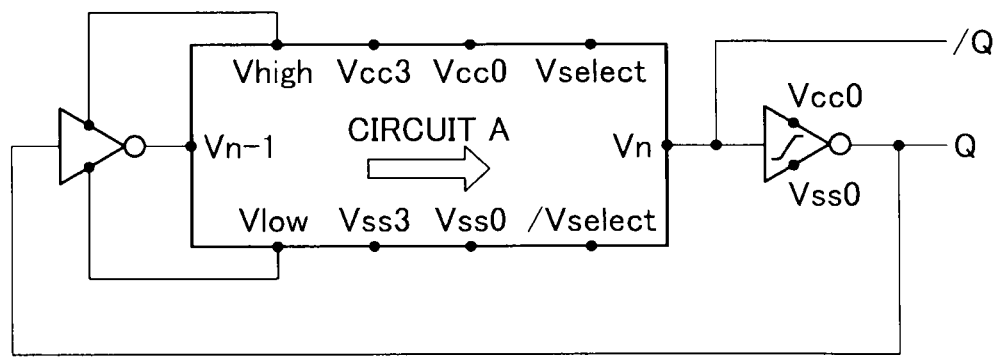

FIGS. 17(a) and 17(b) illustrate embodiments of a method for having a sequence circuit which is not of edge trigger type with a clock to have a nonvolatile memory function using the circuit A.

A plurality of sets, each of which is a minimum unit including the circuit A and NOT logic circuits connected to the front and the rear of the circuit A, namely, Vn−1 and Vn, are respectively connected to form a gate loop. Since outputs of the NOT logic circuits can be mutually reinforced by forming the circuit A for each set, even though a power source potential drops to zero and then a memory holding period elapses, nonvolatile memory reliability of reproduction data, that is, complementary signals occurring at terminals Q and /Q is improved. The two field-effect transistors of an n-channel type and a p-channel type which constitute the NOT logic circuit which is connected to Vn−1, V high and V low may or may not have a memory holding function in their gate insulating structure (see JP-A, No. 2006-303293), and the two field-effect transistors of an n-channel type and a p-channel type which constitute the NOT logic circuit which is connected to Vn have a memory holding function in their gate insulating structure. A case in which the number of sets is two is illustrated in FIG. 17(a).

When the memory holding performance of the two nonvolatile memory field-effect transistors of an n-channel type and a p-channel type which have a memory holding function in their gate insulation structure is sufficiently high, the number of sets may be one as illustrated in FIG. 17(b). In this case, a degree of integration is improved since the number of transistors can be reduced.

Figure 17C:
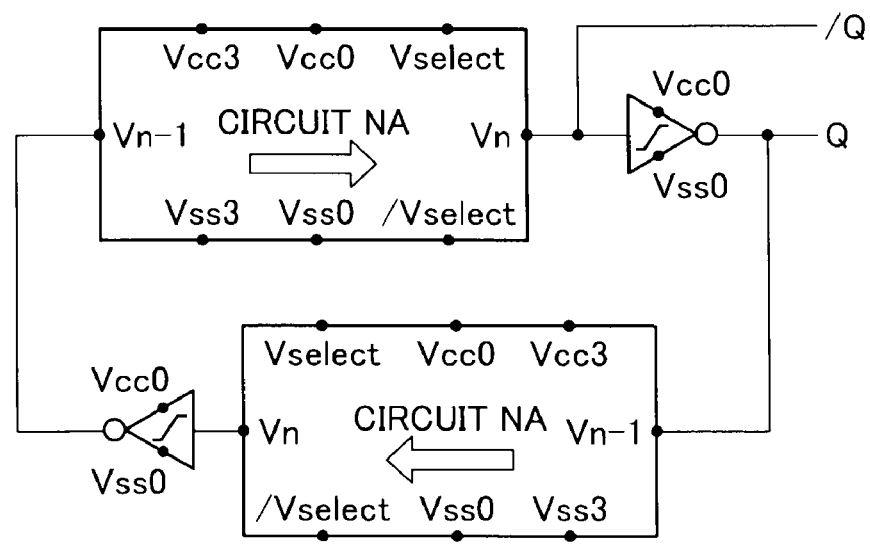
FIGS. 17(c) and 17(d) illustrate one embodiment and another embodiment of a method for having a sequence circuit which is not of edge trigger type with a clock to have a nonvolatile memory function using the circuit NA, respectively.
Figure 17D:
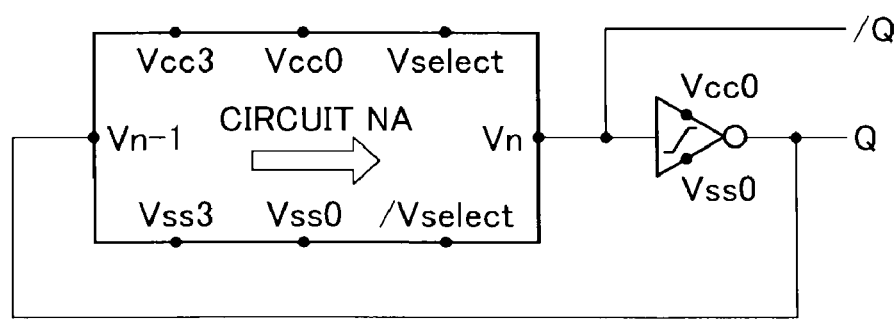

Similarly, FIGS. 17(c) and 17(d) illustrate embodiments of a method for making a sequence circuit which is not of edge trigger type with a clock have a nonvolatile memory function using the circuit NA.

Figure 18A:
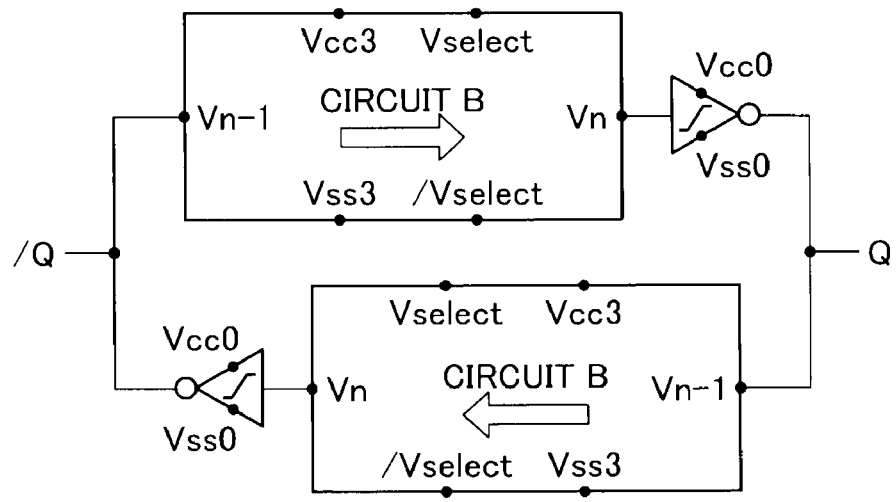
FIGS. 18(a) and 18(b) illustrate one embodiment and another embodiment of a method for having a sequence circuit which is not of edge trigger type with a clock to have a nonvolatile memory function using the circuit B, respectively.
Figure 18B:
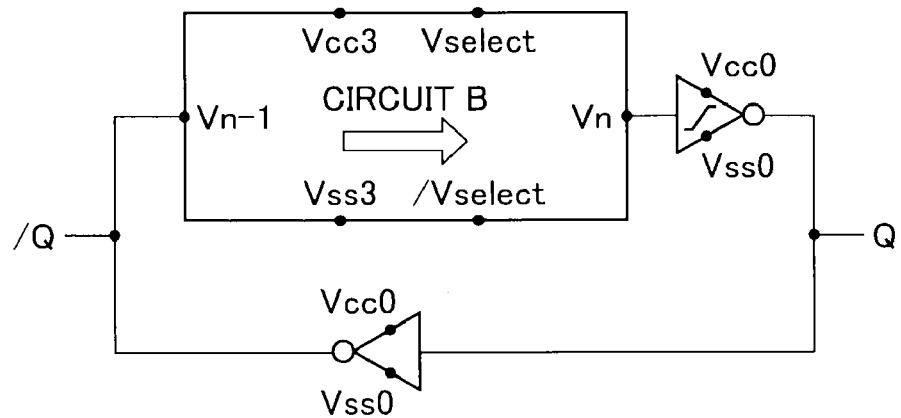

FIGS. 18(a) and 18(b) illustrate embodiments of a method for making a sequence circuit which is not of edge trigger type with a clock have a nonvolatile memory function using the circuit B.

An even number of sets each of which includes the circuit B and a NOT logic circuit which is constituted by two nonvolatile memory field-effect transistors of an n-channel type and a p-channel type in which a gate insulating structure has a memory holding function and connected to Vn of the circuit B are prepared and connected to form a gate loop. Since outputs of the NOT logic circuits can be mutually reinforced by forming the circuit B for each set, even though a power source potential drops to zero and then a memory holding period elapses, nonvolatile memory reliability of reproduction data, that is, complementary signals occurring at terminals Q and /Q is improved. A case in which the number of sets is two is illustrated in FIG. 18(a).

When the memory holding performance of the two nonvolatile memory field-effect transistors of an n-channel type and a p-channel type is sufficiently high, the circuit B may not be inserted into all gate input terminals which are loop-connected as illustrated in FIG. 18(b). That is, among an even number of sets each of which includes the circuit B and the nonvolatile NOT logic circuit which are connected to form a gate loop, part of at least one set may remain, the circuit B may be removed from the other set, and a NOT logic circuit which does not connect its input gate to the circuit B may be constituted by the nonvolatile memory field-effect transistors of an n-channel type and a p-channel type in which a gate insulating structure has a memory holding function or constituted by typical MOSFETs other than the nonvolatile memory field-effect transistors of an n-channel type and a p-channel type in which a gate insulating structure has a memory holding function (see JP-A No. 2006-303293). In this case, a degree of integration is improved since the number of transistors can be reduced.

Figure 18C:
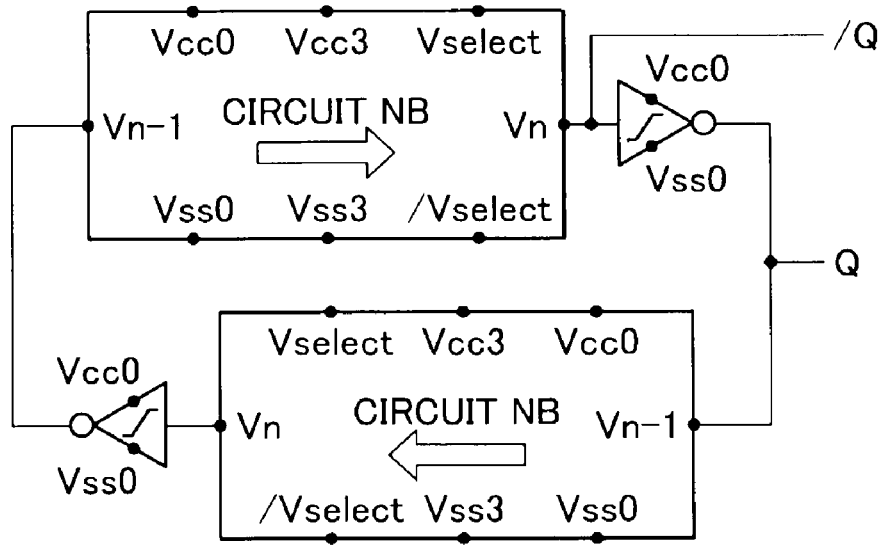
FIGS. 18(c) and 18(d) illustrate one embodiment and another embodiment of a method for having a sequence circuit which is not of edge trigger type with a clock to have a nonvolatile memory function using the circuit NB, respectively.
Figure 18D:
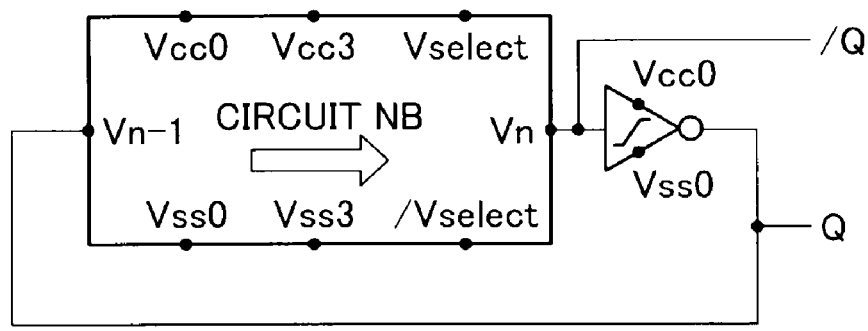

Similarly, FIGS. 18(c) and 18(d) illustrate embodiments of a method for having a sequence circuit which is not of edge trigger type with a clock to have a nonvolatile memory function using the circuit NB.

Figure 19A:
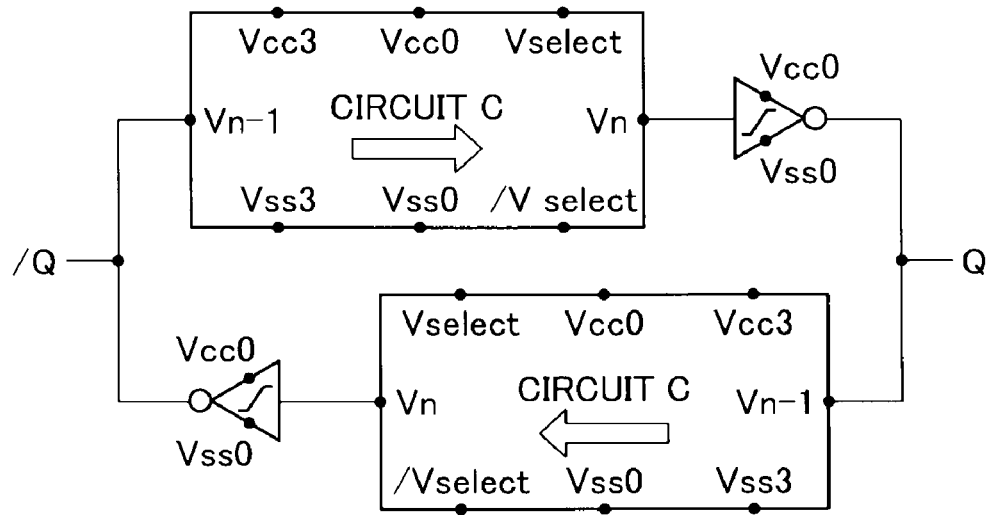
FIGS. 19(a) and 19(b) illustrate one embodiment and another embodiment of a method for having a sequence circuit which is not of edge trigger type with a clock to have a nonvolatile memory function using the circuit C, respectively.
Figure 19B:
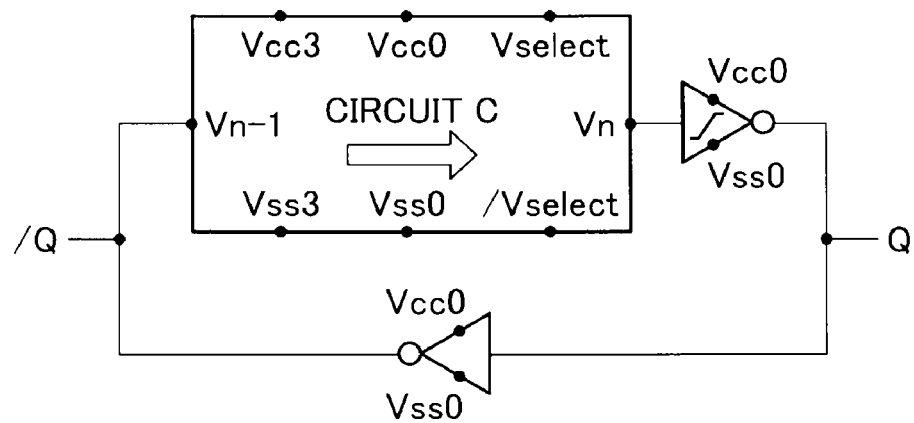

FIGS. 19(a) and 19(b) illustrate embodiments of a method for having a sequence circuit which is not of edge trigger type with a clock to have a nonvolatile memory function using the circuit C.

An even number of sets each of which includes the circuit C and a NOT logic circuit which is constituted by two nonvolatile memory field-effect transistors of an n-channel type and a p-channel type in which a gate insulating structure has a memory holding function and connected to Vn of the circuit C are prepared and connected to form a gate loop. Since outputs of the NOT logic circuits can be mutually reinforced by forming the circuit C for each set, even though a power source potential drops to zero and then a memory holding period elapses, nonvolatile memory reliability of reproduction data, that is, complementary signals occurring at terminals Q and /Q is improved. A case in which the number of sets is two is illustrated in FIG. 19(a).

When the memory holding performance of the two nonvolatile memory field-effect transistors of an n-channel type and a p-channel type is sufficiently high, the circuit B may not be inserted into all gate input terminals which are loop-connected as illustrated in FIG. 19(b). That is, among an even number of sets each of which includes the circuit C and the nonvolatile NOT logic circuit which are connected to form a gate loop, part of at least one set may remain, the circuit C may be removed from the other set, and a NOT logic circuit which does not connect its input gate to the circuit B may be constituted by the nonvolatile memory field-effect transistors of an n-channel type and a p-channel type in which a gate insulating structure has a memory holding function or constituted by typical MOSFETs other than the nonvolatile memory field-effect transistors of an n-channel type and a p-channel type in which a gate insulating structure has a memory holding function (Japanese Patent Application No. 2005-124805). In this case, a degree of integration is improved since the number of transistors can be reduced.

Figure 19C:
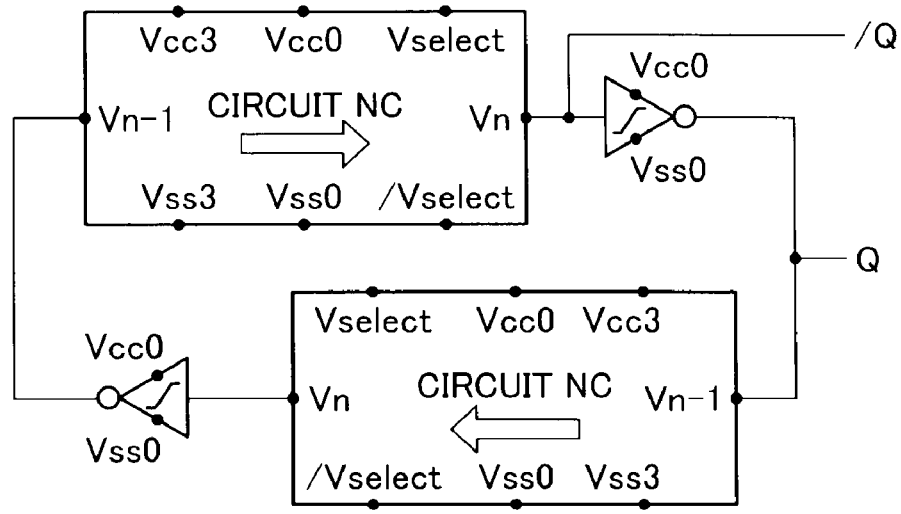
FIGS. 19(c) and 19(d) illustrate one embodiment and another embodiment of a method for having a sequence circuit which is not of edge trigger type with a clock to have a nonvolatile memory function using the circuit NC, respectively.
Figure 19D:
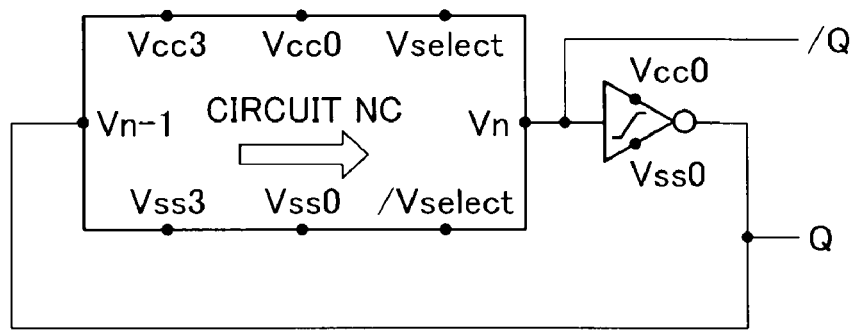

Similarly, FIGS. 19(c) and 19(d) illustrate embodiments of a method for having a sequence circuit which is not of edge trigger type with a clock to have a nonvolatile memory function using the circuit NC.

The methods for having a sequence circuit which is not of edge trigger type with a clock to have a nonvolatile memory function have been described above, but when a plurality of state detection enhancement circuits are included in each of these gate loops, the circuit A, the circuit NA, the circuit B, the circuit NB, the circuit C, and the circuit NC may be mixed.

According to the present invention, a sequence circuit which is not of edge trigger type with a clock can have a nonvolatile memory function as described above. Therefore, according to the present invention, a memory array constituted by the sequence circuit which is not of the edge trigger type with a clock can also have a nonvolatile memory function.

Next, embodiments of a memory cell and a memory cell array which has a nonvolatile memory function through a state detection enhancement circuit according to the present invention will be described.

First, an embodiment of having a memory cell which has a configuration in which one cell has eight transistors and a temporal memory function to have a nonvolatile memory function according to the present invention will be described. Here, a temporal memory function refers to a function of holding an output potential insofar as a power source potential is supplied even if an input potential is not externally applied.

Figure 20A:
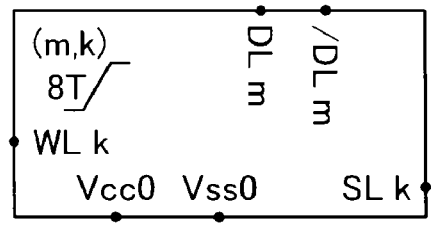
FIGS. 20A(a) and 20A(b) illustrate a symbol and an equivalent circuit diagram of one unit memory cell of a memory cell in which a temporal memory function and a nonvolatile memory function can be switched and one cell has eight transistors, respectively.
Figure 20A:
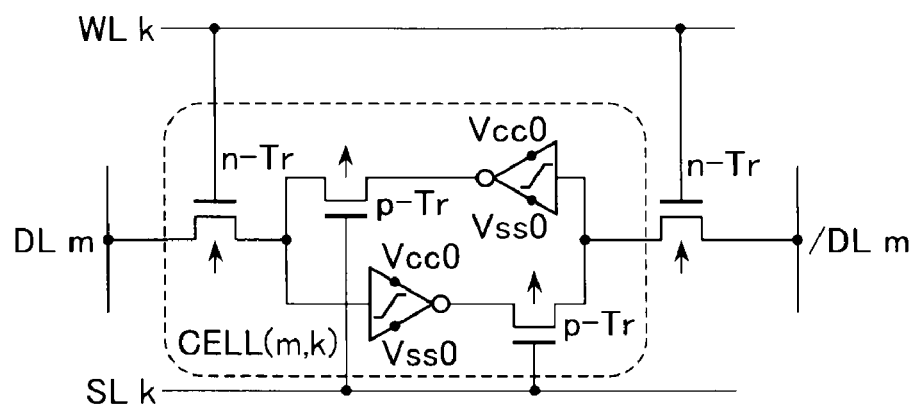

FIGS. 20A(a) and 20A(b) illustrate a configuration example of one memory cell. A latch circuit section which is in charge of a memory function is constituted by two nonvolatile memory field-effect transistors of an n-channel type and a p-channel type in which a gate insulating structure has a memory holding function, and two n-channel MOSFETs in which a gate insulating structure does not have a memory holding function are added as access transistors for controlling reading and writing operations. A nonvolatile selection transistor which disconnects a ring-shaped connection of the latch circuit when a nonvolatile memory operation is performed is added. The access transistor may be a p-channel MOSFET, and in this case, logical correspondence between an ON-OFF of access and a high potential-low potential of a word line is opposite to that of the cell of FIG. 20A(b). A field-effect transistor in which a gate insulating structure has a memory holding function may be used as the access transistor.

An embodiment in which memory cells of FIGS. 20A(a) and 20A(b) are repetitively disposed lengthwise and crosswise in the form of an array, and memory cells connected to a common word line are connected to the circuits NB to have a respective nonvolatile memory function is illustrated in FIG. 20B(c). According to the above-described method, a memory cell which has a configuration in which each cell includes eight transistors and has a temporal memory function can have a nonvolatile memory function. Also, the same function can be realized using the circuit B, A, NA, C, or NC instead of the circuit NB.

Figure 21A:
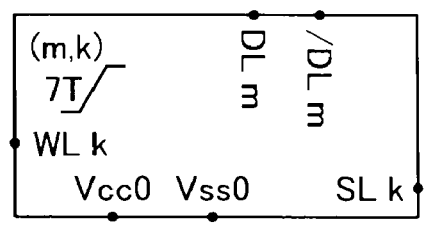
FIGS. 21A(a) and 21A(b) illustrate a symbol and an equivalent circuit diagram of one unit memory cell of a memory cell in which a temporal memory function and a nonvolatile memory function can be switched and one cell has seven transistors, respectively.
Figure 21A:
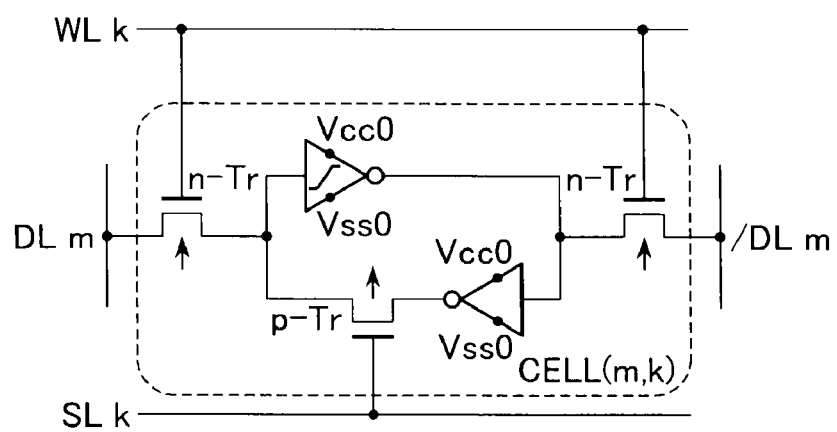

When only one of two NOT logic circuits which constitute a latch circuit section having a memory function illustrated in FIG. 20A(b) has a nonvolatile memory function, since a ring-shaped connection of the latch circuit can be disconnected by one nonvolatile selection transistor when a nonvolatile memory operation is performed as illustrated in FIG. 21A(b), a memory cell having a configuration in which one cell has seven transistors can be implemented. At this time, a field-effect transistor in which a gate insulating structure has a memory holding function may be used in a circuit other than a nonvolatile memory circuit.

Figure 21B:
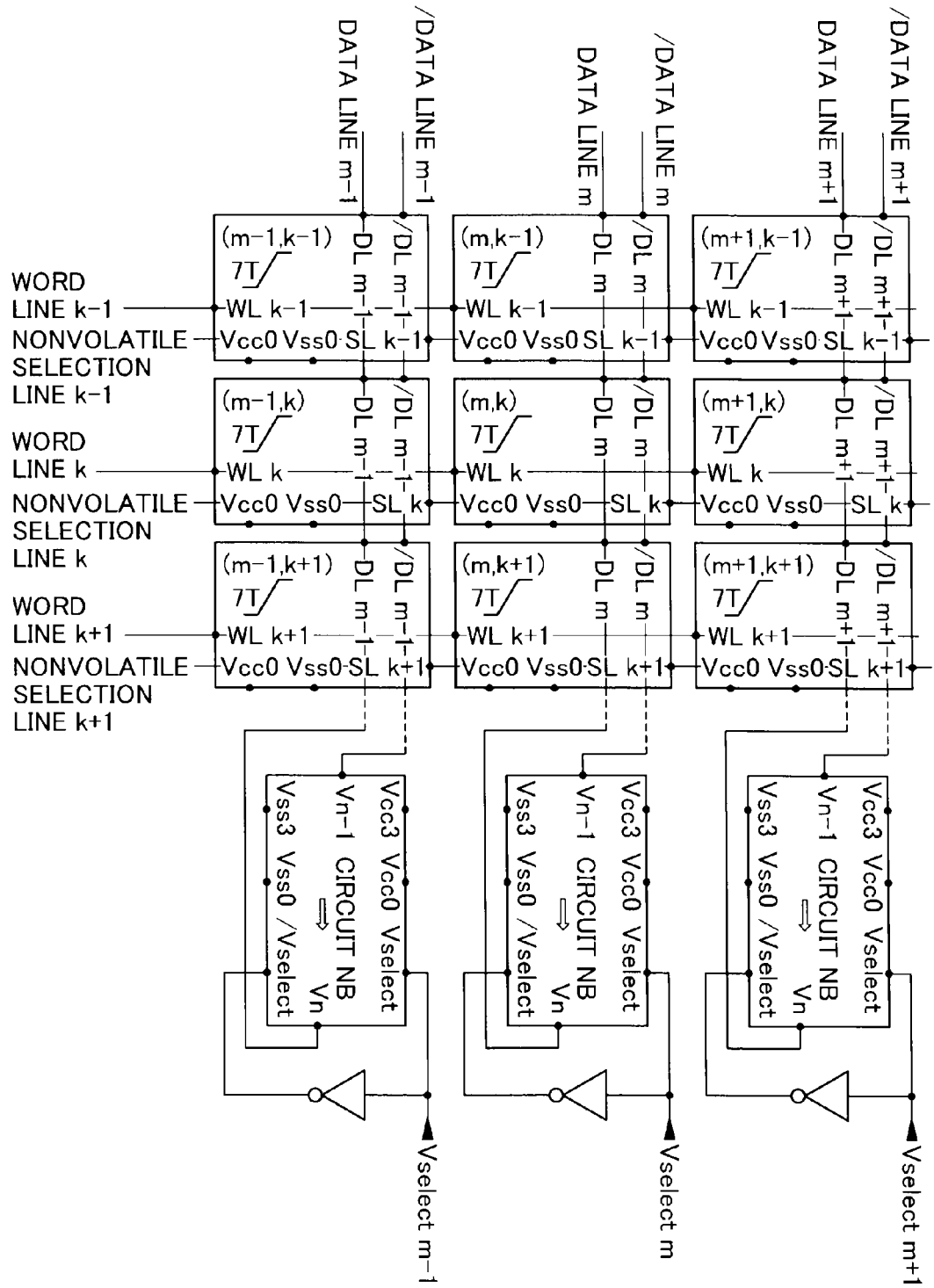
FIG. 21B(c) illustrates an embodiment in which a gate loop type memory array in which one cell has seven transistors has a nonvolatile memory function according to the present invention.

An embodiment in which memory cells of FIGS. 21A(a) and 21A(b) are repetitively disposed lengthwise and crosswise in the form of an array, and memory cells connected to a common word line are connected to the circuits NB to have a respective nonvolatile memory function is illustrated in FIG. 21B(c). Only one of two NOT logic circuits which constitute a latch circuit section having a memory function illustrated in FIG. 21A(b) has a nonvolatile memory function, and thus one state detection enhancement circuit NB per one column is connected to complementary data lines as illustrated in FIG. 21B(c). According to the above-described method, a memory cell which has a configuration in which one cell has seven transistors and a temporal memory function can have a nonvolatile memory function. The same function can be realized by the circuit B, A, NA, C, or NC instead of the circuit NB.

Next, an embodiment of having a memory cell which has a configuration in which one cell has five transistors and a temporal memory function to have a nonvolatile memory function according to the present invention will be described.

Figure 22A:
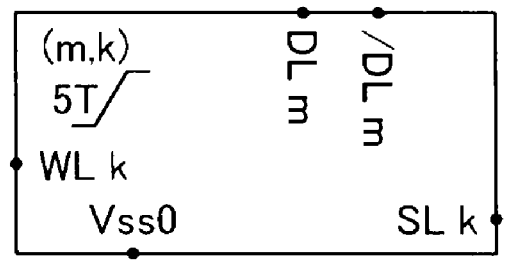
FIGS. 22A(a) and 22A(b) illustrate a symbol of one unit memory cell of a memory cell in which a temporal memory function and a nonvolatile memory function can be switched and one cell has five transistors and an equivalent circuit diagram of FIG. 22A(a), respectively, and FIGS. 22A(c) and 22A(d) illustrate a symbol of one unit memory cell of a memory cell in which a temporal memory function and a nonvolatile memory function can be switched and one cell has five transistors and an equivalent circuit diagram of FIG. 22A(c), respectively.
Figure 22A:
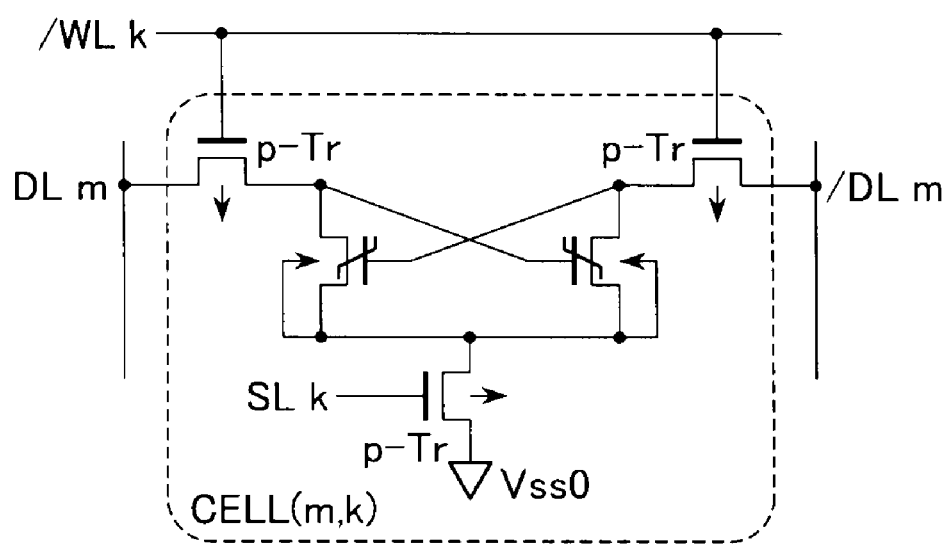
Figure 22A:
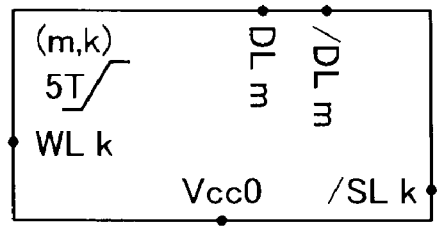
Figure 22A:
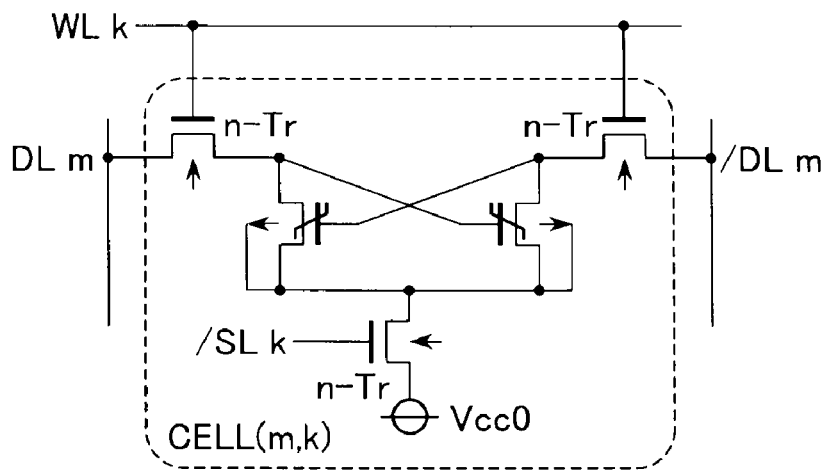

FIGS. 22A(a), 22A(b), 22A(c), and 22A(d) illustrate configuration examples of one memory cell. A section which is in charge of a memory function is constituted by two nonvolatile memory field-effect transistors of an n-channel type or a p-channel type in which a gate insulating structure has a memory holding function, and two n-channel or p-channel MOSFETs in which a gate insulating structure does not have a memory holding function are added as access transistors for controlling reading and writing operations. A nonvolatile selection transistor which disconnects a connection of a source terminal and a power source potential of two field-effect transistors which are in charge of a memory function when a nonvolatile memory operation is performed is added.

According to logic of the access transistor, FIGS. 22A(a) and 22A(b) are opposite in logical correspondence between an ON-OFF of access and a high potential-low potential of a word line to FIGS. 22A(c) and 22A(d). A field-effect transistor in which a gate insulating structure has a memory holding function may be used as the access transistor.

An embodiment in which memory cells of FIGS. 22A(a) and 22A(b) are repetitively disposed lengthwise and crosswise in the form of an array, and memory cells connected to a common word line are connected to the circuits NB so that each of the memory cells has a nonvolatile memory function is illustrated in FIG. 22B(e). Compared to the foregoing memory array which has the configuration in which each cell has eight or seven transistors and a nonvolatile memory function, since a power source potential supply line per cell is short and the number of transistors per cell is small, a degree of integration is high, while since an electric potential difference read out to complementary data lines becomes small, a signal amplifier having higher accuracy is required. According to the above-described method, a memory cell which has a configuration in which one cell includes five transistors and a temporal memory function can have a nonvolatile memory function. Also, the same function can be realized using the circuit B, A, NA, C, or NC instead of the circuit NB.

Next, an embodiment of making a memory cell which has a configuration in which one cell has three transistors have a nonvolatile memory function according to the present invention will be described.

Figure 23A:
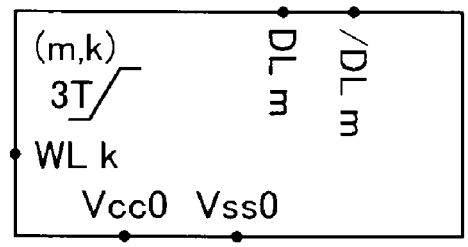
FIGS. 23A(a) and 23A(b) illustrate a symbol and an equivalent circuit diagram of one unit memory cell of a nonvolatile memory cell in which one cell has three transistors, respectively.
Figure 23A:
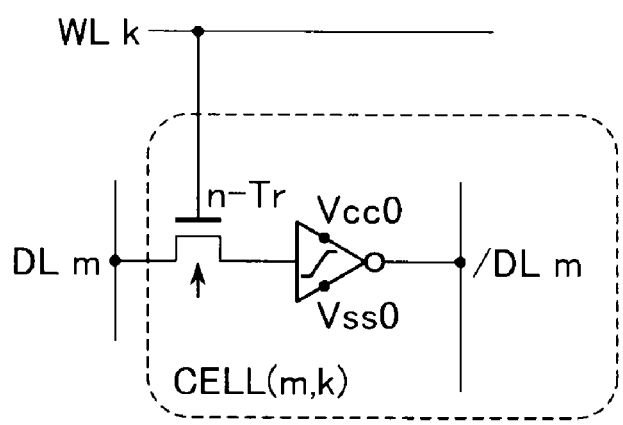

FIGS. 23A(a) and 23A(b) illustrate a configuration example of one memory cell. A NOT logic circuit which is in charge of a memory function is constituted by two nonvolatile memory field-effect transistors of an n-channel type and a p-channel type in which a gate insulating structure has a memory holding function, and one n-channel MOSFET in which a gate insulating structure does not have a memory holding function is added as an access transistor for controlling reading and writing operations. Since the present memory cell of FIG. 23A(b) does not have a temporal memory function, a nonvolatile selection transistor is not necessary. In FIG. 23A(b), since two electric potential which are greatly different from each other, that is, Vcc0 or Vss0, are read out to /DLm according to a memory state during memory reading after nonvolatile memory holding, it is easy to identify two memory values. The access transistor may be a p-channel MOSFET, and in this case, logical correspondence between an ON-OFF of access and a high potential-low potential of a word line is opposite to that of the cell of FIG. 23A(b). A field-effect transistor in which a gate insulating structure has a memory holding function may be used as the access transistor.

Figure 23B:
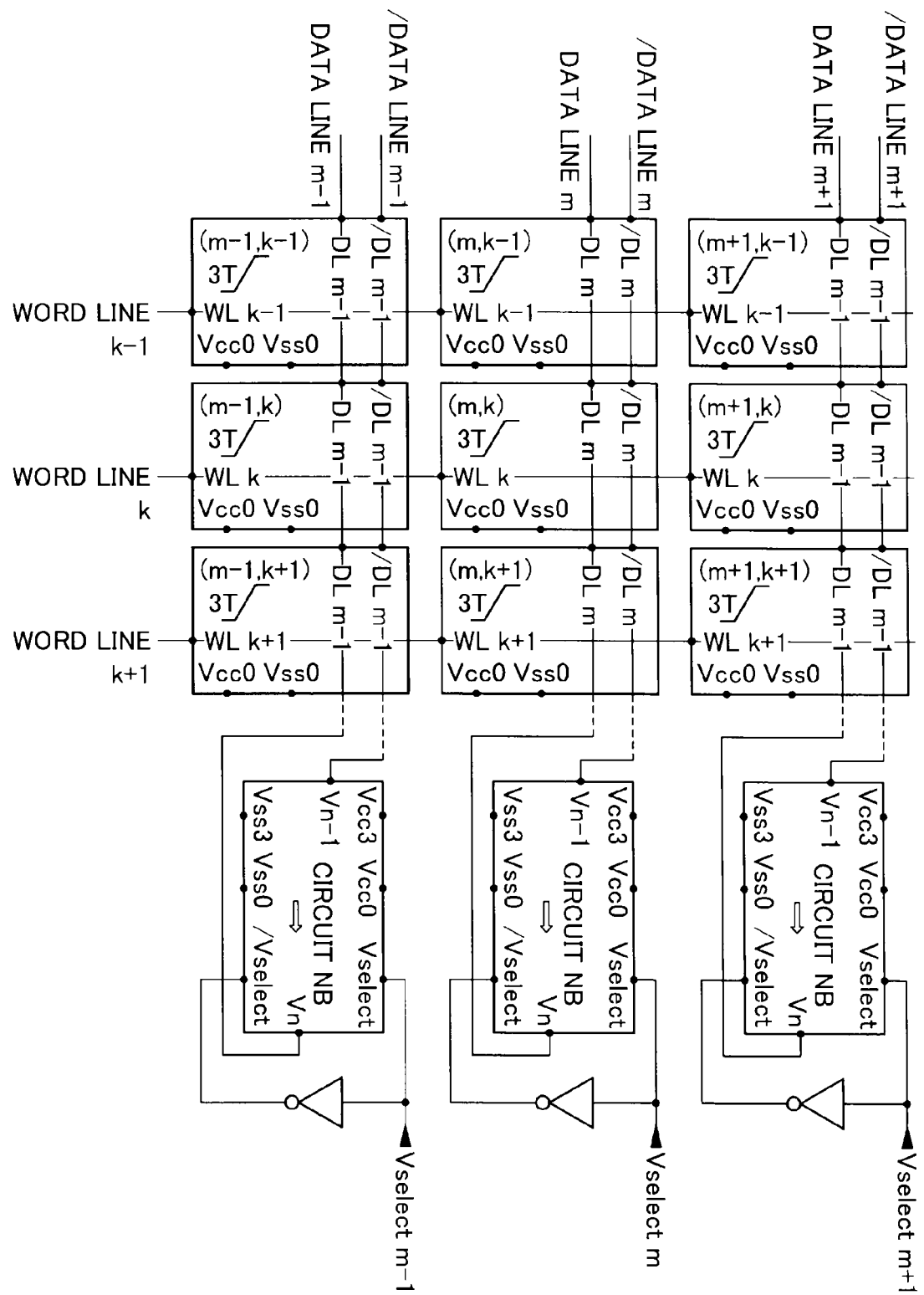
FIG. 23B(c) illustrates an embodiment in which a gate loop type memory array in which one cell has five transistors has a nonvolatile memory function according to the present invention.

An embodiment in which memory cells of FIGS. 23A(a) and 23A(b) are repetitively disposed lengthwise and crosswise in the form of an array, and each of memory cells connected to a common word line is connected to the circuits NB to have a nonvolatile memory function is illustrated in FIG. 23B(c). According to the above-described method, a memory cell having a configuration in which one cell has three transistors can have a nonvolatile memory function. The same function can be realized by the circuit B, A, NA, C, or NC instead of the circuit NB.

Next, an embodiment of making a memory cell having a configuration in which one cell has two transistors have a nonvolatile memory function according to the present invention will be described.

Figure 24A:
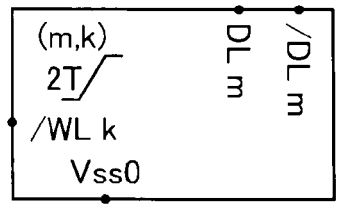
FIGS. 24A(a), 24A(b) and 24A(c) illustrate a symbol, an equivalent circuit diagram and another equivalent circuit diagram of one unit memory cell of a nonvolatile memory cell in which one cell has two transistors, respectively.
Figure 24A:
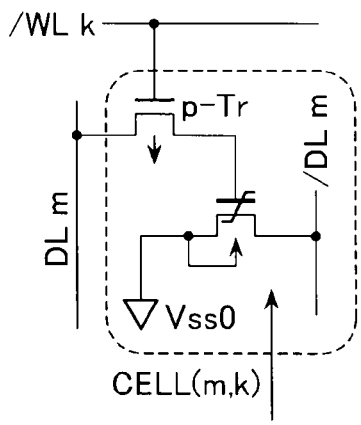
Figure 24A:
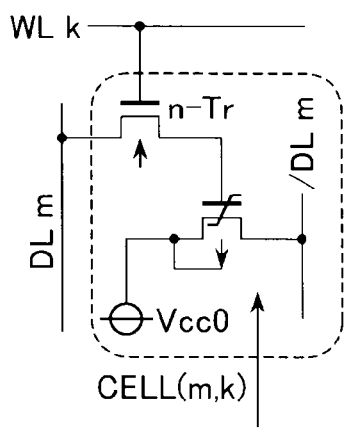
Figure 24B:
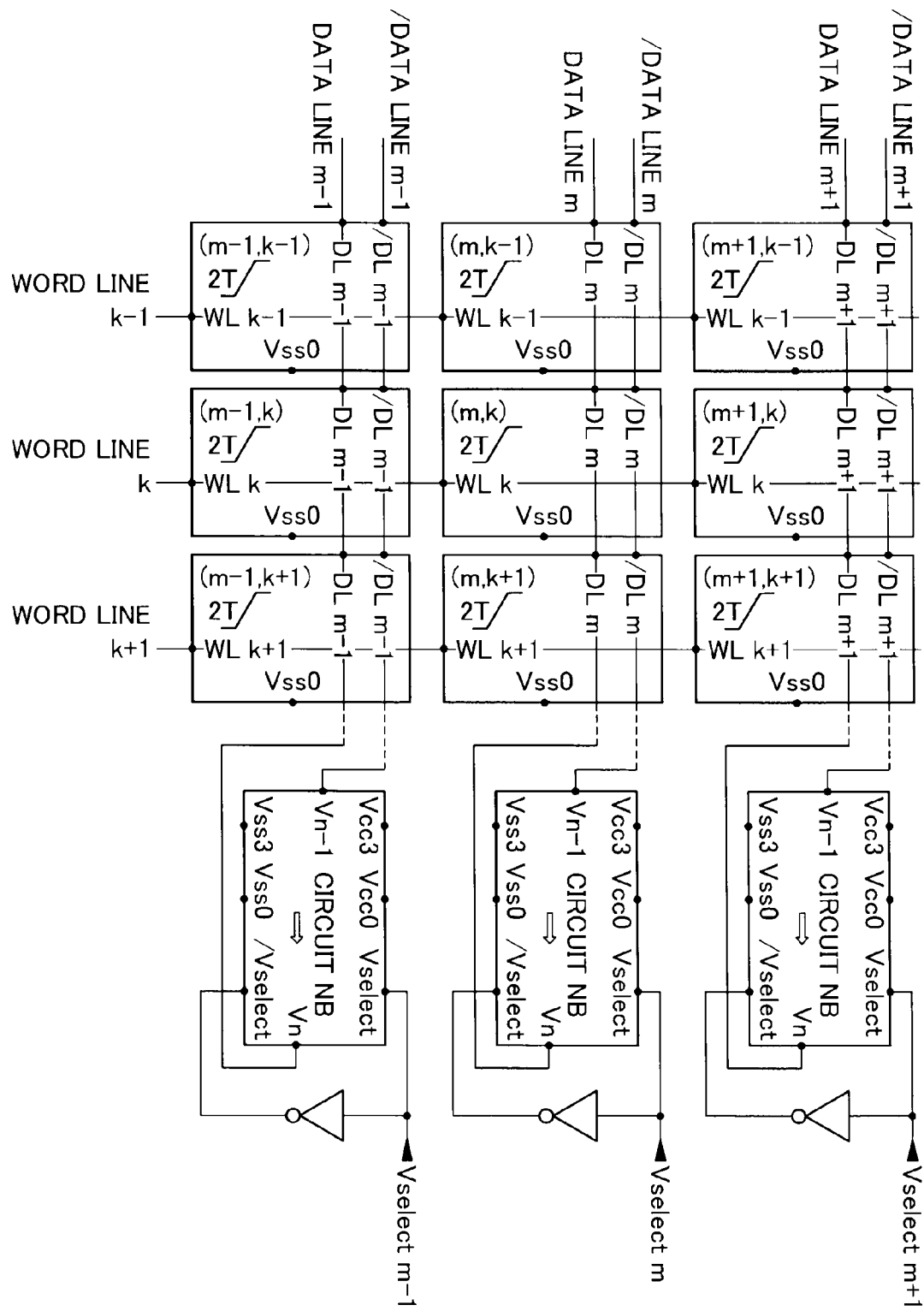
FIG. 24B(d) illustrates an embodiment in which a gate loop type memory array in which one cell has two transistors has a nonvolatile memory function according to the present invention.
Figure 25A:
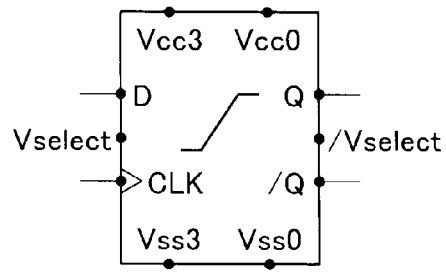
FIGS. 25(a), 25(b), 25(c), and 25(d) illustrate a circuit symbol, an equivalent circuit diagram of one embodiment, an equivalent circuit diagram of anther embodiment, and an equivalent circuit diagram of still another embodiment of a D flip-flop which is one example of a sequence circuit of edge trigger type with a clock which has a nonvolatile memory function according to the present invention.
Figure 25B:
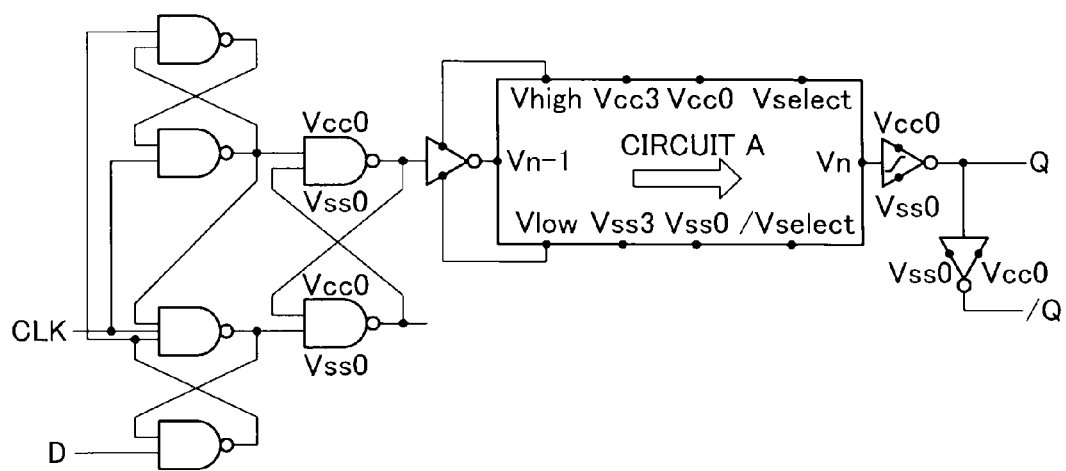
Figure 25C:
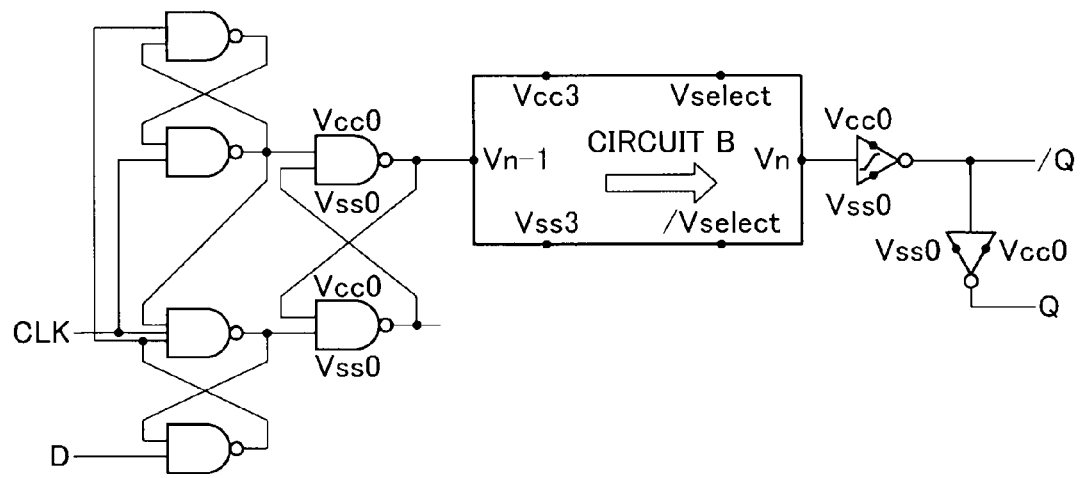
Figure 25D:
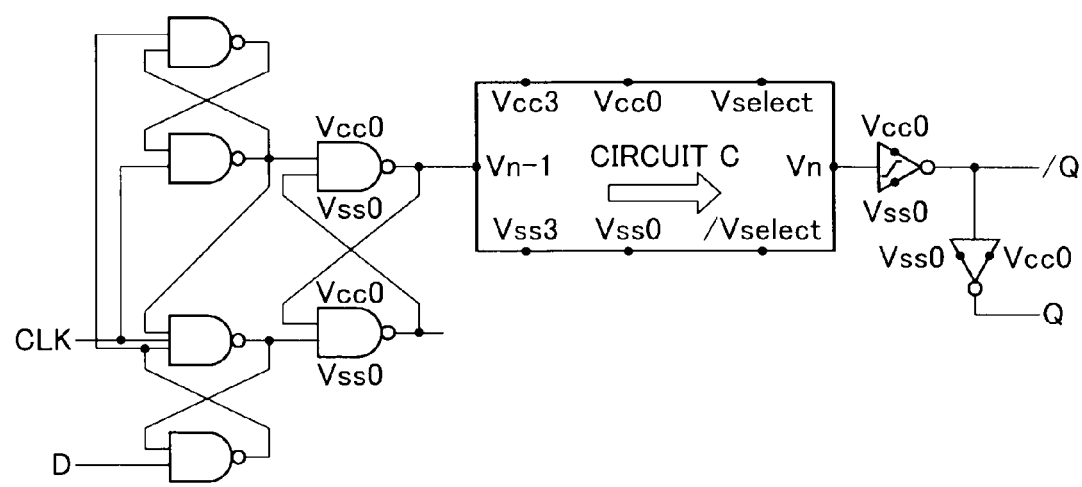
Figure 26A:
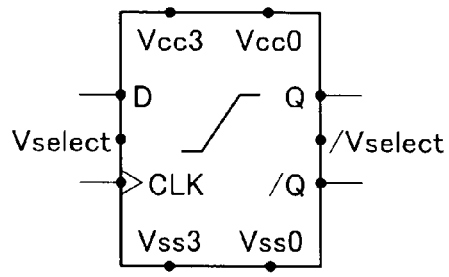
FIGS. 26(a), 26(b), 26(c), and 26(d) illustrate a circuit symbol, an equivalent circuit diagram of one embodiment, an equivalent circuit diagram of anther embodiment, and an equivalent circuit diagram of still another embodiment of a D flip-flop which is one example of a sequence circuit of edge trigger type with a clock which has a nonvolatile memory function according to the present invention.
Figure 26B:
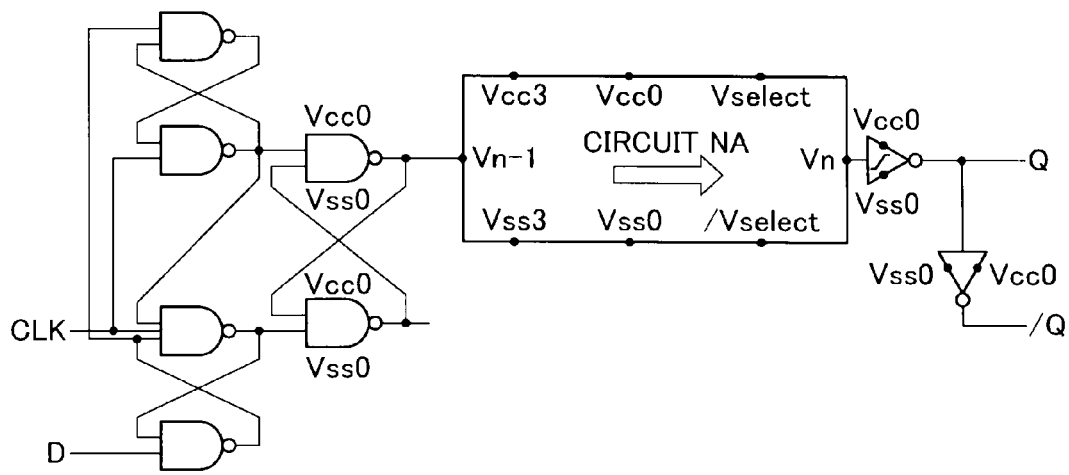
Figure 26C:
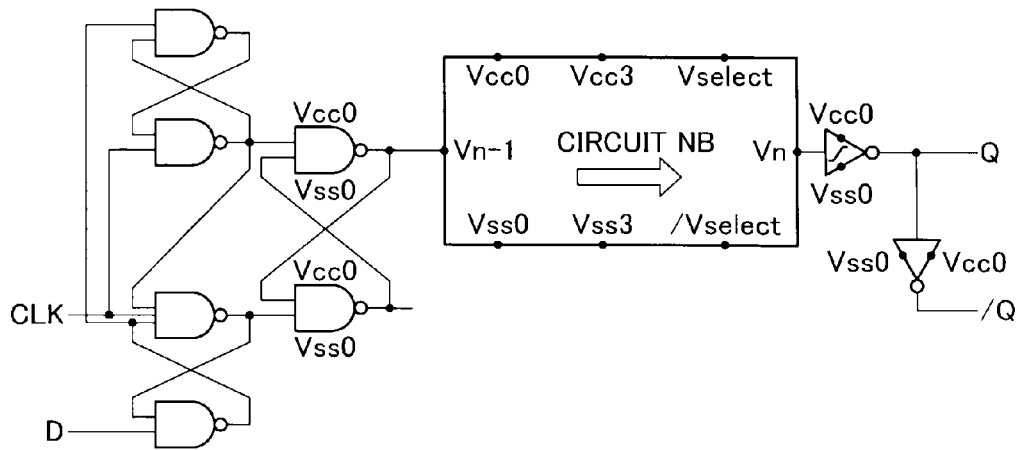
Figure 26D:
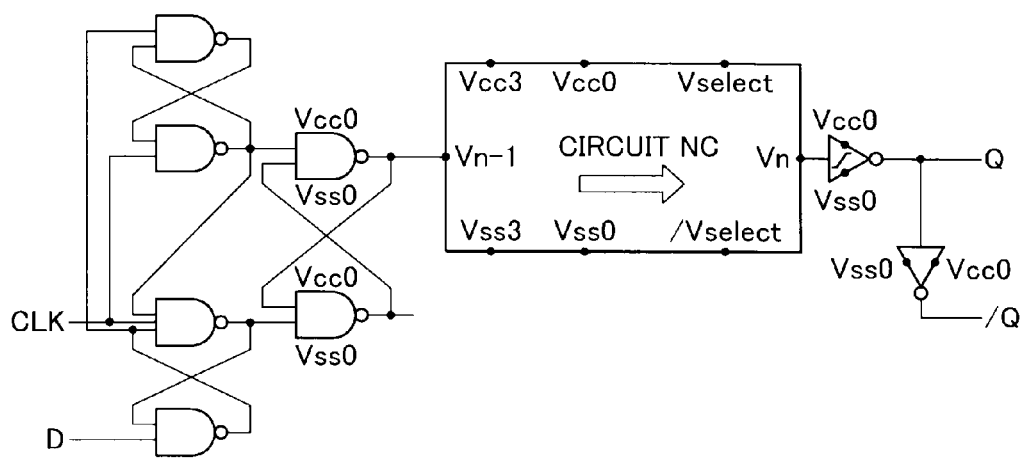

FIGS. 24A(a), 24A(b) and 24A(c) illustrate configuration examples of one memory cell. A nonvolatile memory field-effect transistor of an n-channel type or a p-channel type in which a gate insulating structure has a memory holding function is in charge of a memory function, and one n-channel or p-channel MOSFET in which a gate insulating structure does not have a memory holding function is added as an access transistor for controlling reading and writing operations. Since the present memory cells of FIGS. 24A(b) and 24A(c) do not have a temporal memory function, a nonvolatile selection transistor is not necessary. The access transistor may be any of a p-channel MOSFET and an n-channel MOSFET, and logical correspondence between an ON-OFF of access and a high potential-low potential of a word line is appropriately determined according to logic of the access transistor. A field-effect transistor in which a gate insulating structure has a memory holding function may be used as the access transistor. During memory reading after nonvolatile memory holding, in the cell of FIG. 24A(b), two memory values are determined based on whether or nor /DLm is short-circuited with Vss0, and in the cell of FIG. 24A(c), two memory values are determined based on whether or nor/DLm is short-circuited with Vcc0. An embodiment in which memory cells of FIGS. 24A(b) and 24A(c) are repetitively disposed lengthwise and crosswise in the form of an array, and memory cells connected to a common word line are connected to the circuits NB to have a respective nonvolatile memory function is illustrated in FIG. 24B(d). According to the above-described method, a memory cell having a configuration in which one cell has two transistors can have a nonvolatile memory function. The same function can be realized by the circuit B, A, NA, C, or NC instead of the circuit NB.

According to the present invention, a memory array circuit can have a nonvolatile memory function as described above.

In particular, in the case in which a memory array having a temporal memory function can have a nonvolatile memory function, an SRAM-type memory array circuit having high access speed can be replaced with a memory array of the present invention. The SRAM-type memory array circuit is solely used as a random access memory and may be also embedded in a processor as a cache memory. According to the conventional art, since a cache memory is a temporal memory circuit which does not have a nonvolatile memory function and so loses data when a power source becomes zero, necessary data has to be evacuated to an external memory device before a power source potential becomes zero.

If a cache memory can have a nonvolatile memory function according to the present invention, for example, a cache memory is divided into several areas, a power source potential of an area in which there is no access among those areas finely drops to zero only when there is no access, so that a power source can be flexibly supplied according to a processing load. Accordingly, power consumption caused by a leakage current in the standby state of a transistor which constitutes a memory cell is reduced, and data can be retained without a loss.

Also, Since data does not need to be evacuated to an external memory device when a power source of a cache memory drops to zero, electric power and time which are expended in charge and discharge of electric resistance and electric capacitance (RC) of a plurality of wirings which connect the cache memory with the external memory device can be saved. Furthermore, since there is no need for preparing a memory area of the external memory device for data evacuated from the cache memory, the memory capacity of the external memory device can be reduced. If a circuit of a cache memory is designed to forcibly changing V select to High when a power source potential becomes zero, important data is not lost even though an accident such as a power failure during a computation occurs.

According to the present invention, a sequence circuit of edge trigger type with a clock can have a nonvolatile function. Embodiments in which a D flip-flop which is one example of a sequence circuit of edge trigger type with a clock has a nonvolatile memory function according to the present invention are illustrated in FIGS. 25(a), 25(b), 25(c), 25(d) and FIGS. 26(a), 26(b), 26(c), and 26(d). In FIGS. 25(a), 25(b), 25(c), 25(d) and FIGS. 26(a), 26(b), 26(c), and 26(d), for simplicity, an input terminal of a forced set signal such as a clear signal or a preset signal is not illustrated.

In the embodiments of FIGS. 25(a), 25(b), 25(c), 25(d) and FIGS. 26(a), 26(b), 26(c), and 26(d), complementary output signals Q and /Q of the D flip-flop circuits are nonvolatilely stored by applying the state detection enhancement circuits A, NA, B, NB, C, or NC. All or some of the D flip-flop circuits may be constituted by two nonvolatile memory field-effect transistors of an n-channel type and a p-channel type in which a gate insulating structure has a memory holding function.

In the same method according to the present invention, a sequence circuit of edge trigger type with a clock employing other types of flips flops instead of the D flip flop may have a nonvolatile memory function.

In the embodiments of FIGS. 25(b), 25(c) and 25(d) and FIGS. 26(b), 26(c) and 26(d), one of the complementary output signals of the D flip-flop is input to the state detection enhancement circuit A, NA, B, NB, C, or NC, but the other of the complementary output signals may be input to a separate state detection enhancement circuit A, NA, B, NB, C, or NC. In this case, a NOT logic circuit for generating complementary outputs which are connected to an output of a NOT logic circuit to which an output of the circuit A, NA, B, NB, C, or NC is input may not be disposed.

Since a sequence circuit of an edge trigger type with a clock can have a nonvolatile memory function as described above, a register circuit which is one application of a sequence circuit of an edge trigger type with a clock can also have a nonvolatile memory function according to the present invention.

Figure 27:
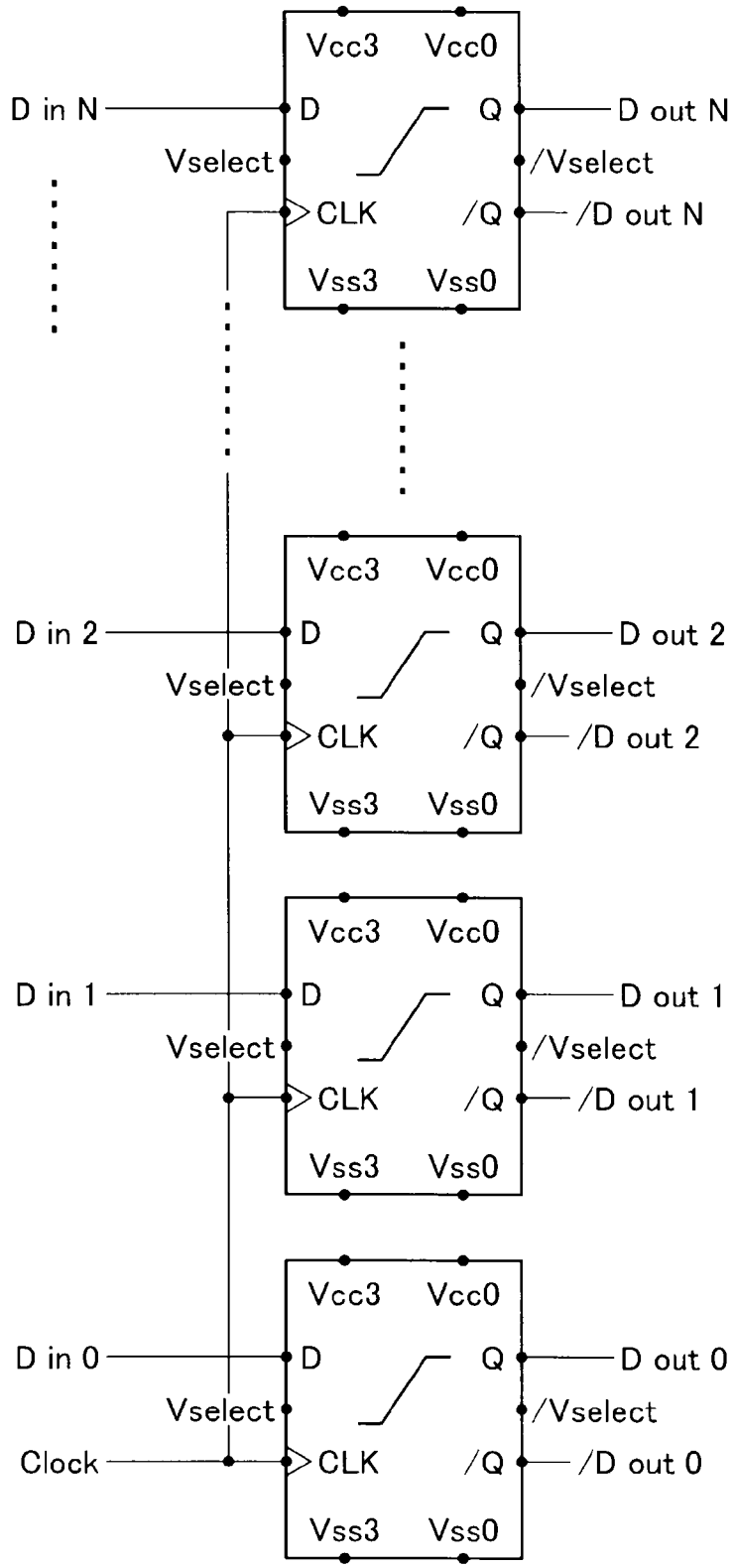
FIG. 27 is a block diagram of an embodiment of an N-bit register which has a nonvolatile memory function according to the present invention.

FIG. 27 illustrates an example of an equivalent circuit of an N-bit register circuit having a nonvolatile memory function according to the present invention. In FIG. 27, a register circuit is configured using a D flip-flop, but it is not limited to a D flip-flop, and a register circuit which is constituted by any other sequence circuit can have a nonvolatile memory function according to the present invention. The register circuit receives N-bit data at the moment when a clock rises or falls and outputs the N-bit data to the next stage circuit. The register circuits are scattered in computation function areas, are in a large-scale circuit aggregate which perform a complicated computation such as a processor or a microcomputer, and are connected to an input and an output of an operation circuit particularly among the areas in which a computation is performed. A conventional register circuit is a temporal memory circuit which does not have a nonvolatile memory function and so loses data when a power source becomes zero. If a register has a nonvolatile memory function according to the present invention, an interim result of a large-scale complicated computation performed by an operation circuit aggregate, that is, a small-scale computation result from an individual small-scale operation circuit which constitutes the operation circuit aggregate can be nonvolatilely stored without evacuating them to the external memory device. Therefore, even though a power source potential is restored when a power source potential becomes zero after a nonvolatile memory operation and then a predetermined time elapses, the small-scale computation result, that is, the interim result of the large-scale computation, can be immediately restored, and the large-scale computation can be continued based on the restored interim result.

According to the conventional art, since a register circuit which performs only a temporal memory operation is used, a large-scale computation has to be done from the beginning after a power source potential becomes zero, so that time and electric power are needed, but according to the present invention, a large-scale computation does not need to be done from the beginning again but can be resumed from the interim state, so that time and electric power can be saved. Even though power source potentials of all or part of computation function areas become zero and so the standby state is evoked without waiting for completion of a large-scale computation, when a power source potential is supplied again after the standby state is released, a large-scale computation can be resumed from the interim state. Therefore, when there is no new external input to the circuit aggregate and there is also no prompt external output request from the circuit aggregate, a zero electric potential of the power source is continuously maintained to maintain the standby state, and so a power source potential can be supplied flexibly according to a load, whereby power consumption can be reduced. Also, time and electric power expended when the register circuit accesses a cache memory gain to obtain an initial value necessary for a computation shortly after a processor is switched from the standby state to an operation state can be reduced. If the register circuit is designed to forcibly change V select to High when a power source potential becomes zero, important data is not lost even though an accident such as a power failure during a computation occurs.

According to the present invention, both a cache memory and a register circuit can have a nonvolatile memory function. Since both a cache memory and a register circuit can have a nonvolatile memory function, power consumption of an integrated circuit which includes an operation circuit having a register circuit and a cache memory can be reduced. A processor will be described below as an example of an integrated circuit which includes an operation circuit having a register circuit and a cache memory.

Figure 28A:
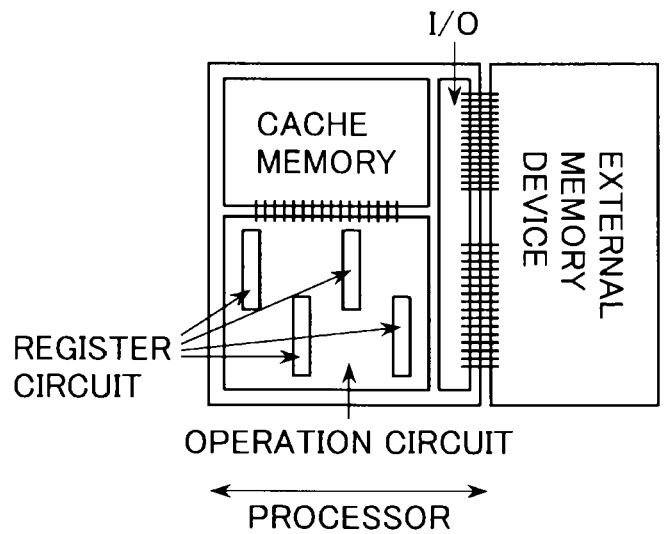
FIG. 28(a) is a block diagram of a conventional art.

As shown in FIG. 28(a), a conventional processor is a temporal memory circuit which loses data when an electric power becomes zero since both a cache memory and a register circuit do not have a nonvolatile memory function. At first, since the cache memory is a temporal memory circuit, part of data necessary for a computation had to be temporarily retained in a high-speed cache memory, and the remaining data had to be retained in an external memory device. In order to retain the data, a power source potential had to be continuously supplied to the cache memory even when there is no new access, or the data had to be evacuated to the external memory device when a power source potential of the cache memory becomes zero. Therefore, according to the conventional art, power consumption caused by a leakage current of the cache memory was high, and the memory capacity of the external memory device had to be secured in order to retain data corresponding to a final computation result and data corresponding to an interim computation result. Further, since the register was a temporal memory circuit, a power source potential of an operation circuit aggregate could not be made to become zero until all computations were completed and a final result was obtained, and when a power source potential became zero during a computation, even though a power source potential was supplied again, initial data necessary for a computation was obtained from the external memory device, and part of the data was obtained from the cache memory in order to restart a computation.

Figure 28B:
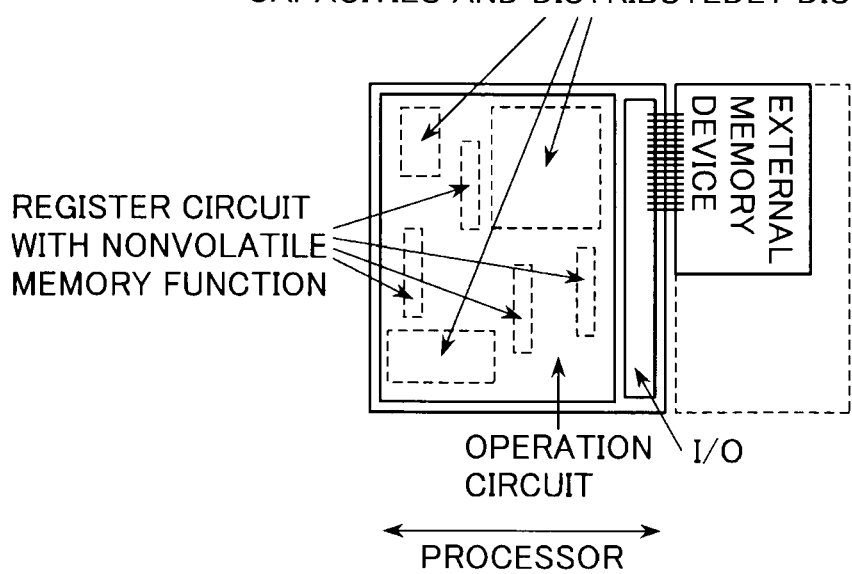
FIG. 28(b) is a block diagram of an embodiment in which a circuit which constitutes a processor has a nonvolatile memory function according to the present invention.

According to the present invention, both the cache memory and the register circuit of the processor have a nonvolatile memory function, and thus the above-described problems can be resolved. That is, power consumption caused by a leakage current of the cache memory does not occur in the standby state, so that electric power and time which are expended in charge and discharge of electric resistance and electric capacitance of wirings which connect the cache memory with the external memory device are not needed. Also, the memory capacity of the external memory device can be reduced, the standby state can be evoked by making a power source potential of the operation circuit aggregate become zero without waiting for completion of all computations, and the computation can be resumed from the interim state immediately before entering the standby state after a power source potential is supplied again. If the cache memory and the register circuit are designed to forcibly change V select to High when a power source potential becomes zero, important data is not lost even though an accident such as a power failure during a computation occurs. Also, according to the present invention, a cache memory is divided into several areas, a power source potential of an area in which there is no access among those areas finely drops to zero only when there is no access, so that a power source can be flexibly supplied according to a processing load. According to the embodiment of the present invention, when a cache memory having a configuration in which one cell has five transistors is used, both a temporal memory function and a nonvolatile memory function can be provided, and the number of transistors can be reduced compared to a conventional cache memory having a configuration in which one cell has six transistors. Also, according to the embodiment of the present invention, when a cache memory having a configuration in which one cell has two transistors is used, a nonvolatile memory function can be provided, and the number of transistors can be further reduced. Accordingly, even though the same process rule as the conventional art is used, a processor which has lower power consumption, higher speed operation and the smaller size than the conventional art can be realized. An embodiment of the present invention is illustrated in FIG. 28(b).

Between two nonvolatile memory field-effect transistors of an n-channel type and a p-channel type where a gate insulated structure necessary to implement present invention has a memory holding function, a ferroelectric gate FET is sufficient in the number of times to be rewritten by high-speed access and thus is suitable as a cache memory or a register.

The invention claimed is:
1. A semiconductor integrated circuit, comprising:
a state detection enhancement circuit which includes an input terminal and an output terminal and has a function of generating an electric potential of a magnitude capable of performing nonvolatile memory writing into a nonvolatile memory circuit based on an electric potential input to the input terminal and outputting the electric potential of the magnitude to the output terminal, wherein
the state detection enhancement circuit is a logical state detection enhancement circuit which comprises a control signal terminal and a switch circuit which is turned on or off by a control signal applied to the control signal terminal, and has a function of either applying an output potential of a logical state of an input potential applied to the input terminal to the output terminal or completely breaking off a correlation between the input potential and the output potential when the switch circuit is in an OFF state, and applying an output potential which has a logical state of the input potential and has a larger highest-lowest potential range including a possible highest-lowest potential range of the input potential to the output terminal when the switch circuit is in an ON state; and
the nonvolatile memory circuit which has a nonvolatile memory function and is connected to the output of the state detection enhancement circuit via an input terminal of the nonvolatile memory circuit.

2. The semiconductor integrated circuit according to claim 1, wherein the state detection enhancement circuit is a positive logical state detection enhancement circuit which comprises a control signal terminal and a switch circuit which is turned on or off by a control signal applied to the control signal terminal, and has a function of either applying an output potential of the same logical state as an input potential applied to the input terminal to the output terminal or completely breaking off a correlation between the input potential and the output potential when the switch circuit is in an OFF state, and applying an output potential which has the same logical state as the input potential and has a larger highest-lowest potential range including a possible highest-lowest potential range of the input potential to the output terminal when the switch circuit is in an ON state.

3. The semiconductor integrated circuit according to claim 1, wherein the state detection enhancement circuit is a negative logical state detection enhancement circuit which comprises a control signal terminal and a switch circuit which is turned on or off by a control signal applied to the control signal terminal, and has a function of either applying an output potential of an inverse logical state of an input potential applied to the input terminal to the output terminal or completely breaking off a correlation between the input potential and the output potential when the switch circuit is in an OFF state, and applying an output potential which has an inverse logical state of the input potential and has a larger highest-lowest potential range including a possible highest-lowest potential range of the input potential to the output terminal when the switch circuit is in an ON state.

4. The semiconductor integrated circuit according to any one of claims 1 to 3, wherein the nonvolatile memory circuit is constituted by nonvolatile memory field-effect transistors all or some of which have a memory holding function in a gate insulating structure.

5. The semiconductor integrated circuit according to claim 4, wherein the nonvolatile memory field-effect transistor which has the memory holding function in the gate insulating structure is of n-channel type or p-channel type, and the re-channel type includes a gate terminal connected to a gate conductor, a drain terminal connected to an n-type semiconductor drain region, a source terminal connected to an n-type semiconductor source region, and a substrate terminal connected to a p-type semiconductor substrate, and the p-channel type includes a gate terminal connected to a gate conductor, a drain terminal connected to a p-type semiconductor drain region, a source terminal connected to a p-type semiconductor source region, and a substrate terminal connected to an n-type semiconductor substrate.

6. The semiconductor integrated circuit according to claim 4, wherein the state detection enhancement circuit applies at least two high potentials which are different in height from each other to at least one of four terminals of the nonvolatile memory field-effect transistor which has the memory holding function in the gate insulating structure, that is, a gate terminal, a substrate terminal, a source terminal, and a drain terminal.

7. The semiconductor integrated circuit according to claim 4, wherein the state detection enhancement circuit applies at least two low potentials which are different in height from each other to at least one of four terminals of the nonvolatile memory field-effect transistor which has the memory holding function in the gate insulating structure, that is, a gate terminal, a substrate terminal, a source terminal, and a drain terminal.

8. The semiconductor integrated circuit according to claim 4, wherein the nonvolatile memory circuit comprises one or more input terminals, one or more output terminals and the nonvolatile memory field-effect transistors of either or both of an re-channel type and a p-channel type, has a gate terminal of at least one of the nonvolatile memory field-effect transistors as one of the input terminals and a drain terminal of at least one of the nonvolatile memory field-effect transistors as one of the output terminals, and connects a source terminal of at least one of the nonvolatile memory field-effect transistors to a power source potential terminal.

9. The semiconductor integrated circuit according to claim 4, wherein the nonvolatile memory circuit comprises one or more input terminals, one or more output terminals and the nonvolatile memory field-effect transistors of an n-channel type and a p-channel type, and has a short-circuited connection between a gate terminal of at least one of the nonvolatile memory field-effect transistors of the n-channel type and a gate terminal of at least one of the nonvolatile memory field-effect transistors of the p-channel type as one of the input terminals and a short-circuited connection between a drain terminal of at least one of the nonvolatile memory field-effect transistors of the n-channel type and a drain terminal of at least one of the nonvolatile memory field-effect transistors of the p-channel type as one of the output terminals, a source terminal of at least one of the nonvolatile memory field-effect transistors of the n-channel type is connected to a low potential power source terminal, and a source terminal of at least one of the nonvolatile memory field-effect transistors of the p-channel type is connected to a high potential power source terminal.

10. The semiconductor integrated circuit according to claim 9, wherein the nonvolatile memory field-effect transistor of the n-channel type and the nonvolatile memory field-effect transistor of the p-channel type whose gate terminals are short-circuited with each other have threshold values which are set so that the field-effect transistor of one type is in an ON state when the field-effect transistor of the other type is in an OFF state when a non-memory operation or nonvolatile memory writing is performed.

11. The semiconductor integrated circuit according to claim 2 or 3, wherein the positive or negative logical state detection enhancement circuit is supplied with one or more high and low power source potentials, and, of the high-low power source potentials, at least one high power source potential is higher than a high power source potential of the nonvolatile memory circuit, and at least one low power source potential is lower than a low power source potential of the nonvolatile memory circuit.

12. The semiconductor integrated circuit according to claim 4, wherein
when nonvolatile memory writing into the nonvolatile memory circuit is not performed, an electric potential difference between a gate terminal and a source terminal of a nonvolatile memory field-effect transistor included in the nonvolatile memory circuit is large in variable range enough to identify an ON state and an OFF state of the field-effect transistor, but an electric potential difference between the gate terminal and a substrate terminal is not large in variable range enough to nonvolatilely write the ON state or the OFF state in the field-effect transistor, and
when nonvolatile memory writing into the nonvolatile memory circuit is performed, the electric potential difference between the gate terminal and the source terminal is large in variable range enough to identify the ON state and the OFF state of the field-effect transistor, and the electric potential difference between the gate terminal and the substrate terminal is large in variable range enough to nonvolatilely write the ON state or the OFF state in the field-effect transistor.

13. The semiconductor integrated circuit according to claim 2 or 3, wherein, in the case in which the nonvolatile memory circuit is a main stage circuit and a circuit which generates an electric potential to be input to the positive logical state detection enhancement circuit is a preceding stage circuit, either or both of the main stage circuit and the preceding stage circuit are NOT logic circuits.

14. The semiconductor integrated circuit according to claim 2 or 3, wherein, in the case in which the nonvolatile memory circuit is a main stage circuit and a circuit which generates an electric potential to be input to the logical state detection enhancement circuit is a preceding stage circuit, when nonvolatile memory writing into the nonvolatile memory circuit is performed, a high power source potential of the preceding stage circuit becomes higher, and a low power source potential of the preceding stage circuit becomes lower.

15. The semiconductor integrated circuit according to claim 2, wherein, in the case in which the nonvolatile memory circuit is a main stage circuit and a circuit which generates an electric potential to be input to the positive logical state detection enhancement circuit is a preceding stage circuit, the positive logical state detection enhancement circuit has a function of always detecting an output potential of the preceding stage circuit and supplying an electric potential of the same logical state as an output potential of the preceding stage circuit to the input terminal of the main stage circuit whether the control signal is a high electric potential or a low power potential, and further raising a high power source potential of the state detection enhancement circuit and further lowering a low power source potential of the state detection enhancement circuit when nonvolatile memory writing into the nonvolatile memory circuit is performed.

16. The semiconductor integrated circuit according to claim 3, wherein, in the case in which the nonvolatile memory circuit is a main stage circuit and a circuit which generates an electric potential to be input to the negative logical state detection enhancement circuit is a preceding stage circuit, the negative logical state detection enhancement circuit has a function of always detecting an output potential of the preceding stage circuit and supplying an electric potential of an inverse logical state of an output potential of the preceding stage circuit to the input terminal of the main stage circuit whether the control signal is a high electric potential or a low power potential, and further raising a high power source potential of the state detection enhancement circuit and further lowering a low power source potential of the state detection enhancement circuit when nonvolatile memory writing into the nonvolatile memory circuit is performed.

17. The semiconductor integrated circuit according to claim 2 or 3, wherein all or some of the preceding stage circuit and the positive or negative logical state detection enhancement circuit are constituted by nonvolatile memory field-effect transistors which have a memory holding function in a gate insulating structure.

18. The semiconductor integrated circuit according to claim 2 or 3, wherein a sequence circuit which has a temporal memory function of holding an electric potential of each output terminal without an external input potential while a power source potential is being supplied is formed by connecting input terminals and output terminals of an even number of two or more NOT logic circuits, respectively, in the form of a ring, and at least one of the NOT logic circuits is used as the nonvolatile memory circuit, so that both a temporal memory function and a nonvolatile memory function are provided.

19. The semiconductor integrated circuit according to claim 3, wherein a memory array is configured by regularly arranging a plurality of memory cells, lengthwise and crosswise, each of which includes a sequence circuit in which two NOT logic circuits including n-channel and p-channel nonvolatile memory field-effect transistors which constitute the nonvolatile memory circuit and have a memory holding function in a gate insulating structure are connected to each other in such a way that input terminals thereof are connected with output terminals thereof, respectively, into the form of a ring, two access transistors which turn on or off supply of complementary data to the sequence circuit, and a nonvolatile selection transistor which disconnects a ring-shaped connection of the sequence circuit immediately after a drain terminal when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

20. The semiconductor integrated circuit according to claim 3, wherein a memory array is configured by regularly arranging a plurality of memory cells, lengthwise and crosswise, each of which includes a sequence circuit in which a NOT logic circuit including n-channel and p-channel nonvolatile memory field-effect transistors which constitute the nonvolatile memory circuit and have a memory holding function in a gate insulating structure and a NOT logic circuit including n-channel and p-channel field-effect transistors which have or do not have a memory holding function in a gate insulating structure are connected to each other in such a way that input terminals thereof are connected with output terminal thereof, respectively, into the form of a ring, two access transistors which turn on or off supply of complementary data to the sequence circuit, and a nonvolatile selection transistor which disconnects a ring-shaped connection of the sequence circuit immediately after a drain terminal of the nonvolatile memory circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

21. The semiconductor integrated circuit according to claim 3, wherein a memory array is configured by regularly arranging a plurality of memory cells, lengthwise and crosswise, each of which includes a sequence circuit in which two nonvolatile memory field-effect transistors either of an n-channel type or a p-channel type which constitute the nonvolatile memory circuit and have a memory holding function in a gate insulating structure are connected to each other in such a way that a gate terminal of one of the field-effect transistors is connected to a drain terminal of the other, and source terminals of the two field-effect transistors are connected to each other, two access transistors which turn on or off supply of complementary data to the sequence circuit, and a nonvolatile selection transistor which blocks a power source potential from being supplied to a source terminal of the sequence circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporarily stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

22. The semiconductor integrated circuit according to claim 3, wherein a memory array is configured by regularly arranging a plurality of memory cells, lengthwise and crosswise, each of which includes one NOT logic circuit having n-channel and p-channel nonvolatile memory field-effect transistors which constitute the nonvolatile memory circuit and have a memory holding function in a gate insulating structure and one access transistor which turns on or off supply of data to an input terminal of the NOT logic circuit, word lines or /word lines to which gate terminals of access transistors on the same row of the memory array are connected are arranged in the same number as the number of rows, pairs of a data line to which source terminals of access transistors on the same column of a direction perpendicular to the word line or the /word line are connected and a /data line to which an output terminal of the NOT logic circuit is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

23. The semiconductor integrated circuit according to claim 3, wherein a memory array is configured by regularly arranging a plurality of memory cells, lengthwise and crosswise, each of which includes one nonvolatile memory field-effect transistor either of an n-channel type or a p-channel type which constitute the nonvolatile memory circuit and have a memory holding function in a gate insulating structure and one access transistor which turns on or off supply of data to a drain terminal of the field-effect transistor, word lines or /word lines to which gate terminals of access transistors on the same row of the memory array are connected are arranged in the same number as the number of rows, pairs of a /data line to which source terminals of access transistors on the same column of a direction perpendicular to the word line or the /word line are connected and a data line to which a gate terminal of the field-effect transistor is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

24. The semiconductor integrated circuit according to claim 2 or 3, wherein at least one or both of complementary output terminals of a sequence circuit of an edge trigger type with a clock which has a temporal memory function is input to at least one of two positive or negative logical state detection enhancement circuits, and an input terminal of the nonvolatile memory circuit is connected to an output terminal of the state detection enhancement circuit, so that a positive logic state or a negative logical state of a complementary output potential of the sequence circuit of the edge trigger type with the clock can be temporarily or nonvolatilely stored.

25. The semiconductor integrated circuit according to claim 19, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device,
    wherein the whole or a part of a circuit of the cache memory is constituted by the memory array.

26. The semiconductor integrated circuit according to claim 5, wherein the nonvolatile memory circuit comprises one or more input terminals, one or more output terminals and the nonvolatile memory field-effect transistors of either or both of an n-channel type and a p-channel type, has a gate terminal of at least one of the nonvolatile memory field-effect transistors as one of the input terminals and a drain terminal of at least one of the nonvolatile memory field-effect transistors as one of the output terminals, and connects a source terminal of at least one of the nonvolatile memory field-effect transistors to a power source potential terminal.

27. The semiconductor integrated circuit according to claim 5, wherein the nonvolatile memory circuit comprises one or more input terminals, one or more output terminals and the nonvolatile memory field-effect transistors of an n-channel type and a p-channel type, and has a short-circuited connection between a gate terminal of at least one of the nonvolatile memory field-effect transistors of the n-channel type and a gate terminal of at least one of the nonvolatile memory field-effect transistors of the p-channel type as one of the input terminals and a short-circuited connection between a drain terminal of at least one of the nonvolatile memory field-effect transistors of the n-channel type and a drain terminal of at least one of the nonvolatile memory field-effect transistors of the p-channel type as one of the output terminals, a source terminal of at least one of the nonvolatile memory field-effect transistors of the n-channel type is connected to a low potential power source terminal, and a source terminal of at least one of the nonvolatile memory field-effect transistors of the p-channel type is connected to a high potential power source terminal.

28. The semiconductor integrated circuit according to claim 27, wherein the nonvolatile memory field-effect transistor of the n-channel type and the nonvolatile memory field-effect transistor of the p-channel type whose gate terminals are short-circuited with each other have threshold values which are set so that the field-effect transistor of one type is in an ON state when the field-effect transistor of the other type is in an OFF state when a non-memory operation or nonvolatile memory writing is performed.

29. The semiconductor integrated circuit according to claim 4, wherein the positive or negative logical state detection enhancement circuit is supplied with one or more high and low power source potentials, and, of the high-low power source potentials, at least one high power source potential is higher than a high power source potential of the nonvolatile memory circuit, and at least one low power source potential is lower than a low power source potential of the nonvolatile memory circuit.

30. The semiconductor integrated circuit according to claim 5, wherein the positive or negative logical state detection enhancement circuit is supplied with one or more high and low power source potentials, and, of the high-low power source potentials, at least one high power source potential is higher than a high power source potential of the nonvolatile memory circuit, and at least one low power source potential is lower than a low power source potential of the nonvolatile memory circuit.

31. The semiconductor integrated circuit according to claim 5, wherein
    when nonvolatile memory writing into the nonvolatile memory circuit is not performed, an electric potential difference between a gate terminal and a source terminal of a nonvolatile memory field-effect transistor included in the nonvolatile memory circuit is large in variable range enough to identify an ON state and an OFF state of the field-effect transistor, but an electric potential difference between the gate terminal and a substrate terminal is not large in variable range enough to nonvolatilely write the ON state or the OFF state in the field-effect transistor, and
    when nonvolatile memory writing into the nonvolatile memory circuit is performed, the electric potential difference between the gate terminal and the source terminal is large in variable range enough to identify the ON state and the OFF state of the field-effect transistor, and the electric potential difference between the gate terminal and the substrate terminal is large in variable range enough to nonvolatilely write the ON state or the OFF state in the field-effect transistor.

32. The semiconductor integrated circuit according to claim 4, wherein all or some of the preceding stage circuit and the positive or negative logical state detection enhancement circuit are constituted by nonvolatile memory field-effect transistors which have a memory holding function in a gate insulating structure.

33. The semiconductor integrated circuit according to claim 4, wherein a sequence circuit which has a temporal memory function of holding an electric potential of each output terminal without an external input potential while a power source potential is being supplied is formed by connecting input terminals and output terminals of an even number of two or more NOT logic circuits, respectively, in the form of a ring, and at least one of the NOT logic circuits is used as the nonvolatile memory circuit, so that both a temporal memory function and a nonvolatile memory function are provided.

34. The semiconductor integrated circuit according to claim 4, wherein a memory array is configured by regularly arranging a plurality of memory cells, lengthwise and crosswise, each of which includes a sequence circuit in which two NOT logic circuits including n-channel and p-channel nonvolatile memory field-effect transistors which constitute the nonvolatile memory circuit and have a memory holding function in a gate insulating structure are connected to each other in such a way that input terminals thereof are connected with output terminals thereof, respectively, into the form of a ring, two access transistors which turn on or off supply of complementary data to the sequence circuit, and a nonvolatile selection transistor which disconnects a ring-shaped connection of the sequence circuit immediately after a drain terminal when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

35. The semiconductor integrated circuit according to claim 5, wherein a memory array is configured by regularly arranging a plurality of memory cells, lengthwise and crosswise, each of which includes a sequence circuit in which two NOT logic circuits including n-channel and p-channel nonvolatile memory field-effect transistors which constitute the nonvolatile memory circuit and have a memory holding function in a gate insulating structure are connected to each other in such a way that input terminals thereof are connected with output terminals thereof, respectively, into the form of a ring, two access transistors which turn on or off supply of complementary data to the sequence circuit, and a nonvolatile selection transistor which disconnects a ring-shaped connection of the sequence circuit immediately after a drain terminal when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

36. The semiconductor integrated circuit according to claim 4, wherein a memory array is configured by regularly arranging a plurality of memory cells, lengthwise and crosswise, each of which includes a sequence circuit in which a NOT logic circuit including n-channel and p-channel nonvolatile memory field-effect transistors which constitute the nonvolatile memory circuit and have a memory holding function in a gate insulating structure and a NOT logic circuit including n-channel and p-channel field-effect transistors which have or do not have a memory holding function in a gate insulating structure are connected to each other in such a way that input terminals thereof are connected with output terminal thereof, respectively, into the form of a ring, two access transistors which turn on or off supply of complementary data to the sequence circuit, and a nonvolatile selection transistor which disconnects a ring-shaped connection of the sequence circuit immediately after a drain terminal of the nonvolatile memory circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

37. The semiconductor integrated circuit according to claim 5, wherein a memory array is configured by regularly arranging a plurality of memory cells, lengthwise and crosswise, each of which includes a sequence circuit in which a NOT logic circuit including n-channel and p-channel nonvolatile memory field-effect transistors which constitute the nonvolatile memory circuit and have a memory holding function in a gate insulating structure and a NOT logic circuit including n-channel and p-channel field-effect transistors which have or do not have a memory holding function in a gate insulating structure are connected to each other in such a way that input terminals thereof are connected with output terminal thereof, respectively, into the form of a ring, two access transistors which turn on or off supply of complementary data to the sequence circuit, and a nonvolatile selection transistor which disconnects a ring-shaped connection of the sequence circuit immediately after a drain terminal of the nonvolatile memory circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporally stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

38. The semiconductor integrated circuit according to claim 4, wherein a memory array is configured by regularly arranging a plurality of memory cells, lengthwise and crosswise, each of which includes a sequence circuit in which two nonvolatile memory field-effect transistors either of an n-channel type or a p-channel type which constitute the nonvolatile memory circuit and have a memory holding function in a gate insulating structure are connected to each other in such a way that a gate terminal of one of the field-effect transistors is connected to a drain terminal of the other, and source terminals of the two field-effect transistors are connected to each other, two access transistors which turn on or off supply of complementary data to the sequence circuit, and a nonvolatile selection transistor which blocks a power source potential from being supplied to a source terminal of the sequence circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporarily stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

39. The semiconductor integrated circuit according to claim 5, wherein a memory array is configured by regularly arranging a plurality of memory cells, lengthwise and crosswise, each of which includes a sequence circuit in which two nonvolatile memory field-effect transistors either of an n-channel type or a p-channel type which constitute the nonvolatile memory circuit and have a memory holding function in a gate insulating structure are connected to each other in such a way that a gate terminal of one of the field-effect transistors is connected to a drain terminal of the other, and source terminals of the two field-effect transistors are connected to each other, two access transistors which turn on or off supply of complementary data to the sequence circuit, and a nonvolatile selection transistor which blocks a power source potential from being supplied to a source terminal of the sequence circuit when nonvolatile memory writing is performed, word lines or /word lines to which gate terminals of access transistors on the same row of the memory array are connected are arranged in the same number as the number of rows, nonvolatile selection lines to which gate terminals of nonvolatile selection transistors on the same row of the memory array are connected are arranged in the same number as the number of rows in the same direction as the word lines or the /word lines, pairs of data lines and /data lines to which two source terminals of access transistors on the same column of a direction perpendicular to the word line or the /word line and the nonvolatile selection line are connected, respectively, are arranged in the same number as the number of columns, data generated by an external circuit of the memory array is complementarily input to the data line and the /data line, and the data line and the /data line are connected to one or more negative logical state detection enhancement circuits, so that, when all of the nonvolatile selection transistors are turned on, data can be temporarily stored in the one memory cell discretionarily selected by the word line or the /word line and the data line pair, and when the nonvolatile selection transistors of one row are turned off and the word line or the /word line of the one row is selected, data can be nonvolatilely stored in one memory cell on the one row discretionarily selected by the perpendicular data line pair.

40. The semiconductor integrated circuit according to claim 4, wherein a memory array is configured by regularly arranging a plurality of memory cells, lengthwise and crosswise, each of which includes one NOT logic circuit having n-channel and p-channel nonvolatile memory field-effect transistors which constitute the nonvolatile memory circuit and have a memory holding function in a gate insulating structure and one access transistor which turns on or off supply of data to an input terminal of the NOT logic circuit, word lines or /word lines to which gate terminals of access transistors on the same row of the memory array are connected are arranged in the same number as the number of rows, pairs of a data line to which source terminals of access transistors on the same column of a direction perpendicular to the word line or the /word line are connected and a /data line to which an output terminal of the NOT logic circuit is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

41. The semiconductor integrated circuit according to claim 5, wherein a memory array is configured by regularly arranging a plurality of memory cells, lengthwise and crosswise, each of which includes one NOT logic circuit having n-channel and p-channel nonvolatile memory field-effect transistors which constitute the nonvolatile memory circuit and have a memory holding function in a gate insulating structure and one access transistor which turns on or off supply of data to an input terminal of the NOT logic circuit, word lines or /word lines to which gate terminals of access transistors on the same row of the memory array are connected are arranged in the same number as the number of rows, pairs of a data line to which source terminals of access transistors on the same column of a direction perpendicular to the word line or the /word line are connected and a /data line to which an output terminal of the NOT logic circuit is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

42. The semiconductor integrated circuit according to claim 4 wherein a memory array is configured by regularly arranging a plurality of memory cells, lengthwise and crosswise, each of which includes one nonvolatile memory field-effect transistor either of an n-channel type or a p-channel type which constitute the nonvolatile memory circuit and have a memory holding function in a gate insulating structure and one access transistor which turns on or off supply of data to a drain terminal of the field-effect transistor, word lines or /word lines to which gate terminals of access transistors on the same row of the memory array are connected are arranged in the same number as the number of rows, pairs of a /data line to which source terminals of access transistors on the same column of a direction perpendicular to the word line or the /word line are connected and a data line to which a gate terminal of the field-effect transistor is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

43. The semiconductor integrated circuit according to claim 5, wherein a memory array is configured by regularly arranging a plurality of memory cells, lengthwise and crosswise, each of which includes one nonvolatile memory field-effect transistor either of an n-channel type or a p-channel type which constitute the nonvolatile memory circuit and have a memory holding function in a gate insulating structure and one access transistor which turns on or off supply of data to a drain terminal of the field-effect transistor, word lines or /word lines to which gate terminals of access transistors on the same row of the memory array are connected are arranged in the same number as the number of rows, pairs of a /data line to which source terminals of access transistors on the same column of a direction perpendicular to the word line or the /word line are connected and a data line to which a gate terminal of the field-effect transistor is connected are arranged in the same number as the number of columns, data generated by an external circuit of the memory array is complementarily input to the data line and the /data line, and the data line and the /data line are connected to one or more negative logical state detection enhancement circuits, so that data can be nonvolatilely stored in one memory cell discretionarily selected by the word line or the /word line and the data line pair.

44. The semiconductor integrated circuit according to claim 4, wherein at least one or both of complementary output terminals of a sequence circuit of an edge trigger type with a clock which has a temporal memory function is input to at least one of two positive or negative logical state detection enhancement circuits, and an input terminal of the nonvolatile memory circuit is connected to an output terminal of the state detection enhancement circuit, so that a positive logic state or a negative logical state of a complementary output potential of the sequence circuit of the edge trigger type with the clock can be temporarily or nonvolatilely stored.

45. The semiconductor integrated circuit according to claim 5, wherein at least one or both of complementary output terminals of a sequence circuit of an edge trigger type with a clock which has a temporal memory function is input to at least one of two positive or negative logical state detection enhancement circuits, and an input terminal of the nonvolatile memory circuit is connected to an output terminal of the state detection enhancement circuit, so that a positive logic state or a negative logical state of a complementary output potential of the sequence circuit of the edge trigger type with the clock can be temporarily or nonvolatilely stored.

46. The semiconductor integrated circuit according to claim 34, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device,
    wherein the whole or a part of a circuit of the cache memory is constituted by the memory array.

47. The semiconductor integrated circuit according to claim 35, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device,
    wherein the whole or a part of a circuit of the cache memory is constituted by the memory array.

48. The semiconductor integrated circuit according to claim 36, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device,
    wherein the whole or a part of a circuit of the cache memory is constituted by the memory array.

49. The semiconductor integrated circuit according to claim 37, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device,
    wherein the whole or a part of a circuit of the cache memory is constituted by the memory array.

50. The semiconductor integrated circuit according to claim 38, further comprising at least one or both of:
    an operation circuit having a register circuit which stores an initial value necessary for a computation and a computation result; and
    a cache memory which stores data extracted from an external memory device or data to be evacuated to the external memory device and is accessible at a higher speed than the external memory device, wherein the whole or a part of a circuit of the cache memory is constituted by the memory array.

51. The semiconductor integrated circuit according to claim 39, further comprising at least one or both of:

an operation circuit having a register circuit which stores an initial value necessary for a computation and a computation result; and a cache memory which stores data extracted from an external memory device or data to be evacuated to the external memory device and is accessible at a higher speed than the external memory device, wherein the whole or a part of a circuit of the cache memory is constituted by the memory array.

52. The semiconductor integrated circuit according to claim 40, further comprising at least one or both of:

an operation circuit having a register circuit which stores an initial value necessary for a computation and a computation result; and a cache memory which stores data extracted from an external memory device or data to be evacuated to the external memory device and is accessible at a higher speed than the external memory device, wherein the whole or a part of a circuit of the cache memory is constituted by the memory array.

53. The semiconductor integrated circuit according to claim 41, further comprising at least one or both of:

an operation circuit having a register circuit which stores an initial value necessary for a computation and a computation result; and a cache memory which stores data extracted from an external memory device or data to be evacuated to the external memory device and is accessible at a higher speed than the external memory device, wherein the whole or a part of a circuit of the cache memory is constituted by the memory array.

54. The semiconductor integrated circuit according to claim 42, further comprising at least one or both of:

an operation circuit having a register circuit which stores an initial value necessary for a computation and a computation result; and a cache memory which stores data extracted from an external memory device or data to be evacuated to the external memory device and is accessible at a higher speed than the external memory device, wherein the whole or a part of a circuit of the cache memory is constituted by the memory array.

55. The semiconductor integrated circuit according to claim 43, further comprising at least one or both of:

an operation circuit having a register circuit which stores an initial value necessary for a computation and a computation result; and a cache memory which stores data extracted from an external memory device or data to be evacuated to the external memory device and is accessible at a higher speed than the external memory device, wherein the whole or a part of a circuit of the cache memory is constituted by the memory array.

* * * * *